(12) United States Patent
Aggarwal et al.

(10) Patent No.: US 10,971,545 B2
(45) Date of Patent: Apr. 6, 2021

(54) MAGNETORESISTIVE STACKS AND METHODS THEREFOR

(71) Applicant: Everspin Technologies, Inc., Chandler, AZ (US)

(72) Inventors: Sanjeev Aggarwal, Scottsdale, AZ (US); Kevin Conley, San Jose, CA (US); Sarin A. Deshpande, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/245,783

(22) Filed: Jan. 11, 2019

(65) Prior Publication Data

US 2019/0221609 A1 Jul. 18, 2019

Related U.S. Application Data

(60) Provisional application No. 62/616,600, filed on Jan. 12, 2018, provisional application No. 62/616,580, (Continued)

(51) Int. Cl.
*H01L 27/22* (2006.01)
*G11C 5/06* (2006.01)
(Continued)

(52) U.S. Cl.
CPC .............. *H01L 27/228* (2013.01); *G11C 5/06* (2013.01); *G11C 5/08* (2013.01); *G11C 11/161* (2013.01);
(Continued)

(58) Field of Classification Search
CPC ... H01L 27/222; H01L 27/226; H01L 27/228; H01L 21/76802; H01L 21/76877; H01L 23/5226; H01L 23/528; H01L 43/02; H01L 43/12; G11C 11/161; G11C 11/16; G11C 11/1675; G11C 11/1673; G11C 11/1659; G11C 11/5607; G11C 2211/561; G11C 2211/5615; G11C 2211/562;
(Continued)

(56) References Cited

U.S. PATENT DOCUMENTS 6,795,334 B2 * 9/2004 Iwata ................... G11C 11/1659
365/158
7,539,047 B2 5/2009 Katti
(Continued)

FOREIGN PATENT DOCUMENTS

WO 03098636 A2 11/2003

OTHER PUBLICATIONS

International Search Report for corresponding Application No. PCT/US2019/0013196, dated Apr. 30, 2019 (6 pages).

*Primary Examiner* — Jose R Diaz
(74) *Attorney, Agent, or Firm* — Bookoff McAndrews, PLLC

(57) ABSTRACT

A magnetoresistive device may include multiple magnetic tunnel junction (MTJ) stacks separated from each other by one or more dielectric material layers and electrically conductive vias extending through the one more dielectric material layers. Each MTJ stack may include multiple MTJ bits arranged one on top of another and the electrically conductive vias may be configured to electrically access each MTJ bit of the multiple MTJ stacks.

20 Claims, 38 Drawing Sheets

Related U.S. Application Data filed on Jan. 12, 2018, provisional application No. 62/691,318, filed on Jun. 28, 2018.

(51) Int. Cl.

| | | |
|---|---|---|
| *G11C 5/08* | (2006.01) | |
| *G11C 11/16* | (2006.01) | |
| *H01F 10/32* | (2006.01) | |
| *H01F 41/34* | (2006.01) | |
| *H01L 21/768* | (2006.01) | |
| *H01L 23/522* | (2006.01) | |
| *H01L 23/528* | (2006.01) | |
| *H01L 43/02* | (2006.01) | |
| *H01L 43/12* | (2006.01) | |

(52) U.S. Cl.
CPC ....... *H01F 10/329* (2013.01); *H01F 10/3254* (2013.01); *H01F 10/3272* (2013.01); *H01F 10/3286* (2013.01); *H01F 41/34* (2013.01); *H01L 21/76802* (2013.01); *H01L 21/76877* (2013.01); *H01L 23/528* (2013.01); *H01L 23/5226* (2013.01); *H01L 27/222* (2013.01); *H01L 43/02* (2013.01); *H01L 43/12* (2013.01); *G11C 2211/5615* (2013.01)

(58) Field of Classification Search
CPC ......... G11C 2211/5622; H01F 10/3254; H01F 10/3272; H01F 10/3286; H01F 10/329; H01F 41/34

See application file for complete search history.

(56) References Cited

U.S. PATENT DOCUMENTS

| | | | |
|---|---|---|---|
| 8,686,484 | B2 | 4/2014 | Whig et al. |
| 8,747,680 | B1 | 6/2014 | Deshpande et al. |
| 9,023,216 | B2 | 5/2015 | Kochergin et al. |
| 9,123,878 | B2 * | 9/2015 | Iwata ................ G11C 19/0841 |
| 9,136,464 | B1 | 9/2015 | Whig et al. |
| 9,419,208 | B2 | 8/2016 | Whig et al. |
| 9,514,807 | B2 * | 12/2016 | Kang .................. H01L 27/2409 |
| 2016/0133669 | A1 | 5/2016 | Toh et al. |
| 2017/0069685 | A1 | 3/2017 | Lin |

* cited by examiner

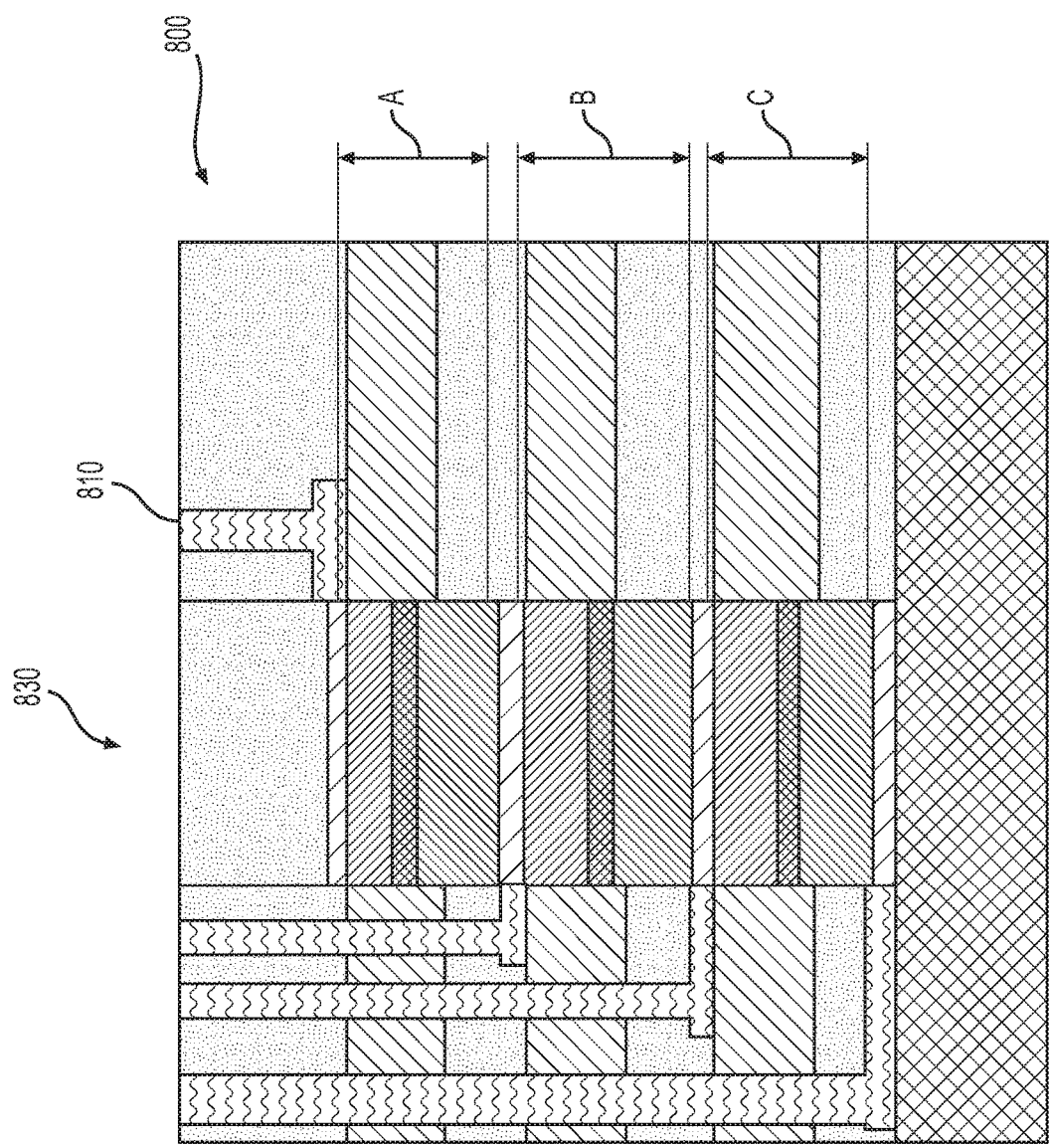

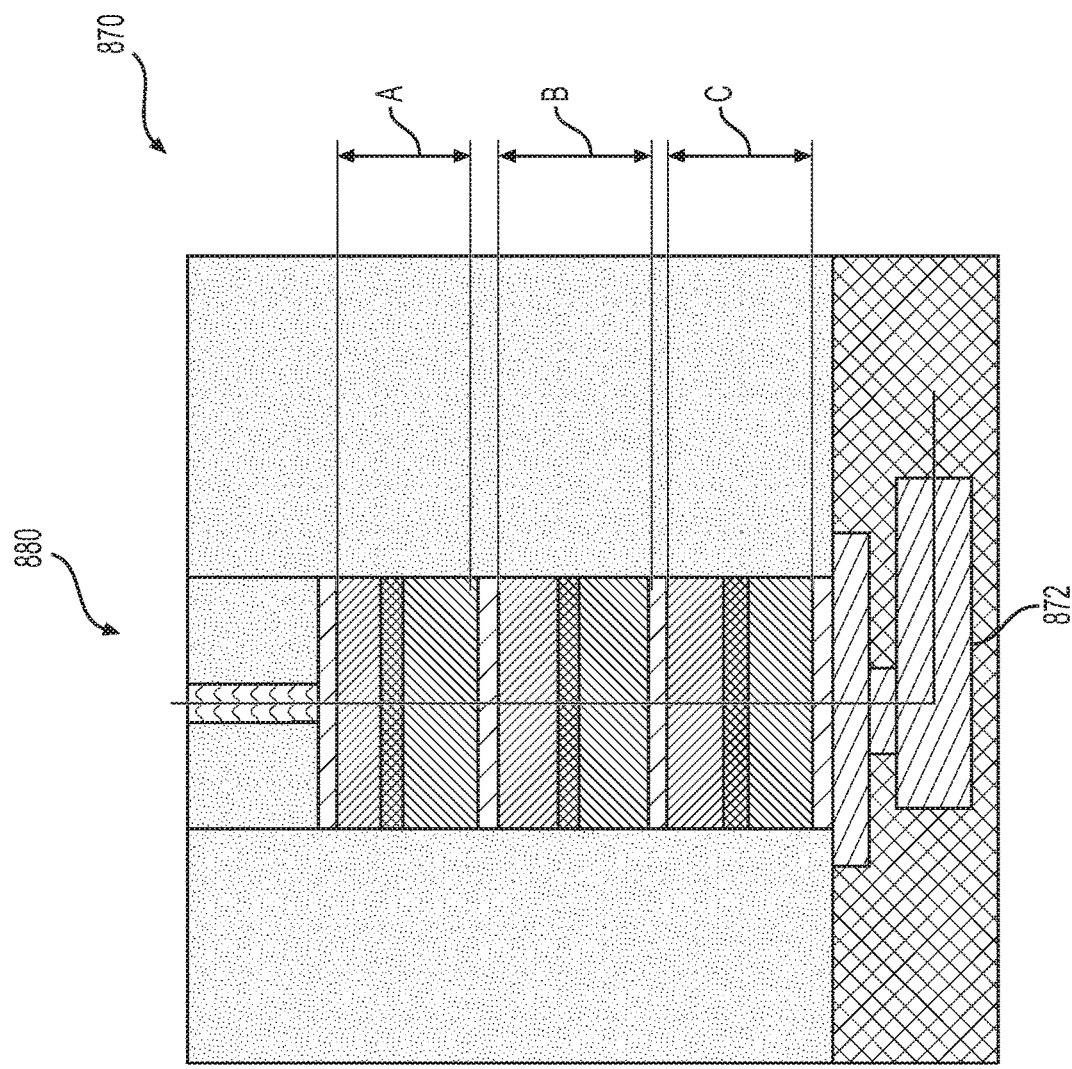

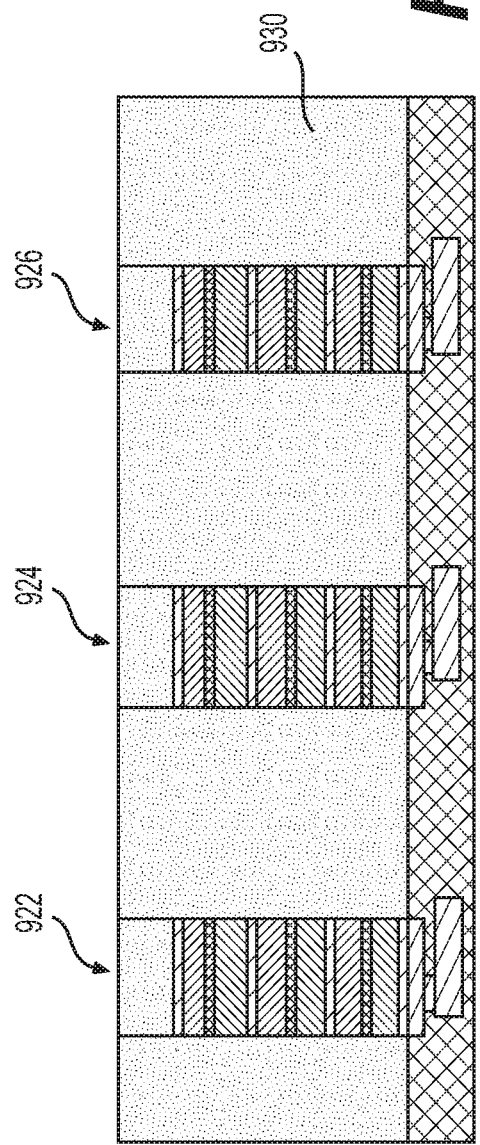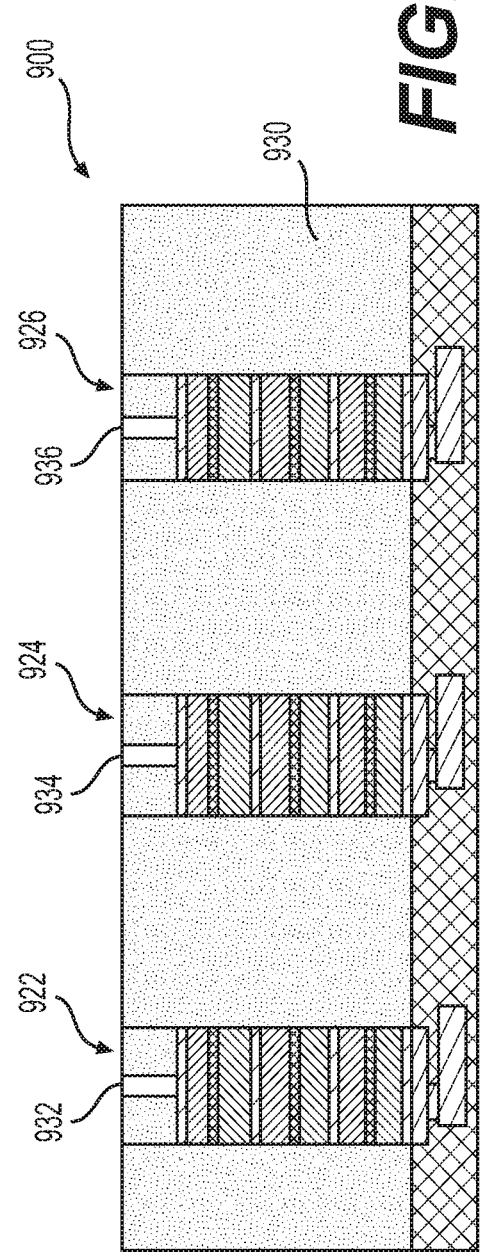

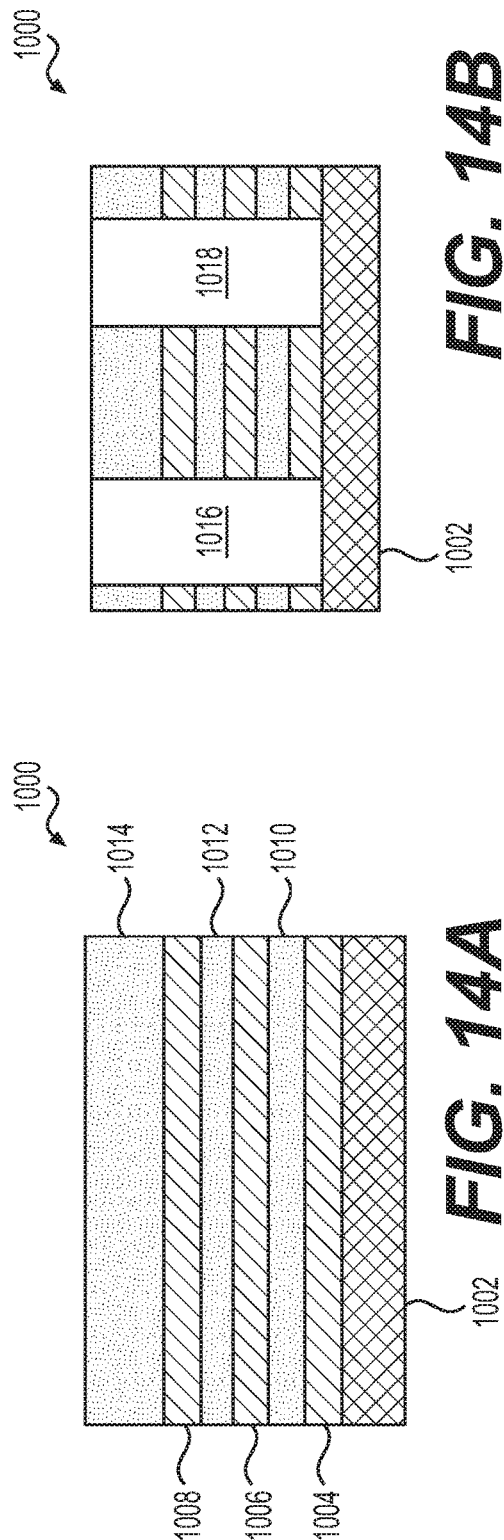
FIG. 14A
FIG. 14B
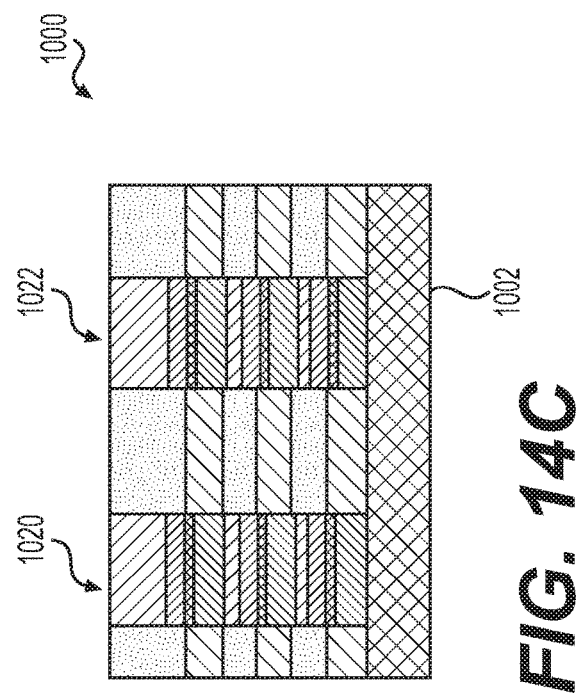
FIG. 14C

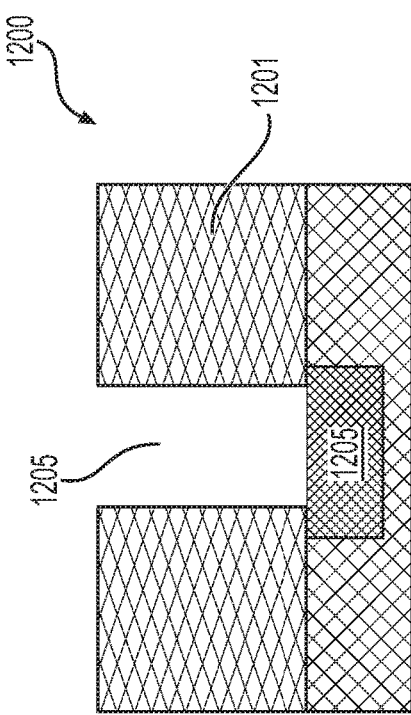
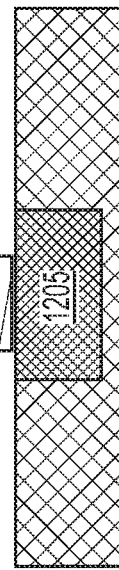
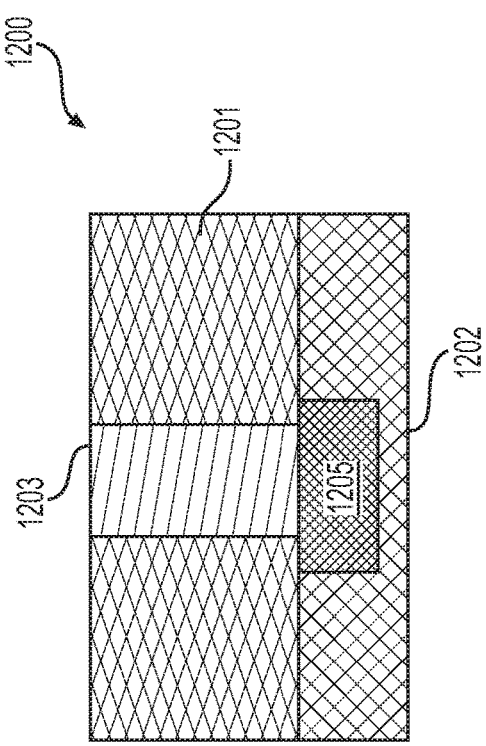

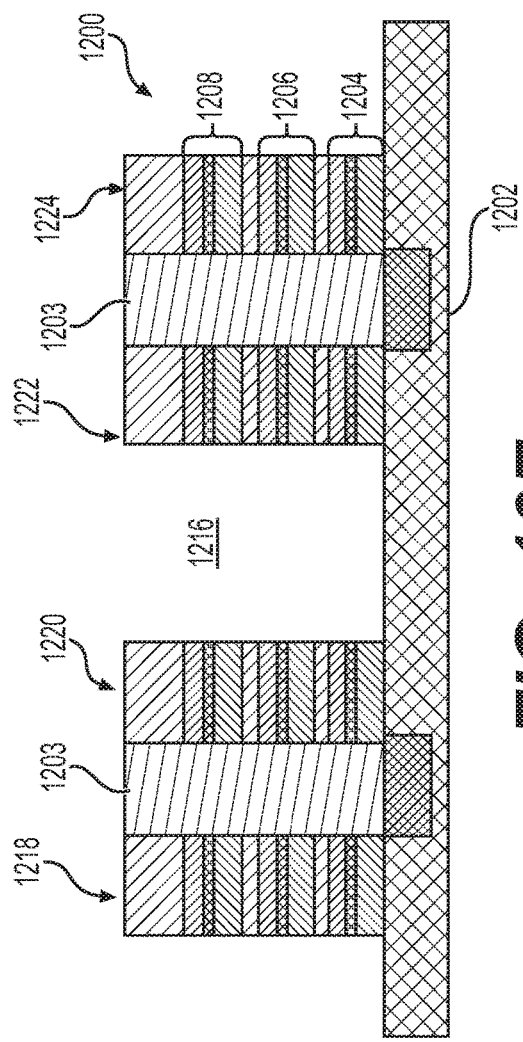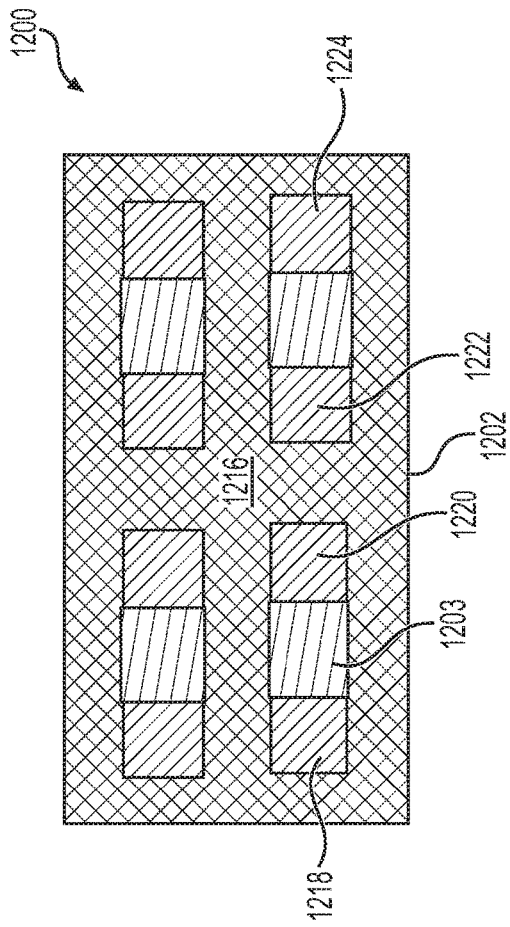

MAGNETORESISTIVE STACKS AND METHODS THEREFOR

CROSS-REFERENCE TO RELATED APPLICATIONS

This application claims the benefit of priority from U.S. Provisional Application No. 62/616,600, filed on Jan. 12, 2018; U.S. Provisional Application No. 62/616,580, filed on Jan. 12, 2018; and U.S. Provisional Application No. 62/691,318, filed on Jun. 28, 2018, each of which is incorporated by reference herein in its entirety.

TECHNICAL FIELD

The present disclosure relates to, among other things, magnetoresistive stacks, devices including the disclosed magnetoresistive stacks, and methods for fabricating and using the disclosed magnetoresistive stacks.

INTRODUCTION

There are many inventions described and illustrated herein, as well as many aspects and embodiments of those inventions. In one aspect, the present disclosure relates to magnetoresistive structures (for example, part of a magnetoresistive memory device, magnetoresistive sensor/transducer device, etc.) and methods of manufacturing the described magnetoresistive structures. For example, the disclosed structures may be related to spin-transfer torque (STT) or spin-orbit torque (SOT) magnetoresistive random access memory (MRAM) devices, magnetoresistive sensor/transducer devices, etc. To describe aspects of the disclosed devices and methods, an exemplary magnetoresistive stack configuration is described. However, this is only exemplary, and the disclosed devices can have many other stack configurations, and the disclosed methods can be applied to manufacture magnetoresistive devices having various suitable magnetoresistive stacks.

Briefly, a magnetoresistive memory stack used in a memory device (e.g., a magnetoresistive random access memory (MRAM)) includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information may be stored in the magnetoresistive memory stack by switching, programming, and/or controlling the direction of magnetization vectors in the magnetic layer(s) of the "free" magnetic region of the stack. The direction of the magnetization vectors of the "free" magnetic region may be switched and/or programmed (for example, through STT or SOT) by application of a write signal (e.g., one or more current pulses) through or adjacent to the magnetoresistive stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state different from the first magnetic state. The magnetic state of the magnetoresistive memory stack is determined or read based on the resistance of the stack in response to a read current. The magnetoresistive memory stacks, combinations of such stacks, methods of making such stacks, and devices including such stacks disclosed herein may have some or all of these desired characteristics.

BRIEF DESCRIPTION OF THE DRAWINGS

Embodiments of the present disclosure may be implemented in connection with aspects illustrated in the attached drawings. These drawings show different aspects of the present inventions and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well defined boundaries with straight edges. However, a person skilled in the art would recognize that, in reality, the different layers may have a non-uniform thickness. And, at the interface between adjacent layers, the materials of these layers may alloy together, or migrate into one or the other material, making their boundaries ill-defined and/or diffuse. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations. Rather, it is intended to reflect or indicate the embodiment(s) is/are "example" embodiment(s). Further, even though the figures and this written disclosure appear to describe the disclosed magnetoresistive stacks in a particular order of construction (e.g., from bottom to top), it is understood that the depicted magnetoresistive stacks may have a different order (e.g., the opposite order (i.e., from top to bottom)). For example, a fixed region may be formed on or above a free region, which in turn may be formed on or above an insertion layer of the present disclosure.

Figure 1:
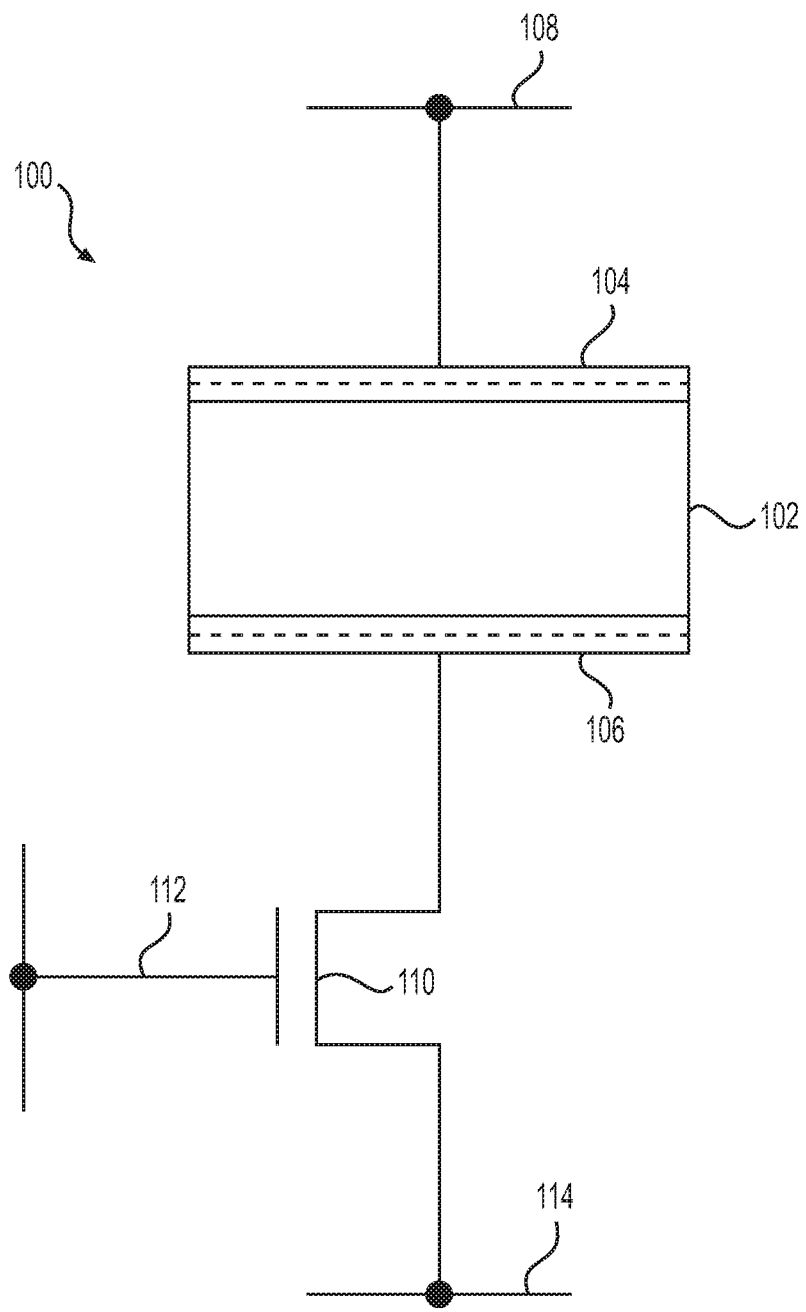
Figure 3:
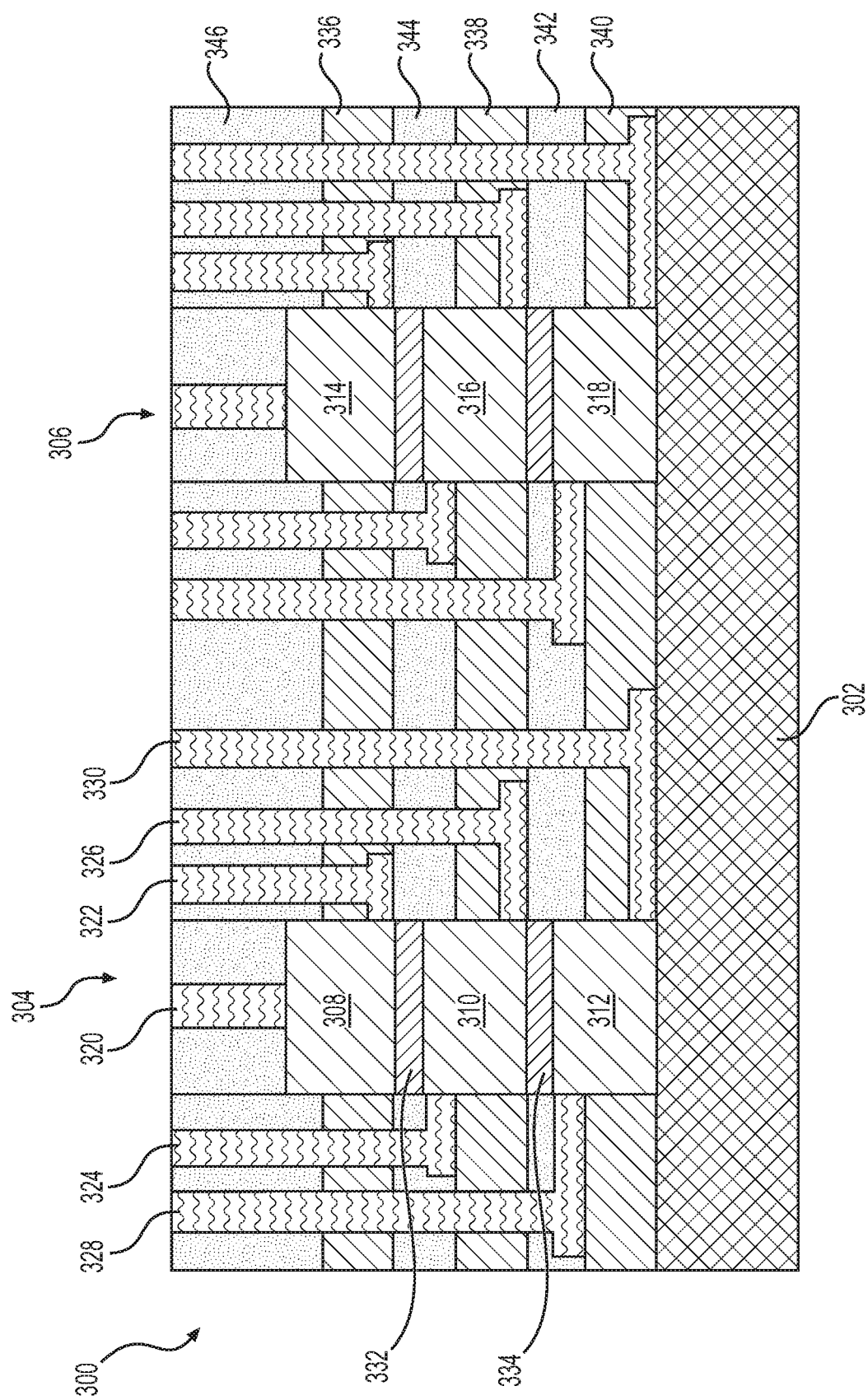
Figure 4:
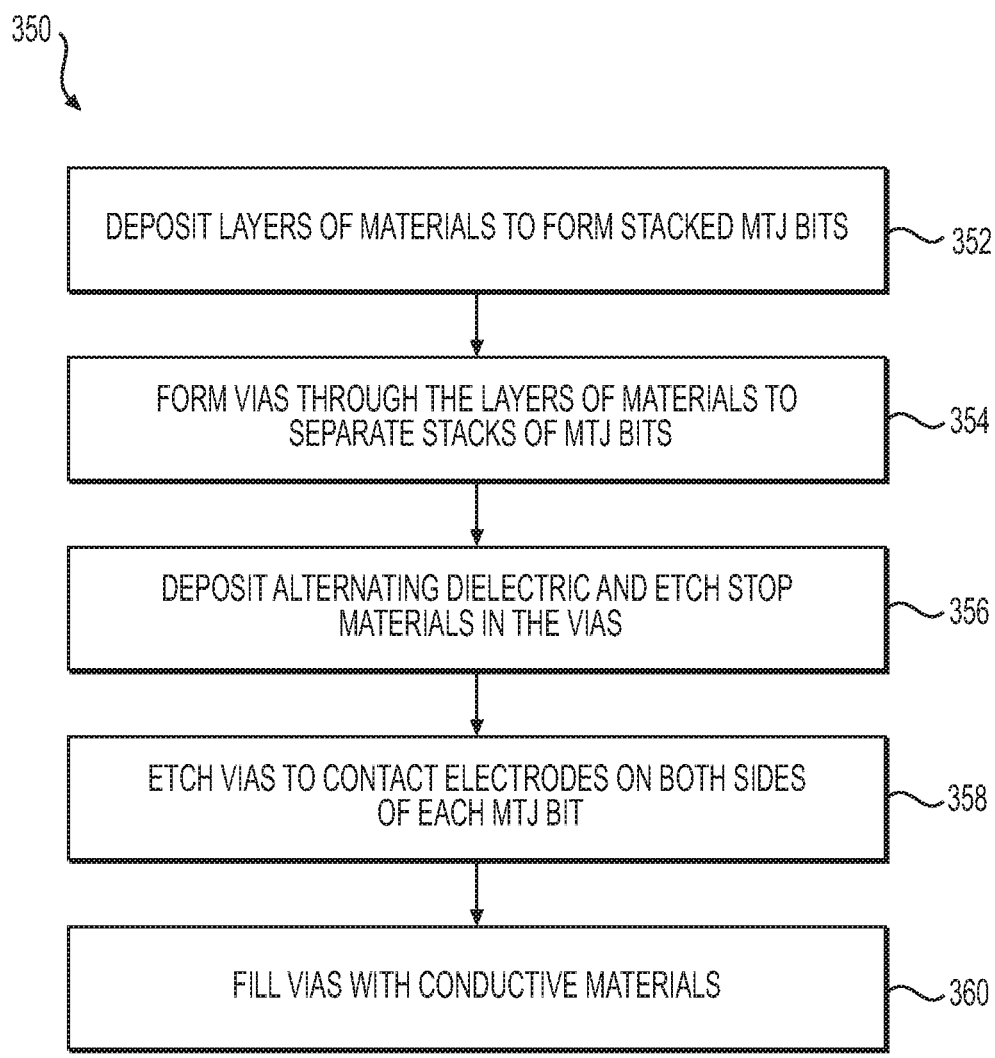
Figure 6:
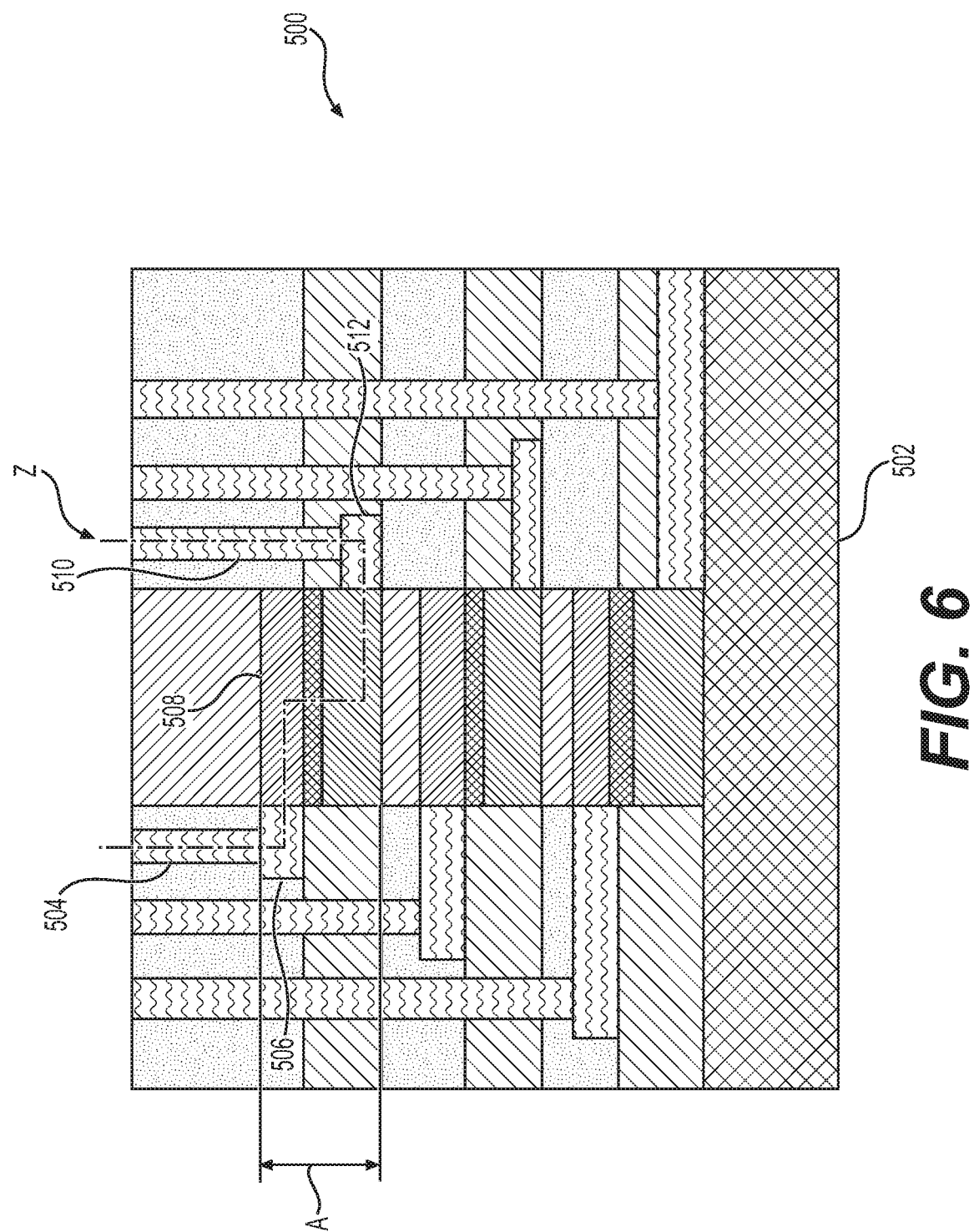
Figure 7:
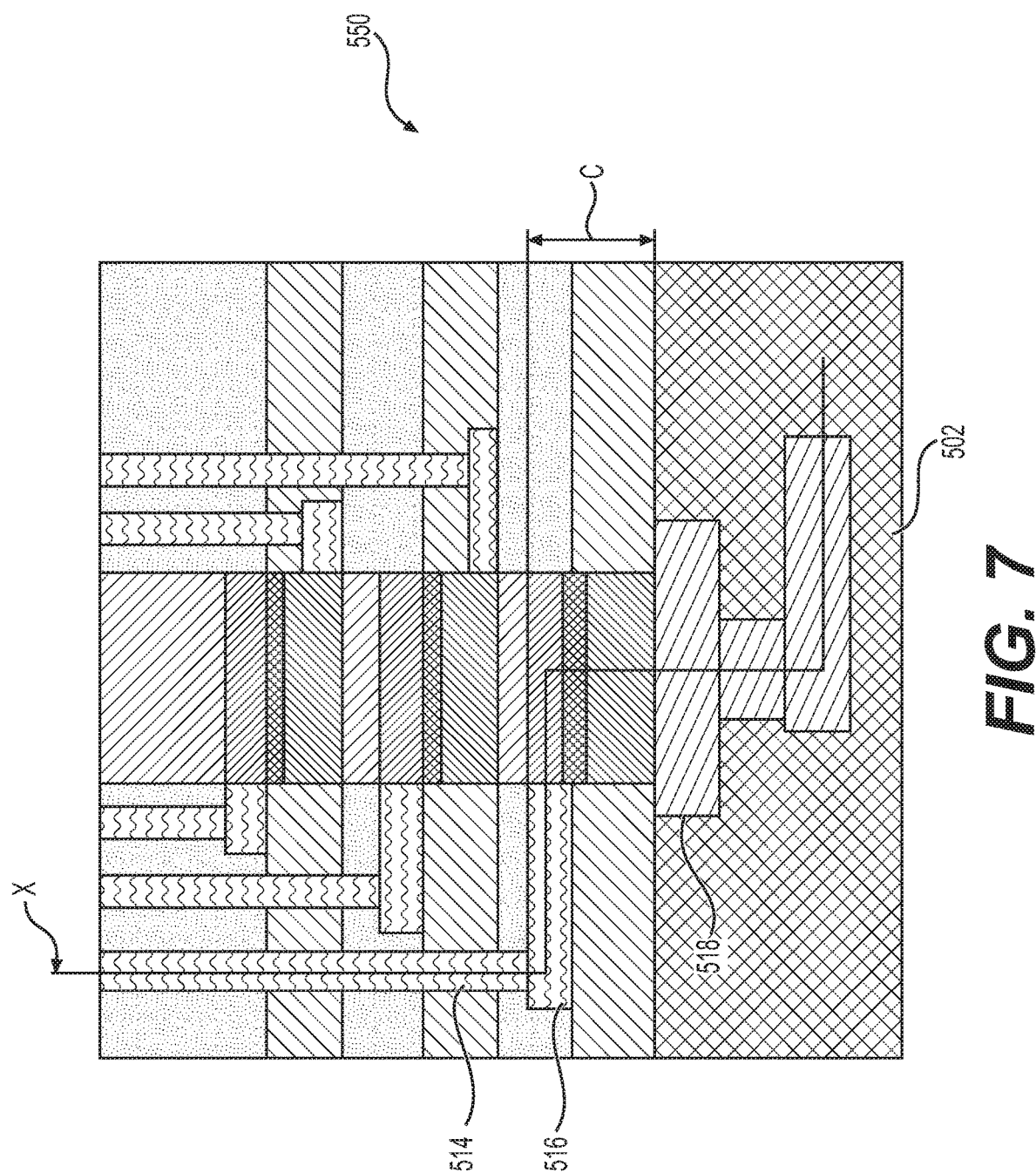
Figure 8:
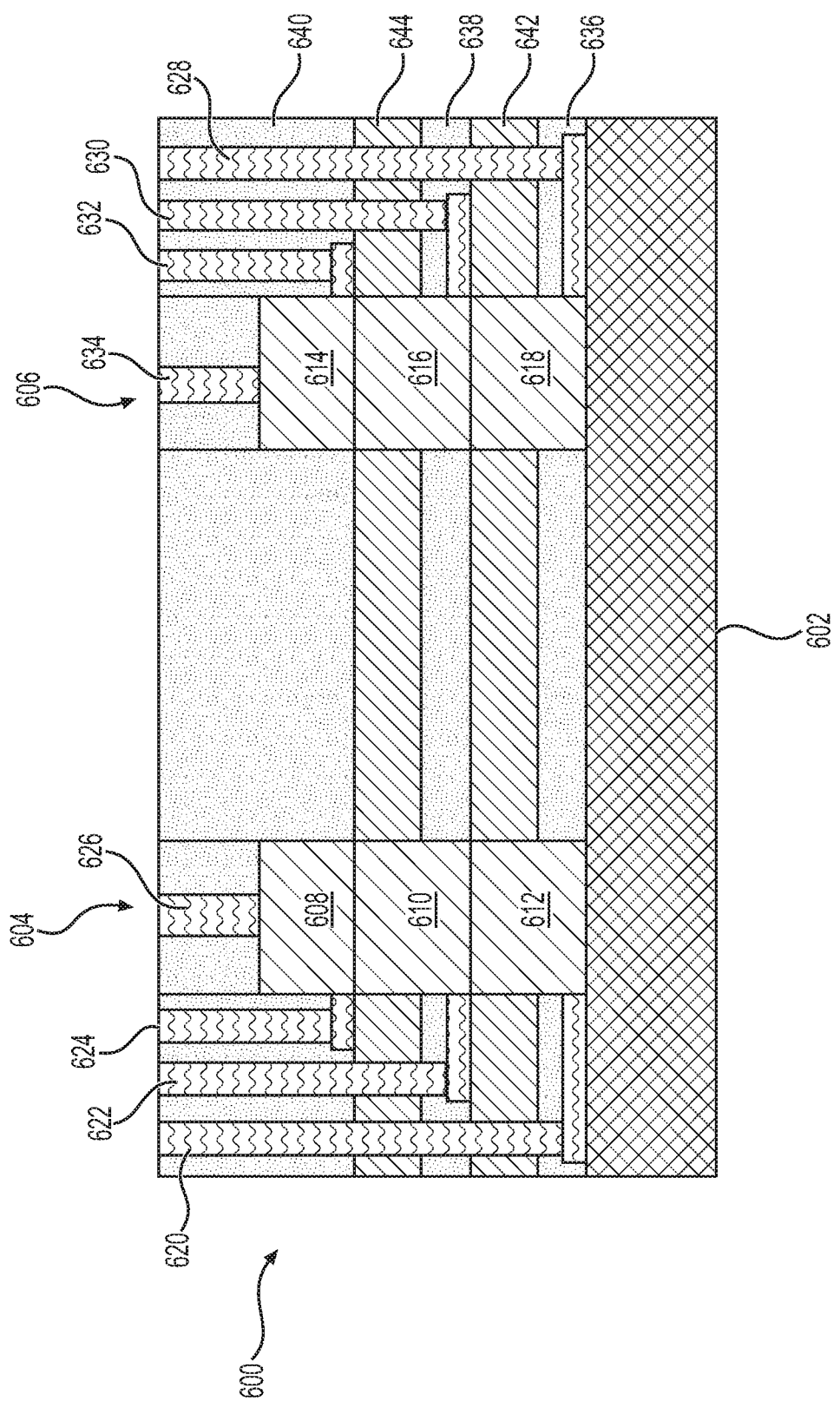
Figure 11:
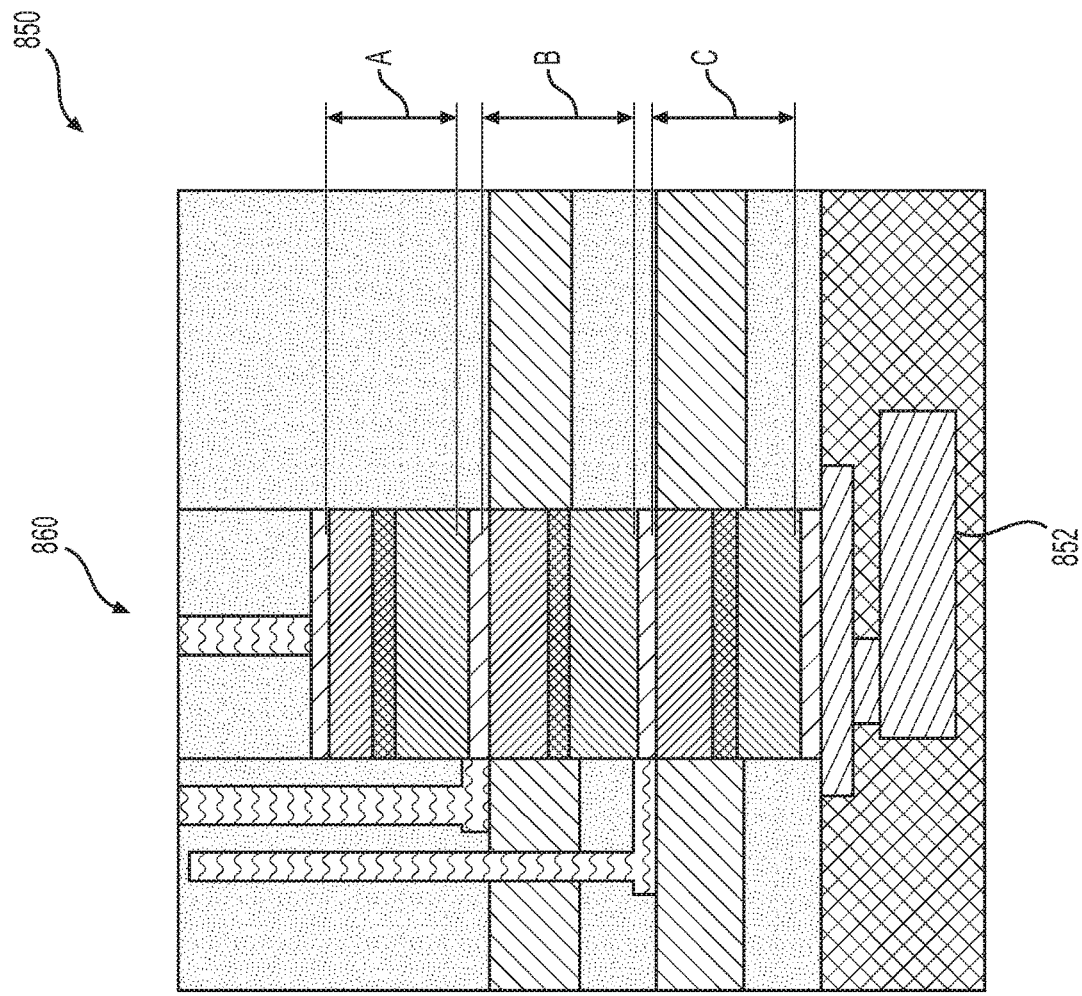
Figure 15:
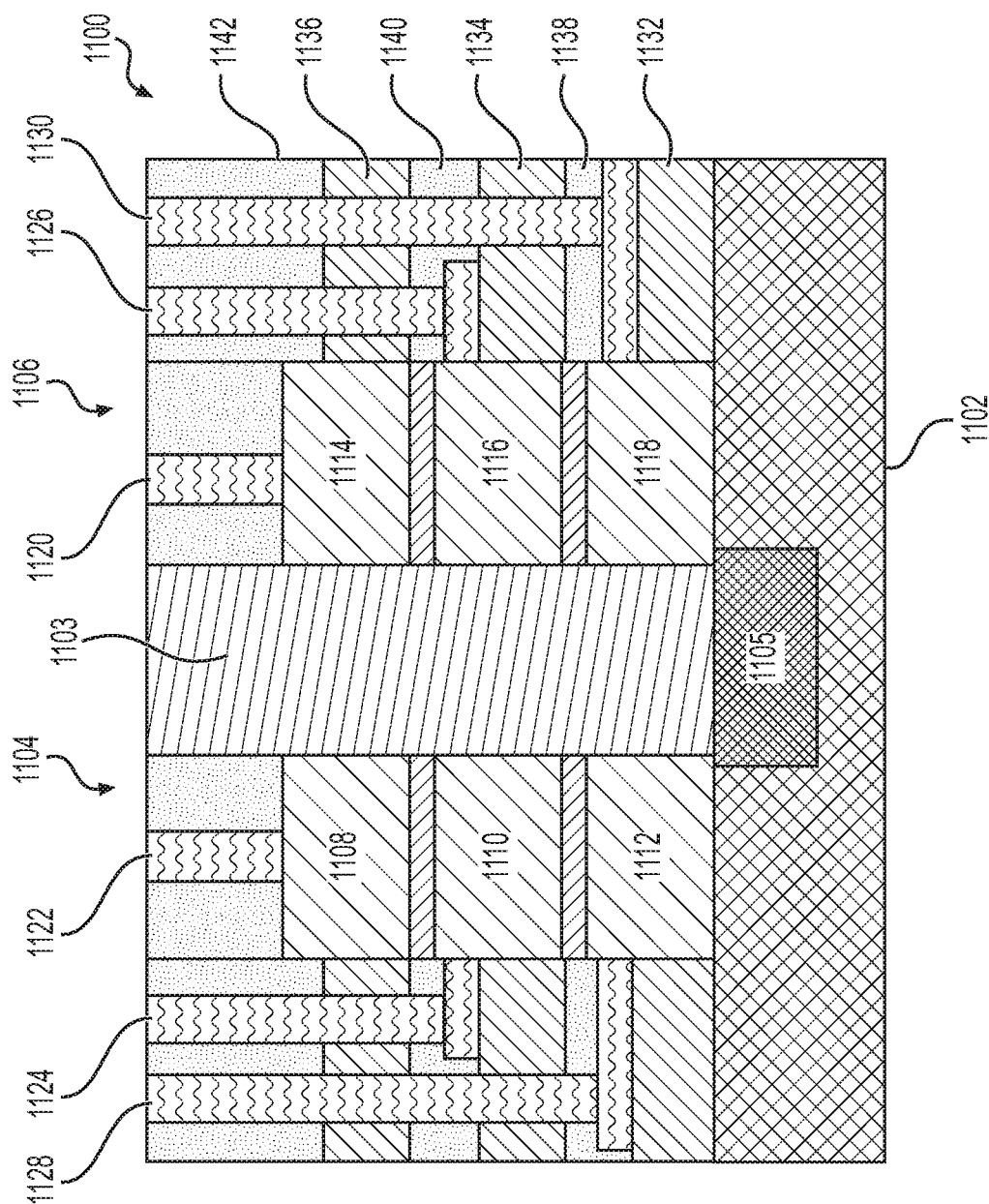
Figure 18A:
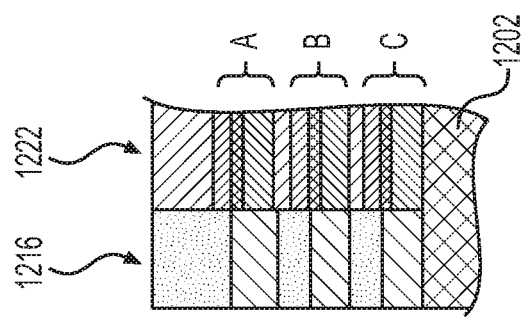
Figure 18B:
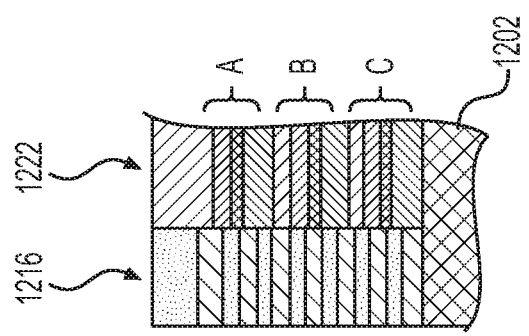
Figure 18C:
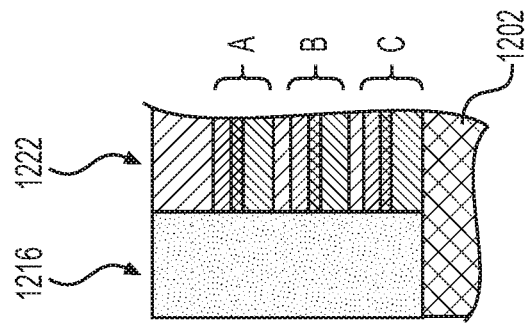
Figure 19A:
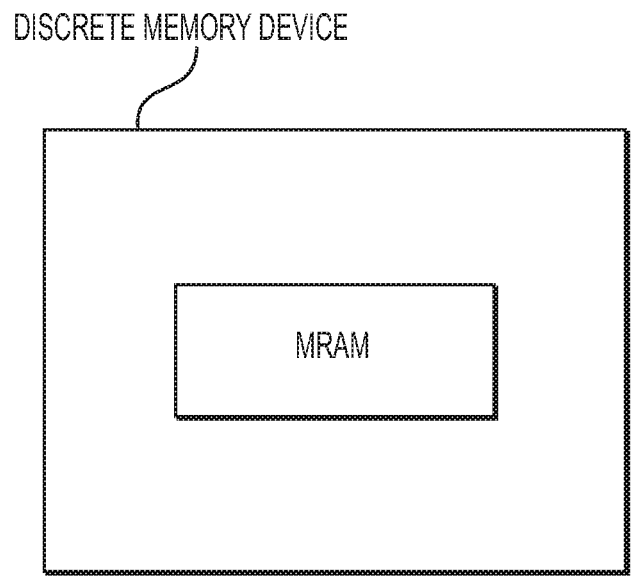
Figure 19B:
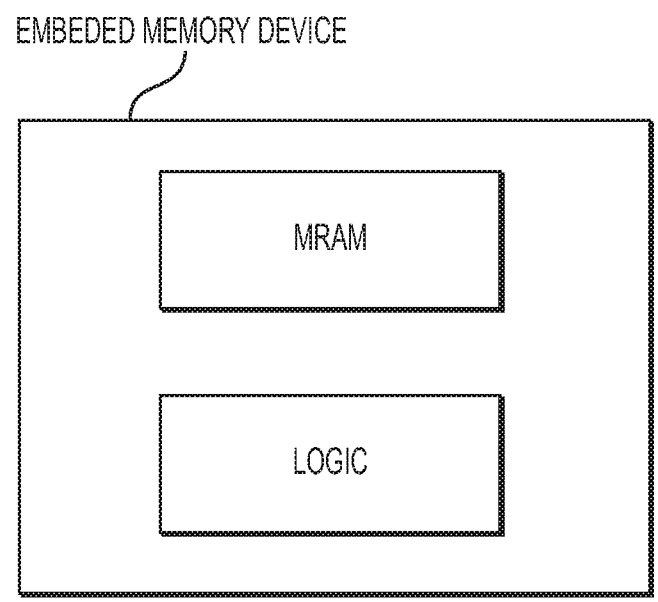

FIG. 1 is a schematic diagram of an exemplary magnetoresistive memory element electrically connected to an access transistor in a magnetoresistive memory cell configuration;

FIGS. 2A-2D are cross-sectional schematic illustrations of exemplary magnetoresistive bits according to aspects of the present disclosure;

FIG. 3 is a cross-sectional schematic illustration of an exemplary magnetoresistive device according to aspects of the present disclosure;

FIG. 4 is a flow chart depicting steps in an exemplary method of manufacturing a magnetoresistive device according to aspects of the present disclosure;

FIGS. 5A-5J are cross-sectional schematic illustrations of steps in an exemplary method of manufacturing a magnetoresistive device according to aspects of the present disclosure;

FIG. 6 is a cross-sectional schematic illustration of a further embodiment of a magnetoresistive device according to aspects of the present disclosure;

FIG. 7 is a cross-sectional schematic illustration of another embodiment of a magnetoresistive device according to aspects of the present disclosure;

FIG. 8 is a cross-sectional schematic illustration of another exemplary magnetoresistive device according to aspects of the present disclosure;

FIGS. 9A-9G are cross-sectional schematic illustrations of steps in an exemplary method of manufacturing another magnetoresistive device according to aspects of the present disclosure;

FIG. 10 is a cross-sectional schematic illustration of a further embodiment of a magnetoresistive device according to aspects of the present disclosure;

FIG. 11 is a cross-sectional schematic illustration of a further embodiment of a magnetoresistive device according to aspects of the present disclosure;

FIG. 12 is a cross-sectional schematic illustration of another exemplary magnetoresistive device according to aspects of the present disclosure;

FIGS. 13A-13F are cross-sectional schematic illustrations of steps in an exemplary method of manufacturing another magnetoresistive device according to aspects of the present disclosure;

FIGS. 14A-14C are cross-sectional schematic illustrations of steps in another exemplary method of manufacturing a magnetoresistive device according to aspects of the present disclosure;

FIG. 15 is a cross-sectional schematic illustration of another exemplary magnetoresistive device according to aspects of the present disclosure;

FIGS. 16A-16M are cross-sectional schematic illustrations of steps in an exemplary method of manufacturing another magnetoresistive device according to aspects of the present disclosure;

FIGS. 17A-17E are cross-sectional schematic illustrations of steps in another exemplary method of manufacturing another magnetoresistive device according to aspects of the present disclosure;

FIGS. 18A-18C are cross-sectional schematic illustrations of additional embodiments of magnetoresistive devices according to aspects of the present disclosure;

FIGS. 19A and 19B are schematic block diagrams of integrated circuits including a discrete memory device and an embedded memory device, each including an MRAM (which, in one embodiment is representative of one or more arrays of MRAM having a plurality of magnetoresistive memory stacks according to aspects of certain embodiments of the present disclosure); and FIGS. 20A-20E are cross-sectional schematic illustrations of steps in another exemplary method of manufacturing a magnetoresistive device according to aspects of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As explained previously, although individual layers and/or regions of devices are illustrated herein as distinct layers/regions with sharp, well-defined boundaries, typically, the materials of two adjacent layers at an interface (between the layers) may diffuse into each other over time and/or exposure to high temperature, and present an interfacial region of an alloy or a combination of the materials of the two individual layers. Thus, while all of the layers or regions of these figures may be present and distinguishable immediately after formation of these layers or regions, in some embodiments, it may be difficult to distinguish some of these regions in a cross-section. In some embodiments, some of these layers may appear as an interfacial region having a higher concentration of an element or a material.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.10 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range ±10%. It should be noted that the exemplary thickness values discussed in this disclosure are expected values (i.e., not measured values) of layer thicknesses immediately after deposition (based on deposition conditions, etc.). As a person of ordinary skill in the art would recognize, these as-deposited thickness values of a layer or region may change (e.g., by inter-layer diffusion, etc.) after further processing (e.g., exposure to high temperatures, etc.).

Unless defined otherwise, all terms of art, notations and other scientific terms or terminology used herein have the same meaning as is commonly understood by one of ordinary skill in the art to which this disclosure belongs. Some components, structures, and/or processes described or referenced herein may not be described in detail as they are well known or understood in the art. All patents, applications, published applications and other publications referred to herein are incorporated by reference in their entirety. If a definition or description set forth in this disclosure is contrary to, or otherwise inconsistent with, a definition and/or description in these references, the definition and/or description set forth in this disclosure prevails over those in the references that are incorporated herein by reference. None of the references described or referenced herein is admitted to be prior art to, or relevant to the patentability of, any aspect of the current disclosure.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," "left," "right," etc. are used with reference to the orientation of the structure(s) illustrated in the figures being described. Moreover, the terms "a" and "an" herein do not denote a limitation of quantity, but rather denote the presence of at least one of the referenced item.

In this disclosure, the term layer may refer to a single layer of material or a multi-layer stack (e.g., multiple layers or coatings (or films) of materials stacked one on top of another to form a multi-layer system). Further, although in the description below, the different layers or regions in the disclosed stack are sometimes referred to by specific names (such as, e.g., capping layer, reference layer, free layer, fixed layer, tunnel barrier, transition layer, etc.), this is only for ease of description and not intended as a functional description of the layer.

In one exemplary aspect, a magnetoresistive device of the present disclosure may be a magnetic tunnel junction type device (MTJ device). The MTJ device may be implemented, for example, as a spin-transfer torque or spin-orbit torque magnetoresistive random access memory ("MRAM") element ("memory element"), a magnetoresistive sensor, a magnetoresistive transducer, etc. An MTJ device may include a magnetoresistive stack/structure that includes intermediate layer(s) positioned (or sandwiched) between ferromagnetic regions/layers. The intermediate layer(s) may be made of dielectric materials and function as tunnel barriers in some embodiments. In other embodiments, the intermediate layer(s) may be made of conductive materials (including, but not limited to, a non-magnetic conductive material such as, e.g., copper, gold, or alloys thereof) to form a giant magnetoresistive (GMR) or GMR-type device.

Of the two ferromagnetic layers or regions disposed on either side of the intermediate region, one ferromagnetic region may be a magnetically "fixed" (or "pinned") layer, and the other ferromagnetic region may be a magnetically "free" layer. The term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector does not move substantially in response to such applied magnetic fields or spin-polarized currents. The direction of the magnetization vectors of the free magnetic region may be switched and/or programmed (for example, through spin transfer torque (STT), spin orbit torque (SOT), or a magnetic field generated by electrical current passing through a nearby conductor) by application of a write signal (e.g., one or more current pulses) to the magnetoresistive memory stack. As is known in the art, an electrical resistance of the described magnetoresistive stack may change based on whether the magnetization direction (e.g., the direction of the magnetic moment) of the free region adjacent to the non-magnetic layer is in a parallel alignment (P) or in an antiparallel alignment (AP) with the magnetization direction (e.g., the direction of the magnetic moment) of the fixed region adjacent to the non-magnetic layer. Typically, if the two regions have the same magnetization alignment (i.e., in the P magnetic state), the resulting relatively low(er) resistance ($R_L$) is considered as a digital "0," while if the alignment is antiparallel (i.e., in the AP state) the resulting relatively high(er) resistance ($R_H$) is considered to be a digital "1." A memory device (such as an MRAM) may include multiple such magnetoresistive stacks, which may be referred to as memory cells or elements, arranged in an array of columns and rows. By measuring the current through each cell, the resistance of each cell, and thus the data stored in the memory array can be "read."

Magnetoresistance ratio (MR) is the ratio of the change in resistance of a magnetoresistive stack between its high and low resistance states (MR=($R_H$–$R_L$)/$R_L$, where $R_L$ and $R_H$ are the resistance of the magnetoresistive stack in the low and high resistance states, respectively. MR is indicative of the strength of the signal when a memory element is "read." For an MTJ-type magnetoresistive stack with a strong read signal, a larger MR (e.g., a larger difference between the individual resistances $R_H$ and $R_L$) is desirable. When the intermediate layer of magnetoresistive stack is a tunnel barrier made of a dielectric material, the resistance may be measured by the resistance-area product (RA).

In some aspects, the magnetoresistive devices of the current disclosure include magnetic tunnel junction bits (MTJ bits). These MTJ bits may be formed from a magnetoresistive stack/structure that may include, or may be operably coupled to, one or more electrically conductive electrodes, vias, or conductors above, below, and/or on either side of the magnetoresistive stack/structure. As described in further detail below, the magnetoresistive stack/structure that forms the MTJ bits may include many different regions or layers of material, where some of the layers include magnetic materials, and whereas others do not. In one embodiment, the methods of manufacturing the disclosed devices may include sequentially depositing, growing, sputtering, evaporating, and/or providing (collectively referred herein as "depositing" or other verb tense (e.g., "deposit" or "deposited")) layers and regions which, after further processing (for example, etching) form an MTJ bit (or a plurality of MTJ bits stacked one on top of another, as described in greater detail below). While the following written description relates to MTJ bits stacked on top of one another to form a magnetoresistive device, those of ordinary skill in the art will readily understand that the present disclosure is not limited to only magnetoresistive devices.

In some embodiments, magnetoresistive stacks/structures that form the MTJ bits may be formed between a first electrode/via/line and a second electrode/via/line, both of which may permit electrical access to the MTJ bit by allowing for electrical connectivity to circuitry and other elements of the magnetoresistive device. Between the electrodes/vias/lines may be regions (each made of a single layer or multiple layers) of different materials. The magnetoresistive stacks/structures that form the MTJ bits may include at least one "fixed" magnetic layer, at least one "free" magnetic layer, and one or more intermediate layers disposed between a "fixed" magnetic layer and the "free" magnetic layer. In some embodiments, the electrode/via/line on one or both sides of the magnetoresistive stack/structure may be eliminated, and an interconnect (e.g., bit line) may be formed in contact with the magnetoresistive stack/structure.

Aspects of the present disclosure relate to MTJ bits stacked on top of one another to form magnetoresistive devices. Such devices may include a sensor architecture or a memory architecture (among other architectures). For example, FIG. 1 schematically depicts a memory configuration 100 including a magnetoresistive stack 102 (which may include one or more MTJ bits). Magnetoresistive stack 102 may be configured to couple or connect to an access transistor 110 and to various conductors (e.g., source line conductor 114, word line (WL) conductor 112, bit line (BL) conductor 108), which may carry one or more control signals, via electrically conductive electrodes 104, 106.

Magnetoresistive stack 102 may be used in any suitable application, including, e.g., in a memory configuration such as configuration 100. While various embodiments of the present disclosure may be depicted as including, e.g., three MTJ bits in a magnetoresistive stack, it will be understood by one of ordinary skill of the art that these stack sizes are merely exemplary, and that magnetoresistive stacks according to the present disclosure may include more or fewer than three MTJ bits.

Electrodes 104, 106 may comprise an electrically conductive material, and may be part of (or be in physical contact with) electrically conductive interconnects (e.g., vias, traces, lines, etc.) of configuration 100. Although any electrically conductive material may be used for electrodes 104, 106, in some embodiments, a metal such as tantalum (Ta), titanium (Ti), tungsten (W), or a composite or alloy of these elements (e.g., tantalum-nitride alloy) may be used. In some embodiments, electrodes 104 and/or 106 may be eliminated, and magnetoresistive stack 102 may be in direct contact with a metallization structure (e.g., line, via, etc.) of configuration 100.

Although not illustrated in FIG. 1, electrode 106 may be formed on a planar surface of a semiconductor substrate (e.g., silicon substrate, etc.) having integrated circuit (IC) devices (e.g., CMOS devices, such as, for example, transistors, etc.) formed thereon. In some embodiments, electrode 106 may include a seed layer at its interface with the overlying region (e.g., an adjacent region within stack 102). During fabrication, the seed layer may assist in the formation of the overlying region on electrode 106. The seed layer may include one or more of nickel (Ni), chromium (Cr), cobalt (Co), iron (Fe), ruthenium (Ru), platinum (Pt), tantalum (Ta), and alloys thereof (for example, an alloy including nickel (Ni) and/or chromium (Cr)). In some embodiments, the seed layer may be eliminated, and the top surface of electrode 106 itself may act as the seed layer.

Figure 2A:
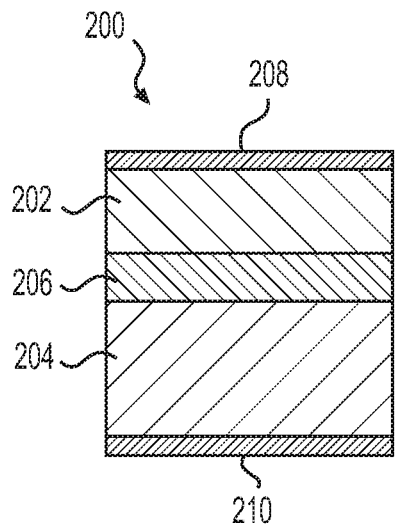
Figure 2B:
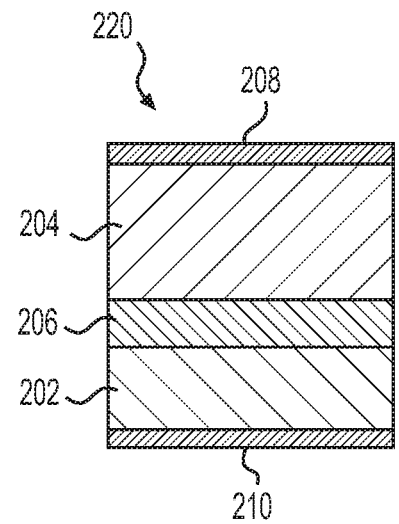
Figure 2C:
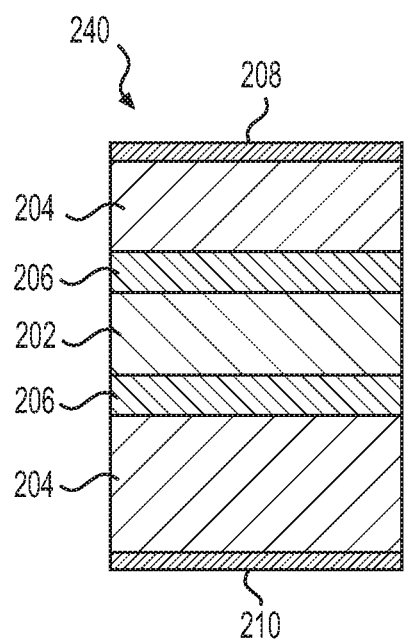
Figure 2D:
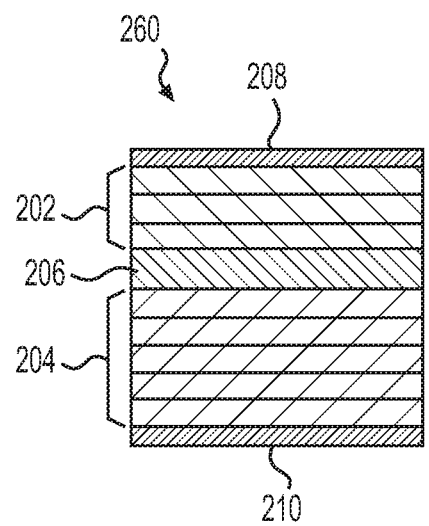

FIGS. 2A-2D depict cross sectional, schematic views of exemplary MTJ bits which may be used in embodiments of the present disclosure. FIG. 2A depicts an MTJ bit 200 having a free region 202 stacked over a fixed region 204, and separated from fixed region 204 by an intermediate region 206. MTJ bit 200 also includes a top electrode 208 and a bottom electrode 210. FIG. 2B depicts a second MTJ bit 220, in which fixed region 204 is stacked above free region 202 with intermediate region 206 disposed therebetween. FIG. 2C depicts yet another MTJ bit 240, including a free region 202 sandwiched between two fixed regions 204, and separated from each of the two fixed regions 204 by intermediate regions 206. FIG. 2D depicts a further MTJ bit 260, in which multiple regions are stacked adjacent to one another to form fixed region 204, followed by an intermediate region 206 above fixed region 204, followed by multiple regions stacked adjacent to one another above intermediate region 206, to form free region 202.

As previously explained, a fixed region 204 may be a fixed magnetic region of an MTJ bit (e.g., MTJ bit 200, 220, 240, 260). That is, a magnetic moment vector in fixed region 204 does not move significantly in response to applied magnetic fields (e.g., an external field) or applied currents used to switch the magnetic moment vector of free region 202. Fixed region 204 may include alloys that include cobalt (Co) and iron (Fe) and other materials (preferably cobalt (Co), iron (Fe), and boron (B)). Typically, the composition of materials (e.g., cobalt (Co), iron (Fe), and boron (B)) in fixed region 204 may be selected to achieve good temperature compensation. In general, fixed region 204 may include a single layer or multiple layers stacked one on top of another. In some embodiments, fixed region 204 also may include one or more ferromagnetic layers and one or more non-magnetic material layers (e.g., ruthenium (Ru), rhodium (Rh), platinum (Pt), palladium (Pd), rhenium (Re), iridium (Ir), copper (Cu), aluminum (Al), tantalum (Ta), titanium (Ti), niobium (Nb), vanadium (V), zirconium (Zr), one or more alloys of these elements, and in certain embodiments, tungsten (W) and molybdenum (Mo)). In some embodiments, fixed region 204 may include a multi-layer structure of cobalt (Co) and platinum (Pt), cobalt (Co) and palladium (Pd), or cobalt (Co) and nickel (Ni) (with or without other alloying elements). In some embodiments, fixed region 204 may include one or more synthetic antiferromagnetic structures (SAF) or synthetic ferromagnetic structures (SyF).

In some embodiments, the fixed region 204 may have a thickness in the range of between approximately 8 Å and approximately 300 Å, between approximately 15 Å and approximately 110 Å, greater than or equal to 8 Å, greater than or equal to 15 Å, less than or equal to 300 Å, or less than or equal to 110 Å. Fixed region 204 may be deposited or formed using any technique now known or later developed; all of which are intended to fall within the scope of the present disclosure.

In some embodiments, free region 202 may be provided "above" fixed region 204 with an intermediate region 206 formed between fixed and free regions 204, 202. The relative orientations of fixed and free regions 204, 202 depicted in FIGS. 2A-2D are only exemplary, and those of ordinary skill will readily recognize that further configurations of fixed and free regions 204, 202 are possible (e.g., in some embodiments, a fixed region 204 may be provided "above" a free region 202, with an intermediate region 206 in between them). The type of intermediate region 206 formed may depend upon the type of device being fabricated. In an MTJ bit, intermediate region 206 may include a dielectric material that functions as a tunnel barrier of an MTJ bit. Intermediate region 206 may be formed on (or above) a surface of fixed region 204, and free region 202 may be formed on (or above) a surface of intermediate region 206. In general, intermediate region 206 may be formed on or above fixed region 204 using any technique now known (e.g., deposition, sputtering, evaporation, etc.) or later developed. In some embodiments, intermediate region 206 may include an oxide material, such as, for example, magnesium oxide (MgOx) or aluminum oxide (AlOx (e.g., $Al_2O_3$)), and may be formed by multiple steps of material deposition and oxidation. An exemplary method of forming intermediate region 206 is described in U.S. patent application Ser. No. 15/957,333, filed on Apr. 19, 2018, which is incorporated by reference in its entirety herein.

In general, intermediate region 206 may have any thickness. In some embodiments, intermediate region 206 may have a thickness of approximately 8.5-14.1 Å, preferably approximately 9.6-13.0 Å, and more preferably approximately 9.8-12.5 Å. In some embodiments, intermediate region 206 may have a thickness of approximately 3-14 Å, or approximately 5-12 Å, or approximately 6-10 Å. Although not illustrated in FIGS. 1 and 2A-2D, in some embodiments, a dusting of an interfacial material (e.g., iron (Fe), cobalt-iron-alloy (CoFe) etc.) may also be provided at the interface between free region 202 and intermediate region 206. This interfacial material, deposited as, e.g., a discontinuous patchwork of material (as opposed to a continuous layer that would break exchange between the mating layers), may result in a relatively high(er) perpendicular magnetic anisotropy (PMA) of the resulting MTJ bit. In some embodiments, a dusting of an interfacial material (e.g., cobalt (Co), iron (Fe), or their alloys etc.) may also be provided at the interface between fixed region 204 and intermediate region 206.

Free region 202 may include any ferromagnetic alloy. In some embodiments, the ferromagnetic alloy of free region 202 may comprise cobalt (Co), iron (Fe), and boron (B) (referred to as CoFeB). It should be noted that the configurations of free region 202 illustrated in FIGS. 2A-2D are only exemplary, and many other configurations are possible. Notwithstanding the specific configuration of free region 202, as explained previously, a magnetic vector (or moment) in free region 202 may be moved or switched by applied magnetic fields or spin torque currents. Although free region 202 is illustrated as a single layer in FIG. 1, this is only exemplary. Similar to fixed region 204, free region 202 may also include multiple layers stacked one over the other.

It will be apparent to one of ordinary skill in the art that the various MTJ bits depicted in FIGS. 2A-2D may be suitable for use in various embodiments of the present disclosure. Moreover, it will be apparent to one of ordinary skill in the art that many more variations of MTJ bits may be suitable for use in various embodiments the present disclosure without departing from the present disclosure's scope. U.S. Pat. Nos. 8,686,484; 8,747,680; 9,023,216; 9,136,464; and 9,419,208, and U.S. patent application Ser. No. 15/831,736 (filed Dec. 5, 2017), describe magnetoresistive stacks that may also serve as MTJ bits in some embodiments. These references are incorporated by reference in their entirety herein.

As mentioned, in some embodiments, one or both of electrodes (e.g., electrodes 208, 210 depicted in FIGS. 2A-2D) may be eliminated and/or replaced with an interconnect configured to be in contact with the MTJ bit (e.g., MTJ bits 200, 220, 240, 260). In some embodiments, MTJ bits that are stacked adjacent to one another may share electrodes, as described further below.

Embodiments of the present disclosure may relate to spin-transfer torque devices and spin-orbit torque devices, which will now be generally described. In spin-torque transfer (STT) MTJ devices, switching the magnetization direction of a free region (or free regions) of a magnetoresistive stack is accomplished by driving a tunneling current pulse (I) through part or all of the stack. The polarity of the current pulse (I) determines the final magnetization state (i.e., P or AP) of the free region. For example, directing a current I of sufficient magnitude in one direction (e.g., from a fixed region towards a free region) may switch the free region to the AP state (i.e., cause the magnetization state of the free region to be antiparallel with the magnetization state of the fixed region). And, directing a tunneling current (I) in the opposite direction (e.g., from the free region towards the fixed region) may change the magnetization state of the free region to be parallel (i.e., P) with the magnetization state of the fixed region. The mean current required to switch the magnetic state of the free region may be referred to as the critical current (Ic). The critical current is indicative of the current required to "write" data in (or the write current of) a magnetoresistive memory cell. As those of ordinary skill in the art will recognize, the write current may be larger than the critical current. For example, in some cases, the write current may be 1.4 to 1.6 times larger than the critical current. Reducing the required write current(s) is desirable so that, among other things, a smaller access transistor can be used for each memory cell and a higher density, lower cost memory can be produced. Reduced write current requirements may also lead to greater longevity of an MTJ-type magnetoresistive memory cell due to, e.g., reduce degradation of the intermediate dielectric layer.

To briefly describe spin-transfer torque, a current (I) becomes spin-polarized after it passes through a first magnetic layer in a magnet/non-magnet/magnet tri-layer structure (e.g., fixed region 204/intermediate region 206/free region 202 structure of FIG. 2A), where fixed region 204 is substantially fixed in its magnetic orientation by any one of a number of methods known in the art. The spin-polarized current crosses the nonmagnetic intermediate region 206 and then, through conservation of spin angular momentum, exerts a spin torque on free region 202. This spin torque switches the magnetic orientation of free region 202 to be parallel (P) to the magnetic orientation of fixed region 204. If a current of the opposite polarity (e.g., in a direction opposite to the direction of the arrow in FIG. 1) is applied, the current passes first through free region 202 and applies a spin torque on fixed region 204. However, since the magnetization of fixed region 204 is fixed, its magnetization does not switch. A fraction of the electrons will then reflect off fixed region 204 and travel back across intermediate region 206 and interact with free region 202. In this case, the spin torque acts to switch the magnetic orientation of free region 50 to be antiparallel (AP) to the magnetic orientation of fixed region 204. Spin-torque switching occurs only when the magnitude of current I exceeds the critical current $I_C$ of an MTJ bit (e.g., MTJ bit 200). In a typical MTJ device including multiple MTJ bits, the spin-torque switching current I (called write current $I_W$) used by the circuit is chosen to be somewhat above the average $I_C$ of the multiple MTJ bits so that all MTJ bits will switch reliably when current $I_W$ is applied. During reading of data from an MTJ bit, a small current (e.g., read current) flows through the MTJ bit and the resistance of the MTJ bit (e.g., $R_{Min}$, $R_{Max}$, etc.) is detected.

In spin-orbit torque (SOT) MTJ devices, switching the magnetization of the free region of an MTJ bit may be accomplished by driving a current pulse through a heavy metal layer adjacent to (e.g., in contact with or near) the free region. The polarity and direction of the current pulse may determine the direction in which the magnetic moment of the free region is transposed. The heavy metal layer may include materials such as, for example, tungsten (W), tantalum (Ta), hafnium (Hf), platinum (Pt), palladium (Pd), iridium (Ir), ruthenium (Ru), rhodium (Rh), niobium (Nb), molybdenum (Mo), zirconium (Zr), or alloys or combinations thereof. Current through the heavy metal layer adjacent to (or in contact with) the free region results in the injection of a "spin current" into the free region and a "spin torque" acting on the free region. The spin current may be injected into the free region in a direction perpendicular to the interface of the free region with the heavy metal layer. The spin torque applied to the free region by the spin current impacts the magnetic state of the free region in a manner similar to the tunneling current that flows through the MTJ in an STT MTJ device. As with write currents in STT MTJ devices, in SOT MTJ devices, the direction of torque applied by the spin current is dependent on the direction of the current flow in the heavy metal layer. Thus, the free region may be able to be switched between two magnetically-stable states based on torque applied by current flowing in the proximately positioned heavy metal layer in one direction or the other. In some embodiments, in addition to the torque injected from the heavy metal layer, the free region may be able to be switched between two stable magnetic states based on the torque applied by a complementary STT current flowing in either direction through the magnetoresistive stack.

Reference will now be made to magnetoresistive devices, and methods of fabricating the same.

FIG. 3 is a cross-sectional schematic illustration of an exemplary magnetoresistive device 300 according to aspects of the present disclosure. Magnetoresistive device 300 may be an MTJ device, which may be implemented, for example, as an STT based MRAM element ("memory element"), a magnetoresistive sensor, a magnetoresistive transducer, etc. FIG. 3 shows two sets of vertically stacked MTJ bits, stack 304 and stack 306, on the surface of a substrate 302. Stack 304 includes MTJ bits 308, 310, 312 and stack 306 includes MTJ bits 314, 316, 318. The MTJ bits within each stack 304, 306 may be separated from each other by a dielectric material (e.g., dielectric material 332, 334), isolating each MTJ bit from the others in the same stack. Either side of each MTJ bit may be connected to a via, such that a signal may travel through each MTJ bit. For example, MTJ bit 308 may be connected to vias 320, 322. MTJ bit 310 may be connected to vias 324, 326. MTJ bit 312 may be connected to vias 328, 330. Either side of each MTJ bit in stack 306 (and any other stacks of MTJ bits in device 300) likewise may be connected to a via. Surrounding the vias may be one or more non-conductive materials which may serve to, e.g., insulate the vias and MTJ bits of device 300 from one another and/or assist in the manufacture of device 300, as described further below. For example, device 300 may include alternating regions of dielectric materials 336, 338, 340 (which may a first dielectric material having a first etch rate) and etch stop materials 342, 344, 346 (which may be a second dielectric material having a second etch rate).

The structure of device 300 may be repeated in the in-plane and out-of-plane directions to form a three-dimensional array of such vertically aligned MTJ bits on the surface of substrate 302. Device 300 may thus include any suitable number of MTJ bits. Although not illustrated in FIG. 3, device 300 may also include structures formed on top of stacks 304, 306. For example, stacks 304, 306 may be formed between two metal layers (M2 and M3, etc.) of substrate 302.

Substrate 302 may be, for example, an IC device with transistors formed thereon. In some embodiments, substrate 302 may be, for example, an integrated circuit ("IC"). Substrate 302 may be in any stage of processing. For example, magnetoresistive stacks bits may be formed on the M1 metal layer, the M2 metal layer, or any other layer of substrate 302, where substrate 302 is an IC device.

As has been described elsewhere herein, one of ordinary skill in the art will recognize that stacks 304, 306 may include MTJ bits in any suitable configuration of fixed regions, free regions, and intermediate regions. Each MTJ bit 308, 310, 312, 314, 316, 318 may include an electrode on either end of its combination of fixed, free, and intermediate regions, such that a conductive via connects to either side of each MTJ bit.

Vias 320, 322, 324, 326, 328, 330 may include any suitable conductive material now-known or developed in the future. For example, in some embodiments, the vias may include copper (Cu). Vias 320, 322, 324, 326, 328, 330 may be formed by any now-known or future-developed process, including the processes described in further detail below.

Dielectric materials 332, 334 may, in general, include any electrically nonconductive material (such as, for example, silicon nitride, silicon oxide, or a low-k inter-layer dielectric material (e.g., carbon doped $SiO_2$, carbon doped oxide, organo silicate glass (OSG), spin-on organics, etc., or combinations thereof)). Likewise, dielectric materials 336, 338, 340 may include any of these or other suitable electrically nonconductive materials. In some embodiments, dielectric materials 336, 338, 340 and/or dielectric materials 332, 334 may be the same material.

Etch stop materials 342, 344, 346 may be incorporated into device 300 to aid in the via etching process, as is described in further detail below. In some embodiments, etch stop materials 342, 344, and 346 may be the same material. In some embodiments, etch stop materials 342, 344, and 346 may also be dielectric materials having an etch rate different from the dielectric materials 336, 338, 340. Any material that is selective with respect to the etching process used to form the vias and undercuts described below (i.e., via 446 and undercut via 458 in FIGS. 5G and 5H) may be used as or in an etch stop material. In some embodiments, materials such as, for example, silicon nitride ($Si_3N_4$), etc. may be used in etch stop materials 342, 344, 346.

FIG. 4 is a flow chart depicting steps in one exemplary method 350 of manufacturing a magnetoresistive device according to aspects of the present disclosure. One of ordinary skill in the art will understand that steps may be added, removed, or performed out of order. According to step 352, layers of materials may be deposited to form the layers of MTJ stacks/structures. According to step 354, vias may be formed through the layers of materials, to form separate stacks of MTJ bits (for e.g., using conventional photolithography and etching processes). According to step 356, materials, such as alternating layers of dielectric materials, may be deposited in the vias, to insulate the separated stacks of MTJ bits from one another. According to step 358, conductive vias may be etched to contact electrodes on both sides of each MTJ bit in each stack. According to step 360, the conductive vias may be filled with one or more conductive materials.

The steps of FIG. 4 will be described in further detail in the context of FIGS. 5A-5J, which are cross-sectional schematic illustrations of steps in one exemplary method of manufacturing a magnetoresistive device 400 according to aspects of the present disclosure. Magnetoresistive device 400 may be similar to, e.g., device 300 depicted in FIG. 3.

Figure 5A:
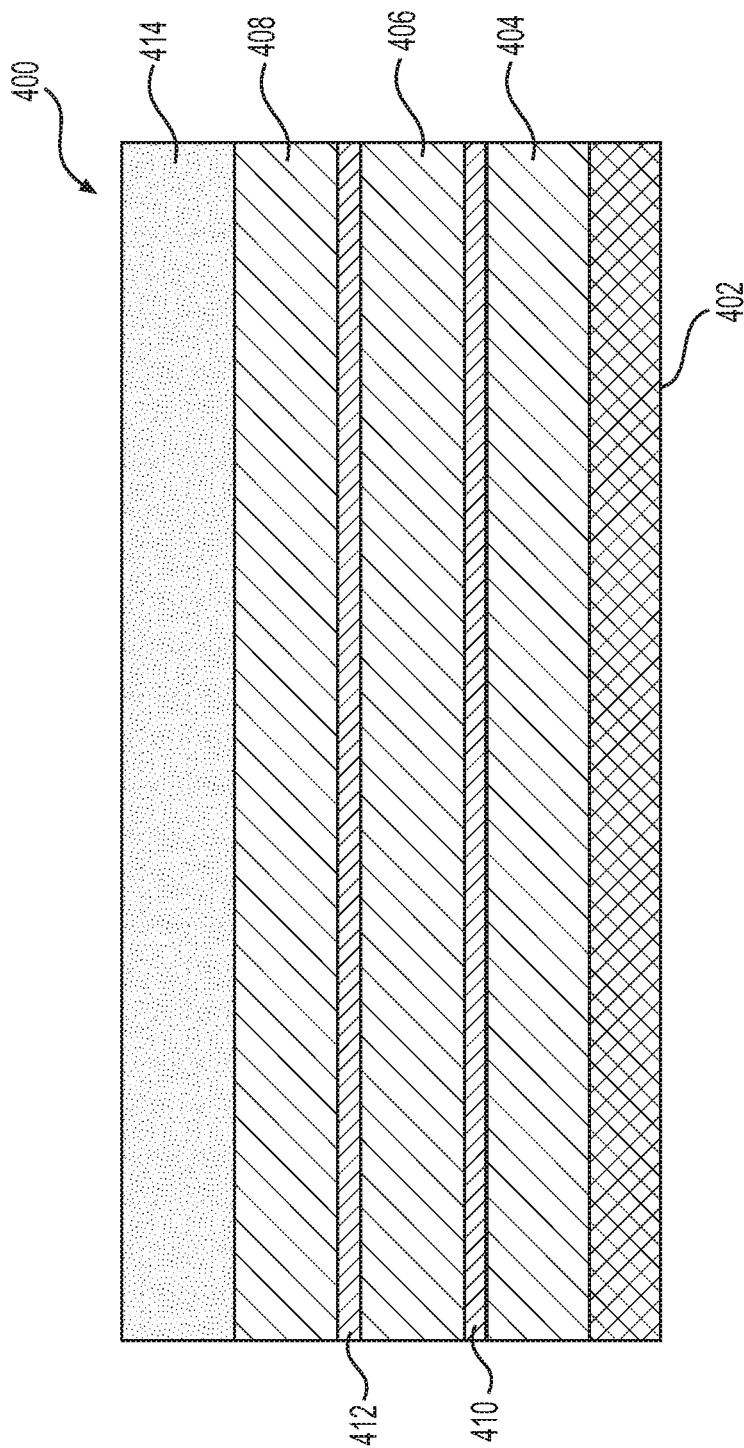

According to step 352, layers of materials may be deposited to form regions of stacked MTJ bits. FIG. 5A depicts that layers of materials may be deposited over a substrate, such as substrate 402. Layer blocks 404, 406, 408 may include layers to form a series of stacked MTJ bits over substrate 402. Dielectric materials may be deposited to form dielectric layers 410, 412 in between layer blocks 404, 406, 408, to separate the stacked MTJ bits. A dielectric material may also be deposited to form dielectric layer 414 on top of the layer blocks 404, 406, 408.

Figure 5B:
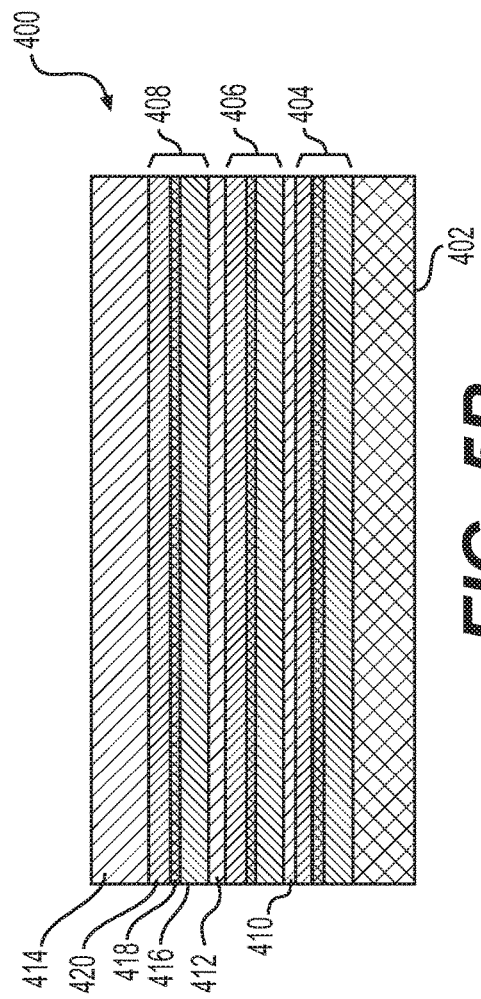

Substrate 402 may be any substrate similar to substrate 302 of device 300, e.g., an IC device. Each of layer blocks 404, 406, 408 may include any layers suitable for forming an MTJ bit. For example, each of layer blocks 404, 406, 408 may include layers to form a fixed region, an intermediate region, and a free region, in any suitable order, such as the layers and regions depicted in, e.g., any of FIGS. 2A-2D, or in FIG. 3, and may include any suitable materials, now-known, or future-developed, to form such layers. FIG. 5B depicts an exemplary configuration of layers, in which each of layer blocks 404, 406, 408 includes, e.g., a fixed region (e.g., fixed region 416 of layer block 408), an intermediate region (e.g., intermediate region 418 of layer block 408), and a free region (e.g., free region 420 of layer block 408), but it is contemplated that each layer block 404, 406, 408 may include any layers suitable to form regions of an MTJ bit. Dielectric layers 410, 412, 414 may include any suitable insulating material or materials known in the art or developed in the future (e.g., an oxide, a nitride, a carbonitride, or any other material discussed elsewhere herein). Although layer blocks 404, 406, 408 are depicted, and may be used to form, e.g., stacks of three MTJ bits, it is contemplated that additional or fewer layer blocks and dielectric layers may be deposited to form stacks of more than, or fewer than, three MTJ bits.

Any suitable currently-known or future-developed method may be used to form the different regions of the stacked MTJ bits. Since suitable integrated circuit fabrication techniques (e.g., deposition, sputtering, evaporation, plating, etc.) that may be used to form the different regions are known to those of ordinary skill in the art, they are not described here in great detail. In some embodiments, forming some of the regions may involve thin-film deposition processes, including, but not limited to, physical vapor deposition techniques such as ion beam sputtering and magnetron sputtering. Forming thin insulating layers may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment. In some embodiments, formation of some or all of the regions of the stacked MTJ bits may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy axis and a preferred pinning direction for any antiferromagnetically pinned materials.

Figure 5C:
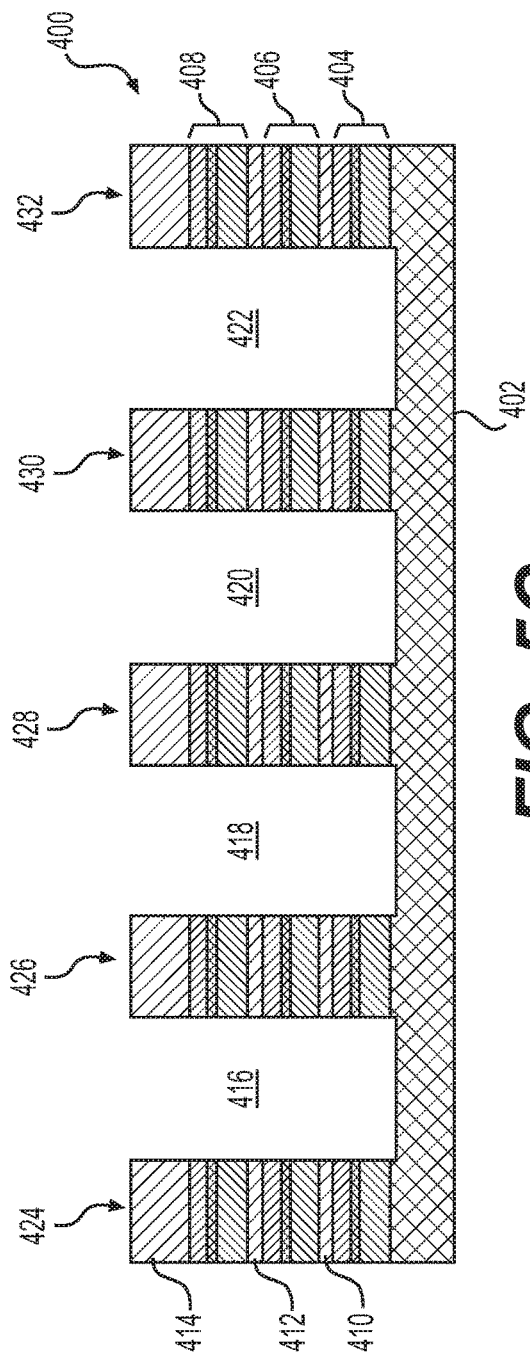

According to step 354, etched-regions or vias may be formed through one or more layers of the materials, exposing substrate 402, to form separate stacks of MTJ bits. FIG. 5C depicts the formation of, e.g., etched-regions 416, 418, 420, 422 (or etched fields which may also be referred to herein as vias) to form stacks 424, 426, 428, 430, 432, each of which includes layer blocks 404, 406, 408. Any suitable etching process may be used to form etched-regions 416, 418, 420, 422. For example, in some embodiments, reactive ion etching (ME) or ion beam etching (IBE) may be used to form etched-regions 416, 418, 420, 422. As known to those of ordinary skill in the art, IBE and RIE use beams of charged ions (comprising one or more of Argon, Krypton, Xenon, etc.) (reactive charged ions in the case or ME) to etch through the multiple layered regions to form etched-regions 416, 418, 420, 422. As known to those of ordinary skill in the art, in some cases, forming the etched-regions may include multiple steps (e.g., photolithography, deposition of a photoresist layer or mask, etc.) that are not described herein. During RIE or IBE, the impact of ions ablate portions of regions (e.g., layer blocks 404, 406, 408, and dielectric layers 410, 412, 414) to form etched-regions 416, 418, 420, 422. During this process, some of the ablated material may redeposit on the sidewalls of etched-regions 416, 418, 420, 422. In some cases, this redeposited layer may affect the electrical and/or magnetic performance of the eventually formed magnetoresistive device (e.g., by forming a conductive path between the various conductive regions in MTJ bits and/or the electrodes). Therefore, in some embodiments, during or after the etching process, any redeposited material may be cleaned or otherwise removed from the sidewalls of etched-regions 416, 418, 420, 422 by using processes, such as, for example, angled etch, isotropic etch, etc. In some embodiments, this cleaning step may be eliminated or performed on only select portions of sidewalls of etched-regions 416, 418, 420, 422. Moreover, in some embodiments, the formation of etched-regions 416, 418, 420, 422 may include multiple alternating etching and cleaning steps to form a complete via and expose substrate 402.

Figure 5D:
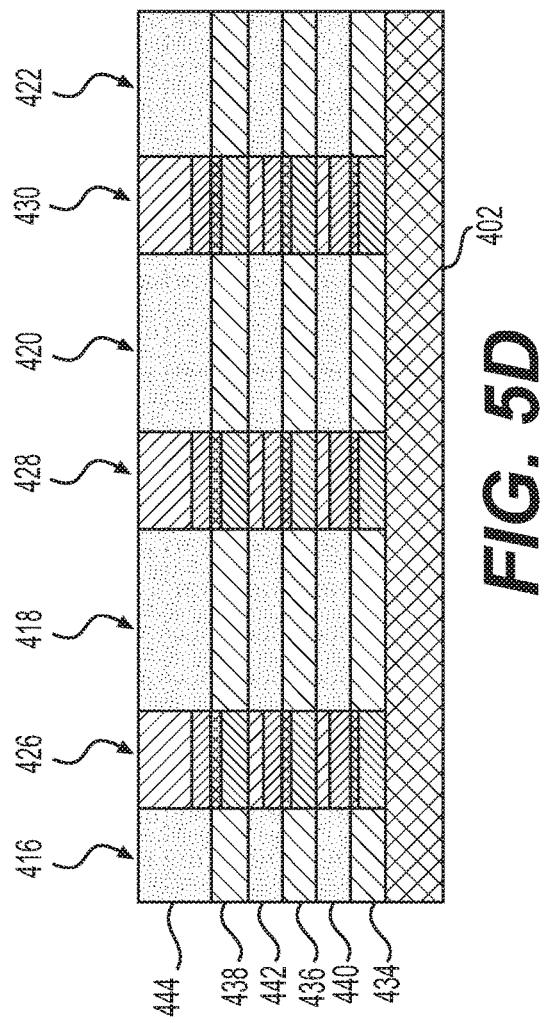

According to step 356, materials, e.g., dielectric materials, may be deposited in the etched-regions 416, 418, 420, 422 to electrically isolate the separated stacks of MTJ bits from one another. FIG. 5D depicts that dielectric materials may be deposited in a configuration comprising a first dielectric material in layers 434, 436, 438 alternating with a second dielectric material in layers 440, 442, 444. Layers 434, 436, 438 may differ from layers 440, 442, 444 in that they may have differing etch properties or etch rates. However, this configuration is only exemplary. In further embodiments, as described with reference to FIGS. 18A-18C, a single dielectric material may be deposited in etched-regions 416, 418, 420, 422.

The dielectric materials may be deposited by any means known in the art, such as, for example, PVD, CVD (e.g., ALD, etc.), plating, or any of the means described with respect to step 452, or any now-known or future-developed means. In some embodiments, a chemical mechanical polishing step (CMP) may be performed after filling the vias to planarize the top surface of the structure and produce a level surface for subsequent processing (e.g., deposition of additional layers, etc.).

Layers 434, 436, 438, 440, 442, 444 may be made from any now-known or future-developed electrically insulating material (oxide, nitride, carbonitride, etc.). In some embodiments, the electrically insulating material may include one or more of silicon nitride (e.g., $Si_3N_4$, SiN, etc.), silicon oxide (e.g., $SiO_2$, $SiO_x$, etc.), a low-kILD material (e.g., carbon doped SiO$_2$(SiOC), carbon doped oxide (CDO), organo silicate glass (OSG), spin-on organics, etc.), aluminum oxide (such as Al$_2$O$_3$), magnesium oxide (such as MgO), tetraethoxysilane (TEOS), and/or one or more combinations thereof. Alternating dielectric materials with different etch rates or etch properties may assist in the performance of further processing steps, such as etching conductive vias to varying depths, as described with respect to step 358 and FIGS. 5E-5H below.

Figure 5E:
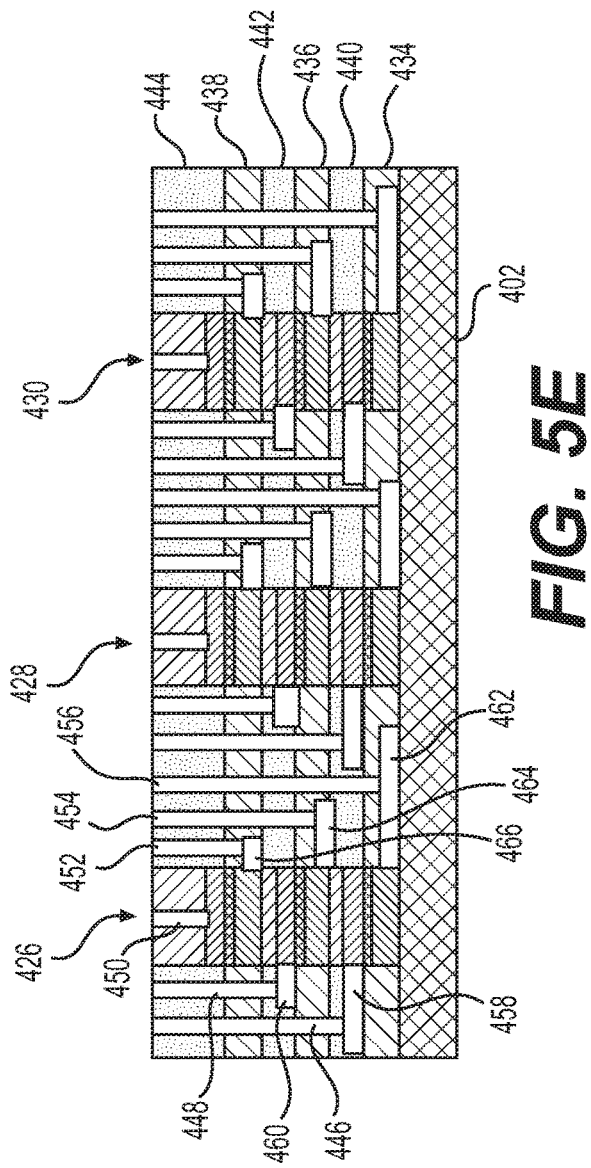

According to step 358, vias and undercut vias may be etched to contact electrodes on both sides of each MTJ bit in each stack. FIG. 5E depicts a single via/undercut via etched to create a conduit to an electrode on each side of each MTJ bit in each stack. For example, via 450 may be etched to contact the topmost electrode of the top MTJ bit in stack 426. Via 452 and undercut via 466 may be etched to contact the bottom electrode of the top MTJ bit in stack 426. Vias 446, 448, 452, 454, 456 and undercut vias 458, 460, 462, 464, 466 may likewise be etched to contact the top and bottom electrodes of the remaining MTJ bits in stack 426.

Figure 5G:
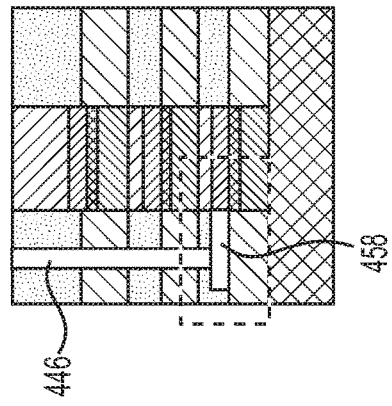
Figure 5F:
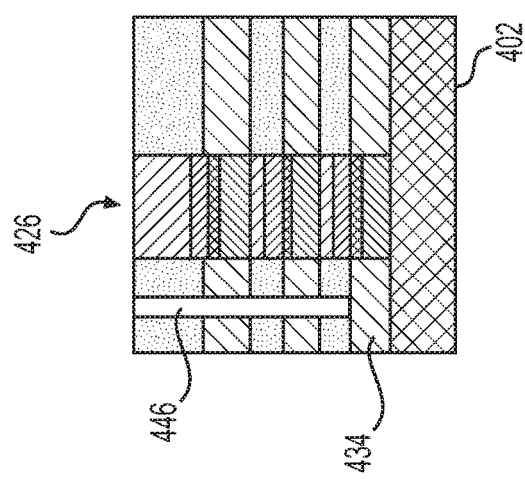

Vias and undercut vias may be formed by any suitable known or future-developed etching process, such as those described with respect to step 354. In some embodiments, vertical vias (e.g., vias 446, 448, 450, 452, 454, 456) may be formed in one etching step, and undercut vias 458, 460, 462, 464, 466 may be formed in another, separate etching step. In some embodiments, each vertical via may be etched through alternating dielectric and etch stop layers to stop at a particular etch stop layer. For example, as shown in FIG. 5F, via 446 may be etched through the alternating dielectric and etch stop layers to stop at layer 434. Although not a requirement, in some embodiments, an anisotropic (or a directional etching process) may be used to form vertical vias. For example, the parameters of the etching process (e.g., pressure, bias power, etching gas, etc.) may be controlled to create an anisotropic etch which preferentially removes material in the downward direction.

Figure 5H:
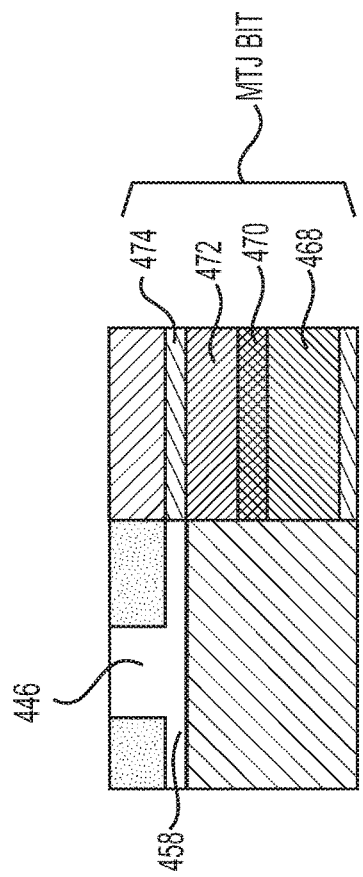

In some embodiments, each undercut via may be formed to contact a vertical via to an electrode of an MTJ bit. With reference to FIGS. 5G and 5H, for example, an isotropic via etch (referred to herein as IVIA or IVIA etch) may be performed to form an undercut via (e.g., via 458) that makes contact with the top electrode of the MTJ bit. The thickness of the dielectric material between the MTJ stacks, and the nature and properties of the IVIA etch, may be optimized to allow the IVIA etch to stop at (or make contact with) the top electrode. It will be recognized that by manipulating the thickness of the dielectric material between the MTJ stacks (e.g., the thickness of layer 434), each undercut via (e.g., via 458 may be configured to contact a particular electrode of an MTJ bit. In some embodiments, the etching process used to form undercut via 458 may be the same as the process used to form via 446, with its parameters modified to make it more isotropic (e.g., etching in all directions as opposed to an anisotropic, or directional, etch). An undercut via (e.g., via 458) may therefore extend somewhat away from an MTJ bit, as well as towards an MTJ bit.

Figure 5I:
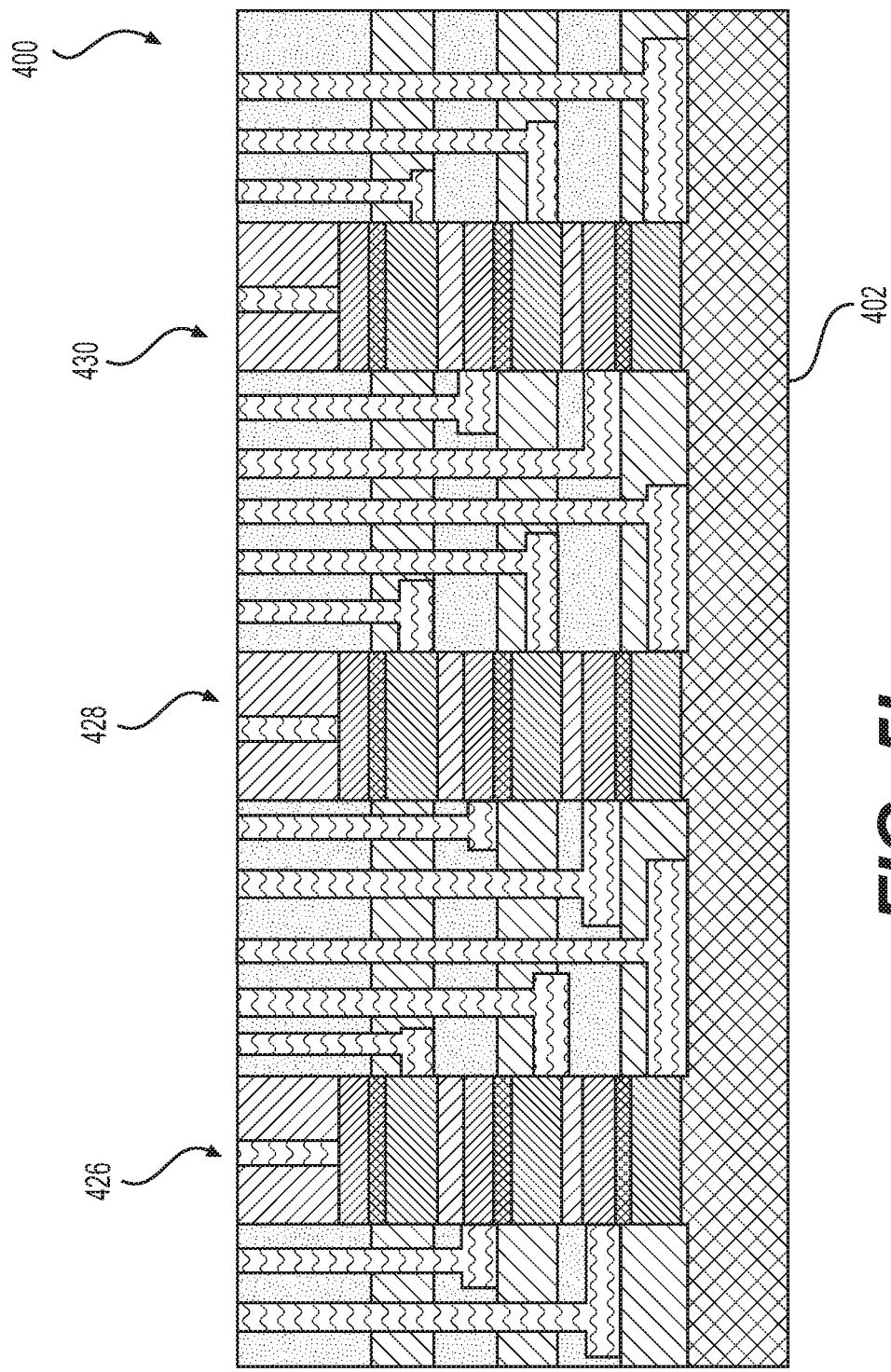

According to step 360, the conductive vias may be filled with one or more conductive materials, as depicted in, e.g., FIG. 5I. In some embodiments, one or more of copper (Cu), tantalum (Ta), tantalum nitride (TaN), aluminum (Al), titanium (Ti), tungsten (W), etc. may be used as conductive materials. In some embodiments, the conductive vias may all include the same material or material set. For example, each of the conductive vias may be filled with one or more of Cu, Ta, TaN, Al, Ti, etc. Optionally, the conductive vias and undercut vias in a single device may all be filled simultaneously with conductive materials. Following the formation and filling of conductive vias, back end of the line (BEOL) processing, (e.g., to form interconnect structures above the MTJ bits) may be carried out to form an MTJ device from the vertically stacked MTJ bits.

Figure 5J:
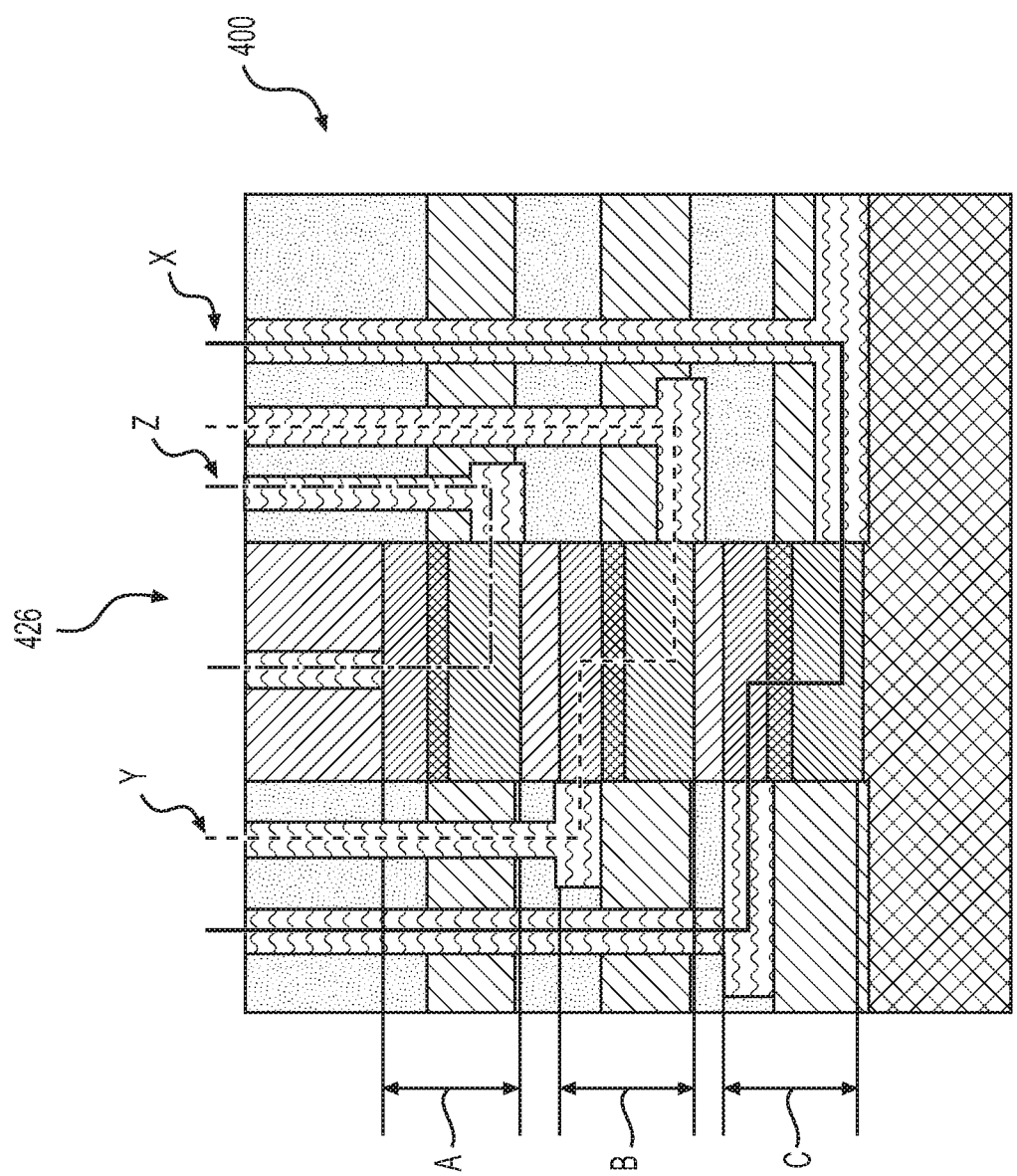

FIG. 5J depicts exemplary current pathways X, Y, Z, by which each MTJ bit of the multiple vertically-stacked MTJ bits in, e.g., stack 426 may be accessed independently. As would be recognized in the art, these pathways and the configuration shown in FIGS. 5A-5J may be particularly suited to spin-transfer torque or spin torque devices. For example, MTJ bit C may be accessed by passing a signal (current, etc.) through path X. MTJ bit B may be accessed by passing a signal through path Y, and MTJ bit A may be accessed by passing a signal through path Z. In some embodiments, passing a current through path X may change the magnetization direction of the free region of MTJ bit C. Similarly, passing a current through paths Y and X may change the magnetization direction of the free regions of MTJ bits B and A, respectively. In some embodiments, a signal through the above-described paths may be used to sense the magnetization direction or the free regions (or the resistance of the respective MTJ bit). In some embodiments, one or both ends of the paths (X, Y, Z) may be connected to transistor(s) at the top and/or the bottom (i.e., within the IC device)

The materials and methods described and depicted in FIGS. 3, 4, and 5A-5J and in the foregoing description may be applicable, with some variation, to the other embodiments described herein and vice versa. For example, deposition techniques, etching techniques, conductive materials, dielectric materials, materials suitable for fixed regions, and/or materials suitable for free regions described in FIGS. 3, 4, and 5A-5J and in the foregoing description may be applicable to the other embodiments described herein.

FIG. 6 is a cross-sectional schematic illustration of a further embodiment of a magnetoresistive device 500 according to aspects of the present disclosure. Device 500 may have a configuration similar to, e.g., devices 300 and 400, and may be formed by, e.g., method 450 or a similar method. In contrast to devices 300 and 400, device 500 may include a stack in which a via 504 connected to a first region (e.g., a fixed or free region) of a top MTJ bit 508 is disposed on one lateral side of MTJ bit 508 and includes both a vertical via and an undercut via, instead of being solely a vertical via disposed vertically "above" MTJ bit 508 (e.g., such as via 450 connecting to stack 426, depicted in FIG. 5E, or via 320 connecting to MTJ bit 308, depicted in FIG. 3). MTJ bit 508 may be accessed by, e.g., path Z, to either read a magnetization direction of a free region of MTJ bit 508, or to change the magnetization direction of the free region.

FIG. 7 is a cross-sectional schematic illustration of a further embodiment of a magnetoresistive device 550 according to aspects of the present disclosure. Device 550 may also have a configuration similar to, e.g., devices 300, 400, and 500, and may be formed by, e.g., method 450 or a similar method. Device 550 may include a stack formed over, and in electrical contact with, an interconnect 518 in a substrate 502. Interconnect 518 may include, e.g., a metal line, pad, via, and/or the like. In such an embodiment, interconnect 518 may replace a separate via/undercut via to the bottom electrode of an MTJ bit (e.g., MTJ bit C) in a magnetoresistive stack. MTJ bit C may be accessed by, e.g., path X, which may travel through via 514 and undercut via 516, through MTJ bit C, and through interconnect 518.

Device 550 may be manufactured by, e.g., forming and etching magnetoresistive stacks over interconnects in a substrate 502.

FIG. 8 is a cross-sectional schematic illustration of another exemplary magnetoresistive device 600 according to aspects of the present disclosure. In the embodiment of FIG. 8, similar to magnetoresistive device 300 described with reference to FIGS. 3 and 6, magnetoresistive device 600 includes two sets of vertically stacked MTJ bits, stack 604 and stack 606, on the surface of a substrate 602. Stack 604 includes MTJ bits 608, 610, 612 and stack 606 includes MTJ bits 614, 616, 618. However, unlike magnetoresistive device 300 of FIG. 3, the MTJ bits within each stack 604, 606 are not isolated from each other by a dielectric material (e.g., dielectric material 332, 334 of FIG. 3. Instead, the MTJ bits are in contact with each other. For example, the bottom electrode of MTJ bit 610 may be formed on (or contact) the top electrode of MTJ bit 612 and the bottom electrode of MTJ bit 608 may be formed on the top electrode of MTJ bit 610. The structure shown in FIG. 8 may be repeated in the in-plane and out-of-plane directions to form an array of such vertically aligned MTJ bits on the surface of substrate 602. It should be noted that one or both of the top and bottom electrodes of a contacting pair of MTJ bits may be eliminated in some embodiments. In some embodiments, a pair of contacting MTJ bits may share an electrode. For example, a top electrode of one MTJ bit of a pair of contacting MTJ bits may also serve as the bottom electrode of the other MTJ bit of the contacting pair.

In magnetoresistive device 600, a single via/undercut via 622 makes contact with both the top electrode of MTJ bit 612 and the bottom electrode of MTJ bit 610, and a single via/undercut via 624 makes contact with both the top electrode of MTJ bit 610 and the bottom electrode of MTJ bit 608. Similarly, via/undercut via 630 makes contact with both the top electrode of MTJ bit 618 and the bottom electrode of MTJ bit 616, and via/undercut via 632 makes contact with both the top electrode of MTJ bit 616 and the bottom electrode of MTJ bit 614. The top electrode of MTJ bits 608 and 614 are contacted by vias 626 and 634, and the bottom electrodes of MTJ bits 612 and 618 are contacted by vias/undercut vias 628. The via/undercut via pairs may be formed by any of the methods described previously or other methods known in the art.

Magnetoresistive device 600 of FIG. 8 may be fabricated using a method similar to method 350 of FIG. 4. An exemplary method of fabrication of device 600 will be briefly described below. FIGS. 9A-9F are cross-sectional schematic illustrations of a magnetoresistive device 700, similar to magnetoresistive device 600 of FIG. 8, at different steps of its fabrication process. Since the steps in the fabrication process described below are similar to the steps described with reference to FIGS. 3 and 5A-5I, for the sake of brevity, they are not described in extensive detail below.

Figure 9A:
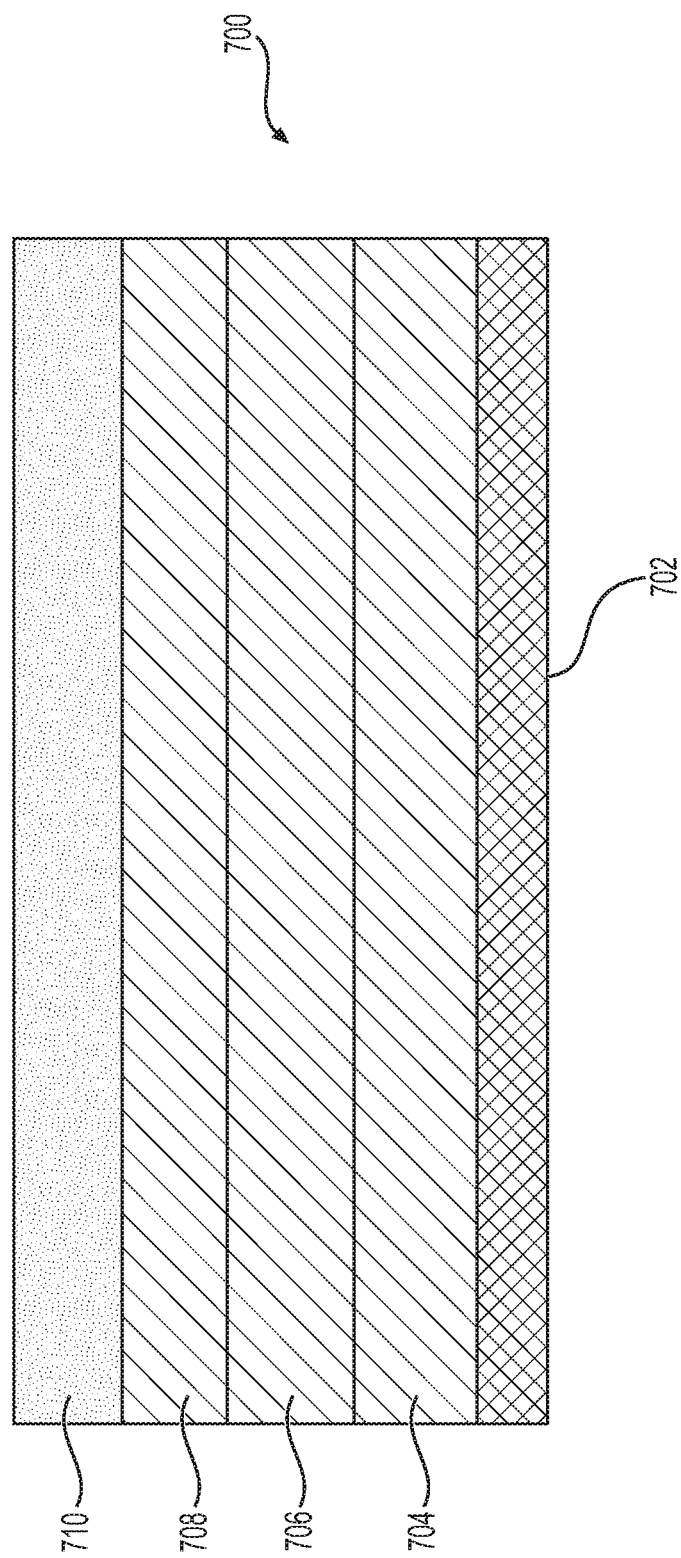
Figure 9B:
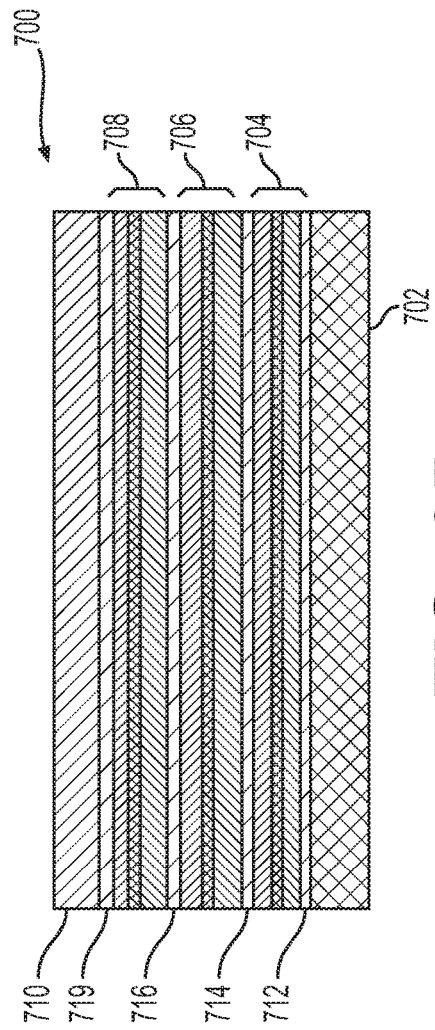

As illustrated in FIG. 9A, layers of materials that form layer blocks 704, 706, 708 (layers of material that eventually form stacked MTJ bits) are deposited (e.g., as a blanket) over an IC substrate 702. A dielectric material may also be deposited to form a dielectric layer 710 over the stacked layer blocks. Substrate 702 may be any substrate similar to substrate 302 of device 300 (e.g., an IC). Each of layer blocks 704, 706, 708 may include any multiple layers that together form an MTJ bit. For example, each of layer blocks 704, 706, 708 may include layers of material that forms a fixed region, an intermediate region, and a free region (in any order) of an MTJ bit. FIG. 9B depicts an exemplary configuration of layers that form layer blocks 704, 706, 708. Each layer block includes a fixed layer, an intermediate layer, and a free layer with an electrically conductive electrode on opposite sides. For example, layer block 704 includes electrode layers 712, 714 on opposite sides, layer block 706 includes electrode layers 714, 716 on opposite sides, and layer block 708 includes electrode layers 716, 718 on opposite sides. Although three layer blocks 704, 706, 708 used to form three stacked MTJ bits are depicted, this is only exemplary. It is contemplated that additional or fewer layer blocks may be deposited on substrate 702. Any suitable currently-known or future-developed method may be used to form the different regions of the stacked MTJ bits.

Figure 9C:
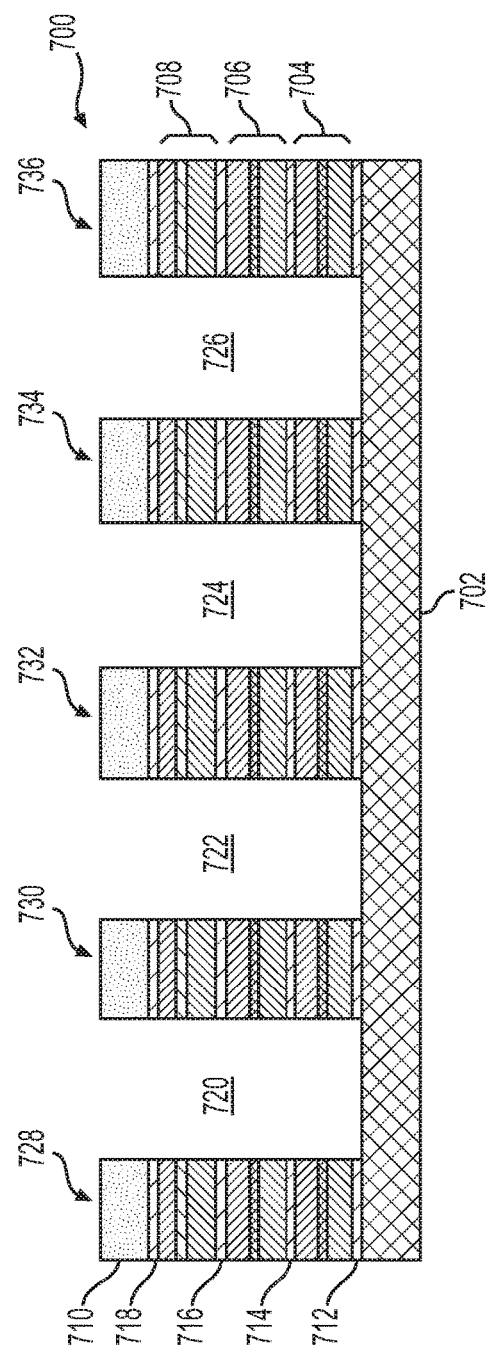
Figure 9D:
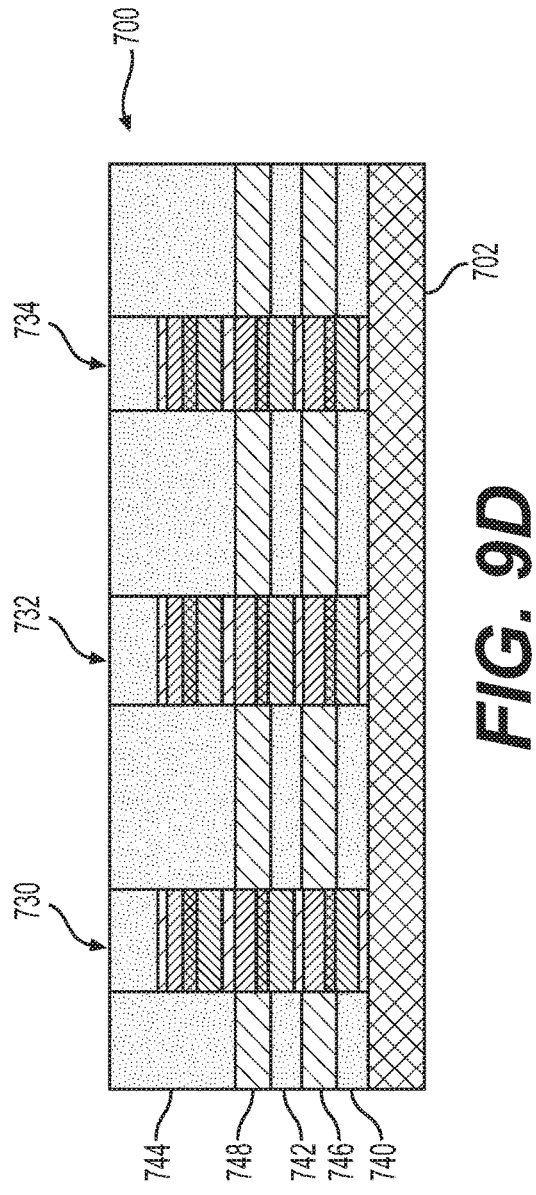

As illustrated in FIG. 9C, different stacks 728, 730, 732, 734, 736, etc. of MTJ bits may now be separated by etching. As described with reference to FIG. 5C, etched-regions 720, 722, 724, 726 may be etched through (in one or more etching steps) the layers of layer blocks 704, 706, 708 to expose substrate 702 and form separate stacks 728, 730, 732, 734, 736 of MTJ bits. Any suitable etching process (ME, IBE, etc.) may be used for forming the etched-regions 720, 722, 724, 726. As illustrated in FIG. 9D, one or more dielectric materials (e.g., first dielectric material layers 740, 742, 744 alternating with second dielectric material layers 746, 748) may now be deposited in the etched-regions 720, 722, 724, 726 (as described with reference to FIG. 5D). The dielectric material layers may be deposited by any means known in the art, such as, for example, PVD, CVD, etc. The dielectric material layers may electrically isolate the stacks 728, 730, 732, 734, 736 (only stacks 730, 732, and 734 shown in FIG. 9D). As described with reference to FIG. 5D, the first and second dielectric material layers may have differing etch properties or etch rates. In some embodiments, a single dielectric material layer (e.g., see FIG. 18C) or a different number of alternating dielectric layers (e.g., see FIG. 18B) may be deposited in etched-regions 720, 722, 724, 726. In some embodiments, a chemical mechanical polishing step (CMP) may be performed after deposition of the dielectric material layers to planarize the top surface of the structure and produce a level surface for subsequent processing (e.g., deposition of additional layers, etc.). First dielectric material layers 740, 742, 744 and second dielectric material layers 746, 748 may include any now-known or future-developed electrically insulating material (oxide, nitride, carbonitride, etc.). In some embodiments, the electrically insulating material may include one or more of silicon nitride (e.g., $Si_3N_4$, SiN, etc.), silicon oxide (e.g., $SiO_2$, $SiO_x$, etc.), a low-k ILD material (e.g., carbon doped $SiO_2$ (SiOC), carbon doped oxide (CDO), organo silicate glass (OSG), spin-on organics, etc.), aluminum oxide (such as $Al_2O_3$), magnesium oxide (such as MgO), tetraethoxysilane (TEOS), and/or one or more combinations thereof.

Figure 9E:
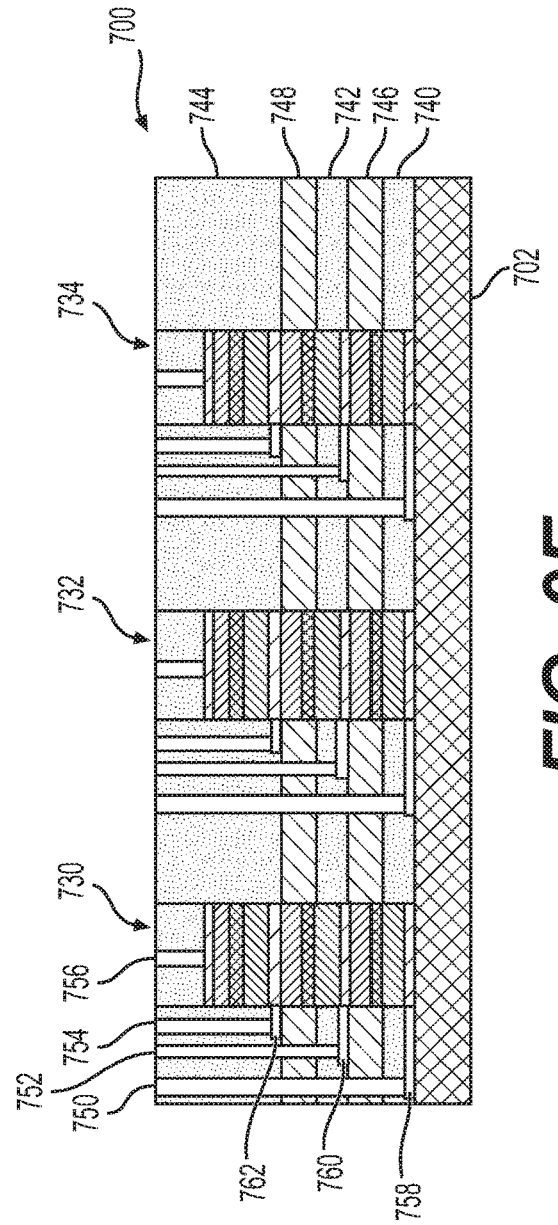
Figure 9F:
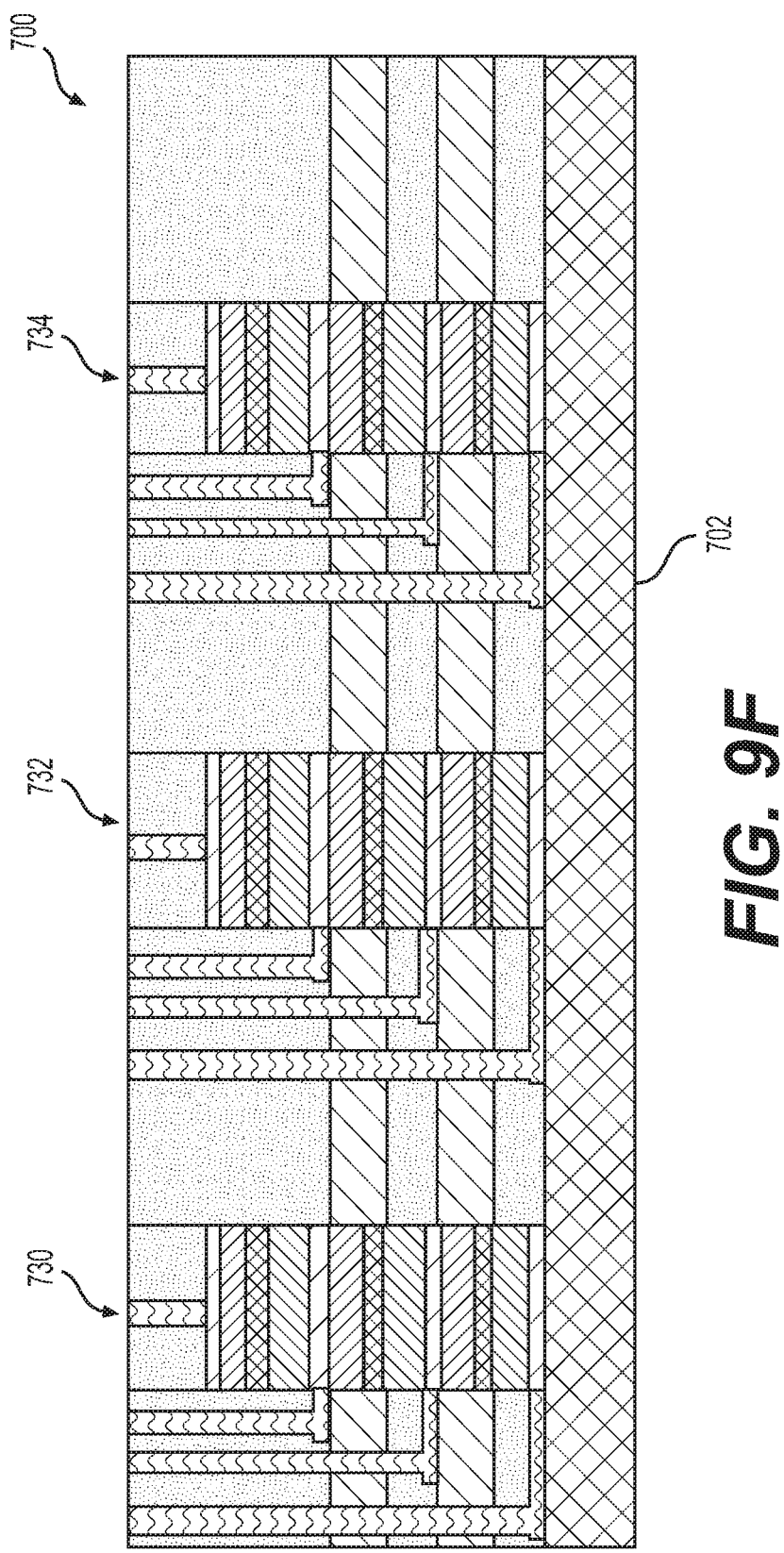

As illustrated in FIG. 9E, vias and undercut vias may be etched through the alternating dielectric material layers deposited between the stacks 730, 732, and 734 to contact electrodes on opposite sides of each MTJ bit in stacks 730, 732, 734. Since the exemplary methods of etching vias and undercut vias were previously described (e.g., with reference to step 358 of method 350 (of FIG. 4) and FIG. 5E), they are not described again. As illustrated in FIG. 9E, via 756 may be etched to contact the top electrode of the top MTJ bit in stack 730. Via 754 and undercut via 762 may be etched to contact the bottom electrode of the top MTJ bit and the top electrode of the middle MTJ bit in stack 730. Vias 752 and undercut via may likewise be used to contact the top electrode of the bottom MTJ bit and the bottom electrode of the middle MTJ bit of stack 730. And, via 750 and undercut via 758 may be used to contact the bottom electrode of the bottom MTJ bit of stack 730. Vias and undercut vias may be similarly etched through the first and second dielectric material layers to contact the electrodes of the stacked MTJ bits of stacks 732 and 734. As illustrated in FIG. 9F, the etched vias and undercut vias may be filled with one or more conductive materials (e.g., one or more of copper (Cu), tantalum (Ta), tantalum nitride (TaN), aluminum (Al), titanium (Ti), tungsten (W), etc.). Following the formation and filling of conductive vias, back end of the line (BEOL) processing, (e.g., to form interconnect structures above the MTJ bits) may be carried out to form magnetoresistive device 700 from the vertically stacked MTJ bits.

Figure 9G:
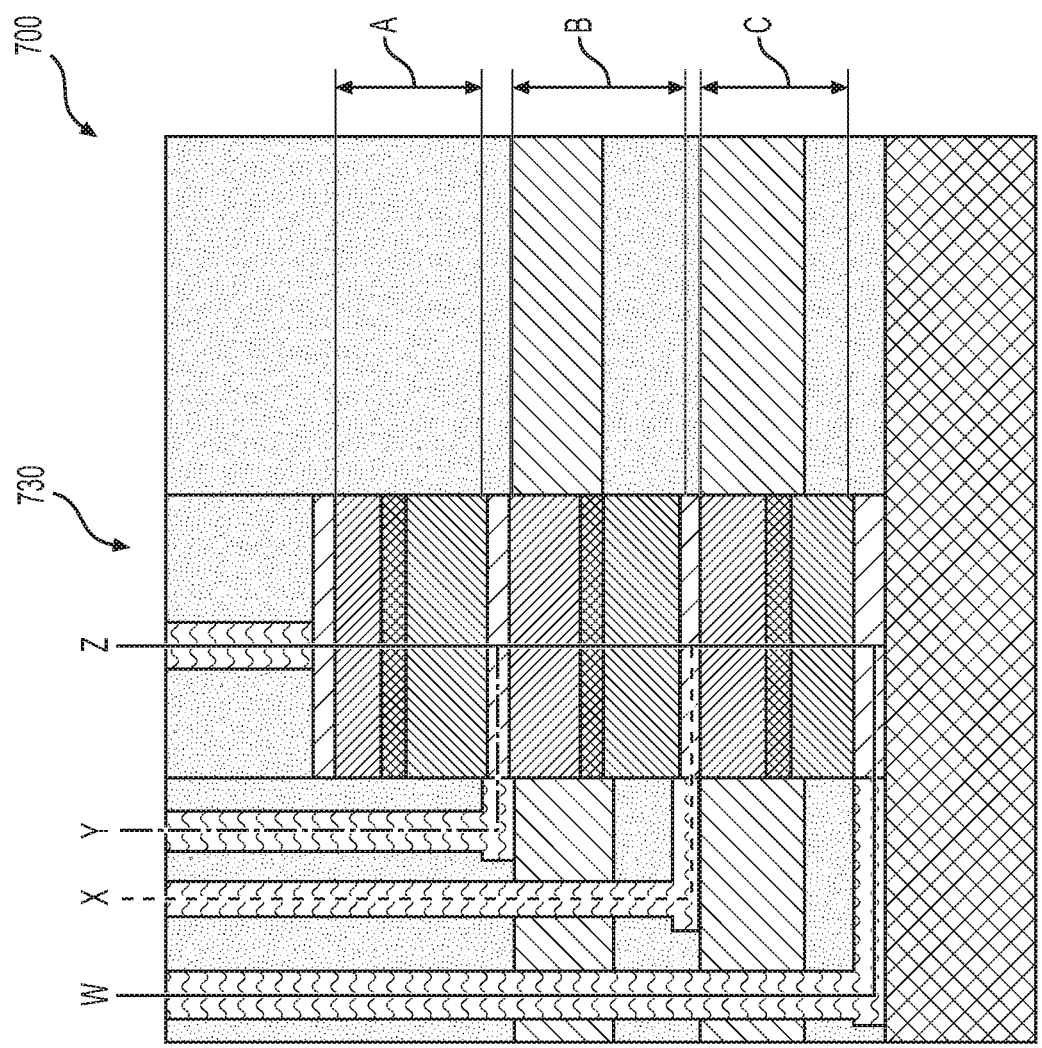

In magnetoresistive device 700, each MTJ bit (of the multiple vertically stacked MTJ bits) of a stack 730, 732, 734 may be accessed individually or in series with other the MTJ bits of the stack. FIG. 9G is an illustration that shows an exemplary method of accessing (e.g., reading and/or writing) the vertically stacked MTJ bits (marked A, B, C) of stack 730 individually or in series with other MTJ bits of the same stack. With reference to FIG. 9G, MTJ bits A, B, and C may be accessed individually or in series by passing a signal on a path between two points W, X, Y, and Z. For example, a signal through path Y-Z may be used to access MTJ bit A individually, a signal through path X-Z may be used to access MTJ bits A and B in series, etc. One or both ends of each path may be connected to access transistors. Table 1 below indicates exemplary paths through which current may be passed to access the MTJ bits A, B, and C individually or in series. A signal through the listed paths may be used to either read a magnetization direction of a free layer of MTJ bits A, B, and C, or to change the magnetization direction of the free layer. In some embodiments, one or both sides of a path may be connected to a transistor or a suitable select device (e.g., a metal-insulator-metal (MIM) diode).

TABLE 1

Exemplary signal paths to access MTJ bits A, B, and C of FIG. 9G individually or in series.

| MTJ bits | Signal Path |
| --- | --- |
| A | Y-Z |
| B | X-Y |
| C | W-X |
| A + B | X-Z |
| A + C | Y-Z, W-X |
| B + C | W-Y |
| A + B + C | W-Z |

FIG. 10 is a cross-sectional schematic illustration of another embodiment of a magnetoresistive device 800. Device 800 may have a configuration similar to, e.g., devices 300, 400, and 800 and may be formed by a method similar to that described previously. In contrast to device 700 of FIG. 9G, the top electrode of the top MTJ bit A of stack 830 may be formed by a via/undercut via pair 810 formed through the dielectric layers on one side of the stack 830. FIG. 11 is a cross-sectional schematic illustration of another embodiment of a magnetoresistive device 850 according to aspects of the present disclosure. As illustrated in FIG. 11, device 850 may include a stack 860 (comprising stacked MTJ bits A, B, C) formed over, and in electrical contact with, an interconnect 852 in the underlying substrate. As described with reference to FIG. 7, interconnect 852 may include, e.g., a metal line, pad, via, and/or the like in contact with an access transistor and may replace a separate via/undercut via to contact the bottom electrode of an MTJ bit C.

FIG. 12 is a cross-sectional schematic illustration of another embodiment of a magnetoresistive device 870 having a stack 880 with multiple vertically stacked MTJ bits (e.g., MTJ bits A, B, C) formed on an interconnect 872 on the underlying substrate. In device 870, as illustrated in FIG. 12, separate vias (and undercut vias) to contact the electrodes on opposite sides of each MTJ bit A, B, C may be eliminated. Instead, one electrode may contact the top electrode of the top MTJ bit A and interconnect 872 may contact the bottom electrode of the bottom MTJ bit C. In device 870, a signal (e.g., current) may be run in a path through all the MTJ bits A, B, and C in stack 880. In some such embodiments, each MTJ bit in the stack may require a different threshold signal (e.g., critical current Ic) magnitude to change the magnetization direction of its free layer. For example, MTJ bits A, B, and C may have different critical currents Ic, and the magnitude of a signal through the MTJ stack 880 may be selected in order to change the magnetization direction of the free layer of selected MTJ bits in stack 880 (e.g., MTJ bit A and/or MTJ bit B and/or MTJ bit C). The critical current required to change the magnetization direction of the free layer for each of MTJ bit A, B, and C may be changed in any manner. For example, the critical currents of different MTJ bits may be changed by varying the material and/or the thickness of the free layers or regions of the MTJ bits A, B, C and/or by varying the material and/or thickness of the intermediate layers of the MTJ bits A, B, C, etc.

Figure 13A:
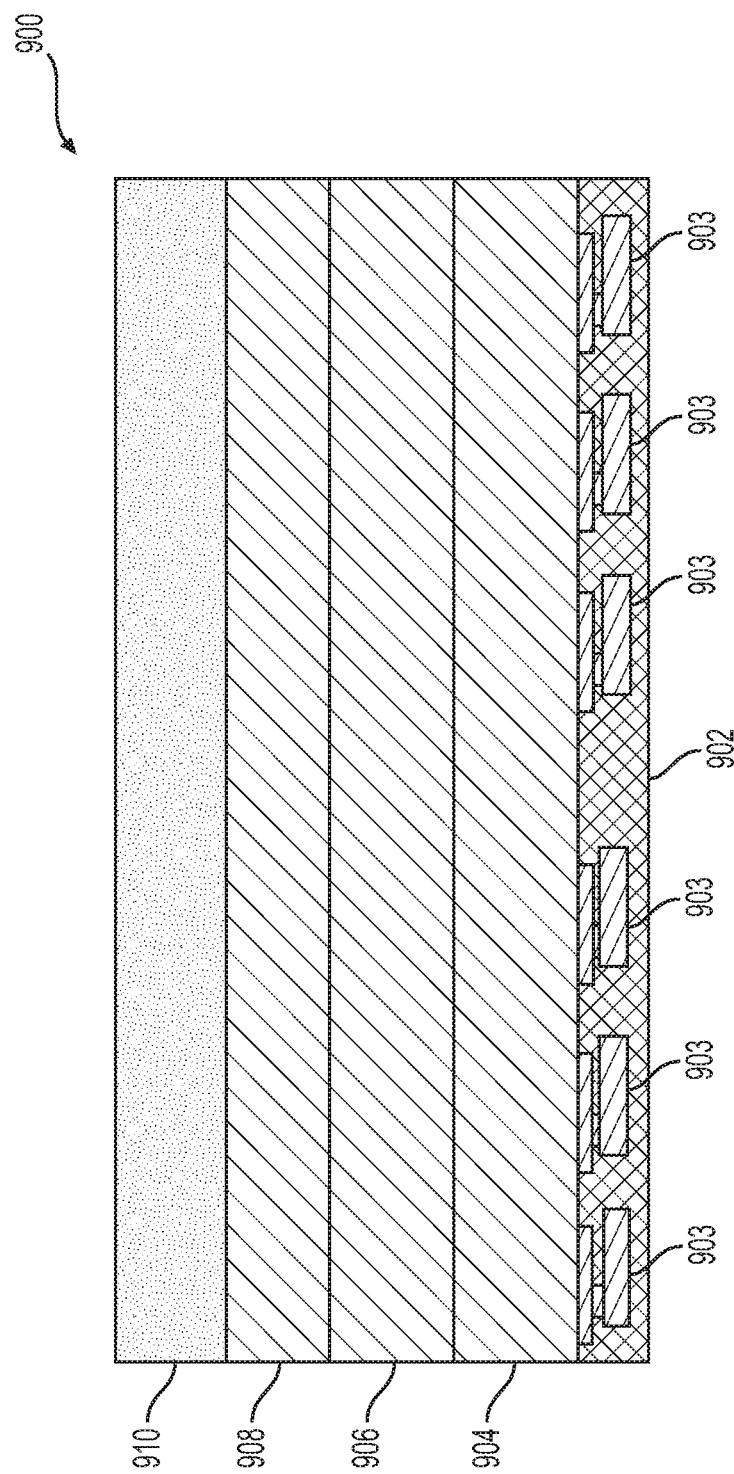
Figure 13B:
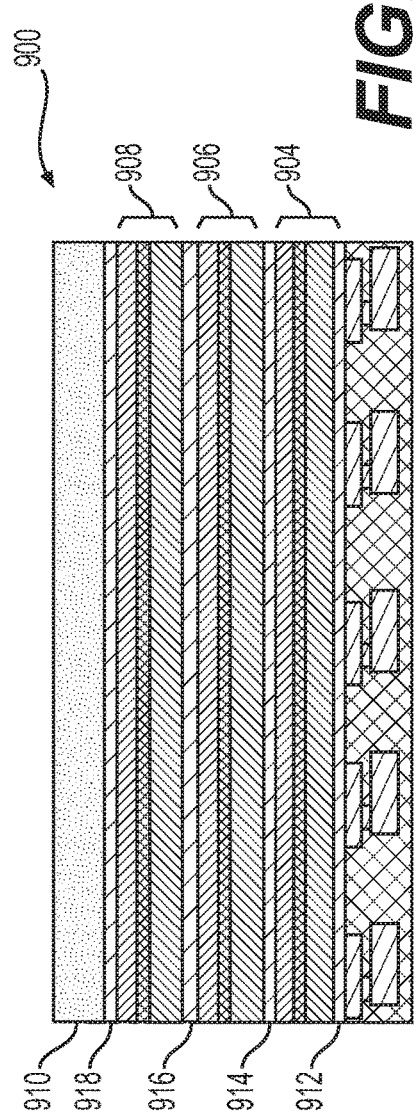

FIGS. 13A-13F are cross-sectional schematic illustrations of a magnetoresistive device 900, similar to magnetoresistive device 870 of FIG. 12, at different steps of its fabrication process. Any of the steps, methods, and materials described with respect to the various embodiments discussed previously may be applied in fabricating device 900 (and vice versa). With reference to FIG. 13A, the vertically stacked MTJ bits may first be formed on the IC device. That is, the different regions/layers 904, 906, 908 that comprise the stacked MTJ bits are first deposited on (e.g., as a blanket layer) on the surface of the IC device substrate 902. Substrate 902 may include interconnects 903 for contacting bottom electrodes on the stacked MTJ bits. Any number of MTJ bits may be stacked vertically. As shown in FIG. 13B, the MTJ bits may be formed by depositing (e.g., sequentially) the multiple layers that form each MTJ bit one on top of another, and depositing a dielectric layer 910 atop the MTJ bit layers. As explained previously, these MTJ bits can have any structure/configuration (e.g., a configuration described with reference to FIGS. 2A-2D or another suitable configuration). In some embodiments, the multi-layer stacks that form MTJ bits may include top and/or bottom electrodes 912, 914, 916, 918 such that an electrode is disposed on the top and bottom of each MTJ bit. In some embodiments, as illustrated in FIG. 13B, MTJ bits may share an electrode with adjacent MTJ bits (e.g., a top electrode of one MTJ bit may serve as a bottom electrode of the adjacent MTJ bit).

Figure 13C:
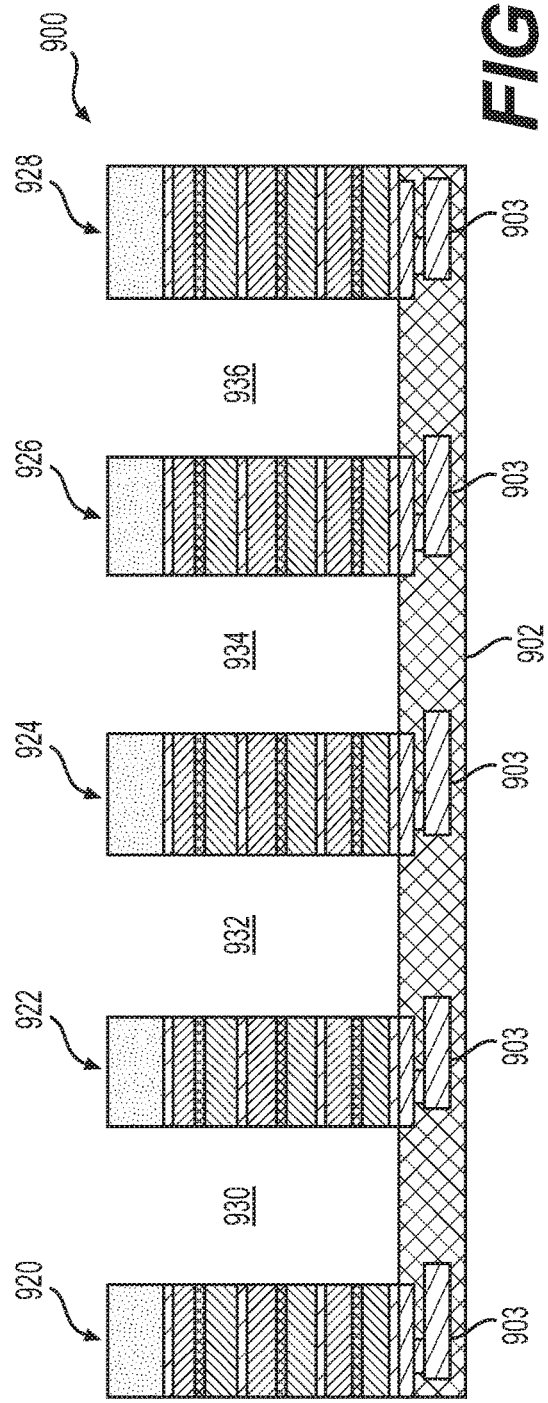
Figure 13F:
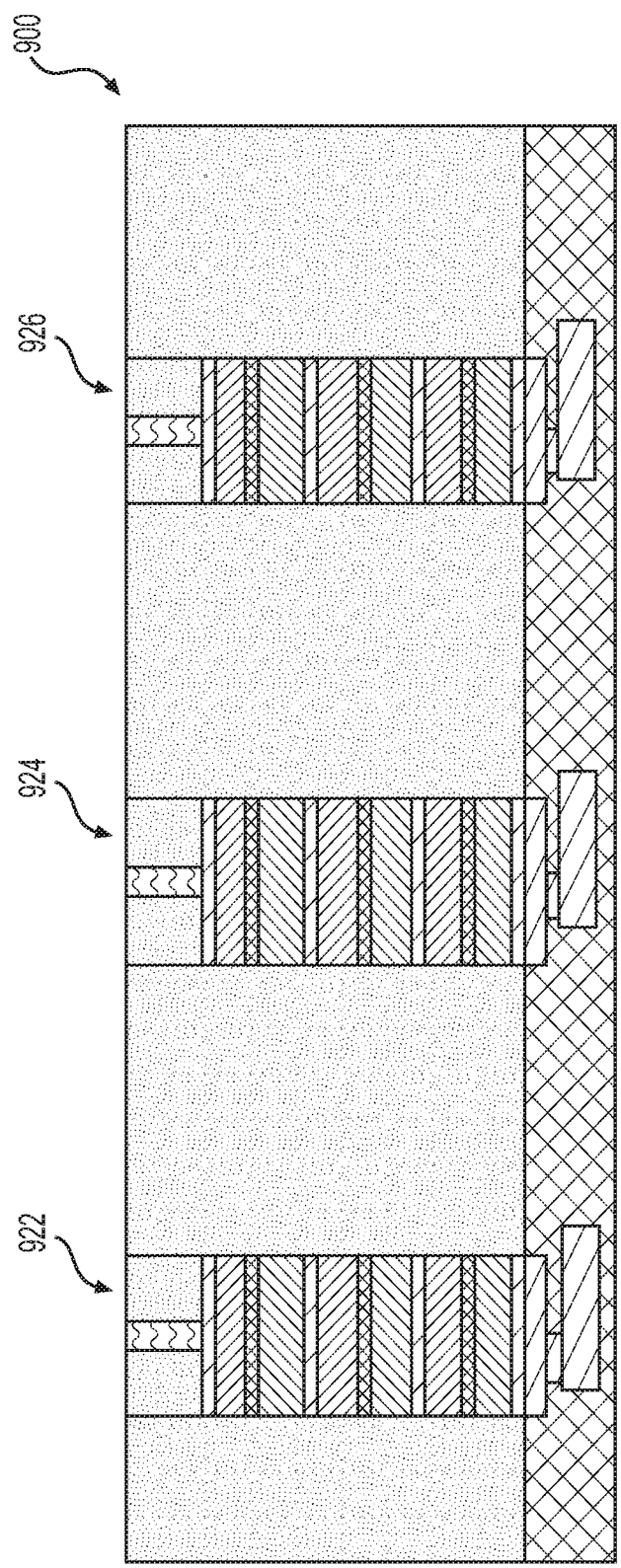

With reference to FIG. 13C, as discussed previously with reference to FIG. 9C, the layers that form the vertically stacked MTJ bits are then etched (by forming etched-regions 930, 932, 934, 936) to form a 3D array of vertically stacked MTJ bits 920, 922, 924, 926, 928. Similar to the previously-described embodiments, each stack may include multiple (2, 3, 4, 5, 6, or more) vertically aligned MTJ bits. In some embodiments, as illustrated in FIG. 13C, three MTJ bits may be stacked. In some embodiments, a different number of MTJ bits (e.g., 5 MTJ bits) may be stacked. The pitch between the MTJ bits may be any value and may be the same or different in the in-plane and out-of-plane directions. As illustrated in FIG. 13D, a dielectric material layer 930 (or multiple dielectric material layers as illustrated in FIG. 9D, FIG. 18A or 18B) may then be deposited in the etched-regions between MTJ bit stacks 922, 924, 936. Any known or future developed dielectric material (e.g., low K dielectric, ultra low K dielectric, SiO2, silicon nitride, silicon carbonitride, etc.) may be used to form dielectric material layer 930. In some embodiments, CMP may be performed after the deposition to planarize the top surface and get the surface ready for subsequent processing. As illustrated in FIGS. 13E and 13F, vias 932, 934, 936 may then be etched through the dielectric material layer 930 on the top of each stack 922, 924, 926, and the formed vias filled with an electrically conductive material (e.g., copper) to contact the top electrode of the top most MTJ bit of the stack.

In the previously described embodiments, the layers that comprise the vertically stacked MTJ bits are first deposited on a substrate, etched-regions are then formed (to separate different MTJ stacks), and alternating layers of an etch stop and a dielectric (or a single dielectric material) is deposited in the etched-regions. However, in some embodiments, as illustrated in FIGS. 14A-14C and 15, stacked layers of an etch stop 1004, 1006, 1008 and dielectric material(s) 1010, 1012, 1014 (or only a dielectric material) may first be deposited on the IC substrate 1002, an array of cavities 1016, 1018 etched through these stacked layers, and the layers that comprise the vertically stacked MTJ bits 1020, 1022 may then be deposited in these cavities. Vias may then be etched through the etch stop and/or dielectric materials as previously described to contact the electrodes of the vertically stacked MTJ bits.

In some embodiments, the previously described magnetoresistive devices may be used as spin transfer torque (or STT) magnetoresistive devices. In some embodiments, magnetoresistive devices of the current disclosure may also be used as a spin orbit torque (or SOT) magnetoresistive devices. FIG. 15 illustrates an exemplary magnetoresistive device 1100 that may be used as an SOT magnetoresistive device. Similar to the previously described embodiments, device 1100 may include a multiple stacks 1104, 1106 of vertically aligned MTJ bits (e.g., MTJ bits 1108, 1100, 1112 form stack 1104 and MTJ bits 1114, 1116, 1118 form stack 1106). In some embodiments, as illustrated in FIG. 15, the MTJ bits of each stack 1104, 1106 may be separated by a dielectric material layer. The MTJ bits 1108, 1100, 1112, 1114, 1116, 1118 may have any configuration (e.g., a configuration described with reference to FIGS. 2A-2D or another suitable configuration) and are formed such that the MTJ bits of each stack 1104, 1106 contact a heavy-metal via 1103 on one side. For example, as illustrated in FIG. 15, the MTJ bits 1108, 1110, 1112 of stack 1104 contact one side of the heavy-metal via 1103 and the MTJ bits 1114, 1116, 1118 of stack 1106 contact another side (e.g., the opposite side) of the heavy-metal via 1103.

Multiple heavy-metal vias 1103 with stacks 1104, 1106 of MTJ bits contacting these vias 1103 may form a spaced-apart array on substrate 1102. That is, the structure of FIG. 15 may be repeated in the in-plane and out-of-plane directions on substrate 1102. The pitch between these structures may be any value. Similar to the embodiments described previously, the space between the multiple heavy-metal vias 1103 with contacting stacks of MTJ bits may be filled with alternating layers of different dielectric materials (e.g., dielectric materials 1138, 1140, 1142 and etch stop materials 1132, 1134, 1136). In some embodiments, as described with reference to FIGS. 13D and 18C, this space may be filled with a single dielectric material. These dielectric materials may include the same materials discussed with reference to the previously-described magnetoresistive devices. The heavy-metal vias 1103 may be formed on (or contact) a metal interconnect 1105 of substrate 1102. In some embodiments, the metal interconnect 1105 may be connected to an access transistor (or another suitable device) formed on substrate 1102. Conductive vias 1120, 1122, 1124, 1126, 1128, 1130 may be formed through the dielectric materials to contact the stacked MTJ bits of each stack 1104, 1006. As will be described in more detail later, each MTJ bit of device 1110 may be accessed using the conductive via contacting the MTJ bit and the heavy-metal via 1103. For example, with reference to FIG. 15, MTJ bit 1112 may be accessed using conductive via 1128 and heavy-metal via 1103, MTJ bit 1108 may be accessed using conductive via 1122 and heavy-metal via 1103, etc.

Figure 16E:
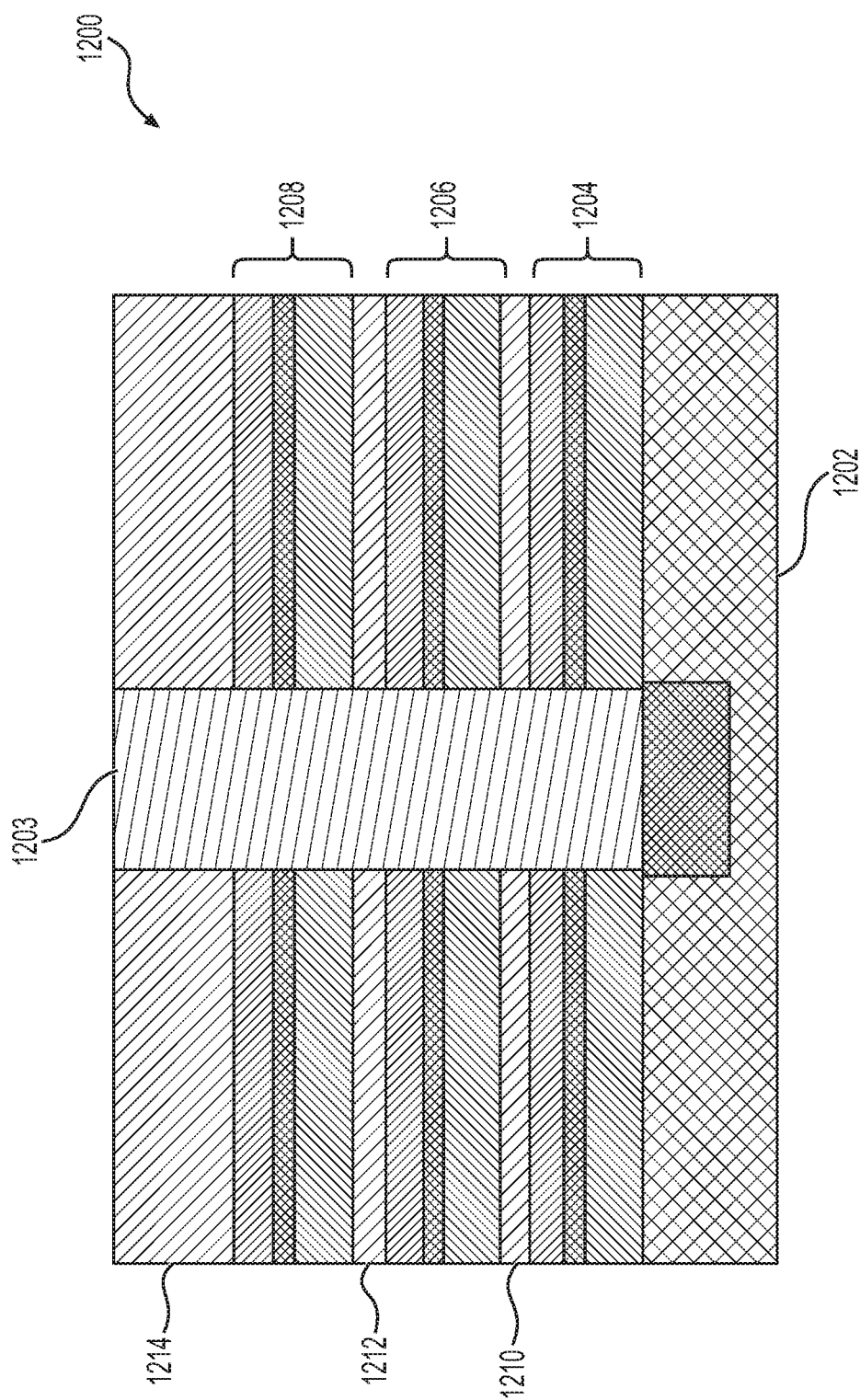

FIGS. 16A-16L are cross-sectional schematic illustrations of a magnetoresistive device 1200, similar to magnetoresistive device 1100 of FIG. 15, at different steps of its fabrication process. Any of the steps, methods, and materials described with respect to the various embodiments discussed previously may be applied in fabricating device 1200 (and vice versa). With reference to FIG. 16A, a dielectric material 1201 (e.g., an oxide, etc.) is deposited on an IC device substrate 1202 that previously underwent processing to form transistors (or other CMOS circuits, etc.) therein, and interconnects 1205 that provide electrical access to these transistors (or other CMOS circuits). Dielectric material 1201 is deposited on IC device substrate 1202 at any stage of processing. With reference to FIGS. 16B and 16C, an array of cavities 1205 (only one shown) are etched through the dielectric material 1201 and filled with a conductive metal to form heavy-metal vias 1203. In some embodiments, a heavy metal (e.g., tungsten (W), tantalum (Ta), titanium (Ti), etc.) may be used to fill the cavities 1205 and form the heavy-metal vias 1203. In some embodiments, a chemical mechanical polishing step (CMP) may be performed after filling the cavities to planarize the top surface of the structure. As illustrated in FIG. 16C, in some embodiments, the heavy-metal vias 1203 may be formed such that they land on a metallization 1205 (bond pad, metal layer M1, metal layer M2, etc.) of the substrate 1202 to access a transistor. In some embodiments, the heavy-metal vias 1203 may be used to conduct read and/or write current. With reference to FIG. 16D, the previously deposited dielectric material 1201 is then removed from around the heavy-metal vias 1203 (e.g., etched) to form an array of free-standing heavy-metal vias 1203 (e.g., depicted as columns of conductors or conductive material).

With reference to FIG. 16E, multiple vertically stacked MTJ bits (MTJ bits 1204, 1206, 1208, etc.), separated by dielectric material layers 1201, 1212, 1214 (which may all be formed by the same dielectric material or may be formed by different dielectric materials) are then formed on the exposed surface of the IC substrate 1202 around the heavy-metal vias 1203. As discussed previously, any electrically insulating material (e.g., oxide, nitride, carbonitride, etc.) may be used as the dielectric materials 1201, 1212, 1214, and any number of MTJ bits may be stacked vertically. As discussed previously, the MTJ bits 1204, 1206, 1208 may be formed by depositing (e.g., sequentially) the multiple regions or layers that form each MTJ bit one on top of another. With reference to FIGS. 16F and 16G, the layers that form the vertically stacked MTJ bits 1204, 1206, 1208 are then etched to form a 3D array of MTJ structures separated from each other by etched-regions 1216. Each MTJ structure may include two stacks or columns of three (or any number of) vertically aligned MTJ bits 1204, 1206, 1208 connected to a heavy-metal via 1203 positioned in between. A similar structure may extend in the out-of-plane direction as illustrated in FIG. 16G. The pitch between the MTJ structures may be any value and may be the same or different in the in-plane (see FIG. 16F) and out-of-plane (see FIG. 16G) directions. In general, the pitch may be sufficient to form interconnects to the multiple stacked MTJ bits (described below).

Figure 16H:
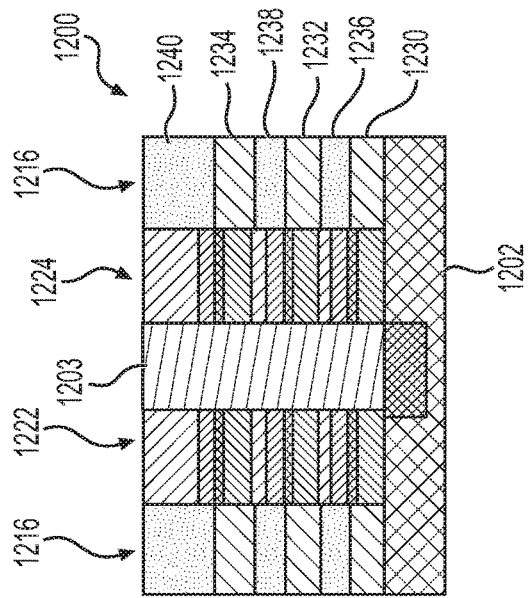

One or more layers of dielectric materials are then deposited in the etched-regions 1216 between the MTJ structures. In some embodiments, as illustrated in FIG. 16H, multiple alternating layers of first dielectric materials 1236, 1238, 1240 and second dielectric materials 1230, 1232, 1234 (e.g., a dielectric material that has a different etch rate that the first dielectric material, referred to as an etch-stop material) are deposited on the etched-regions 1216 between the MTJ structures. Although not a requirement, in some embodiments, first dielectric materials 1236, 1238, 1240 may all be the same material, and second dielectric materials 1230, 1232, 1234 may all be the same material. Although FIG. 16H illustrates an alternating structure comprising two dielectric materials in the etched-regions, as previously described this is only exemplary, and each etched-region may also be filled with a single dielectric material or a different number of dielectric materials. Any known or future developed dielectric material (e.g., low K dielectric, ultra low K dielectric, SiO2, etc.) and etch stop material (e.g., silicon nitride, silicon carbonitride, etc.) may be used as first and second dielectric materials. Although not described, other known IC fabrication operations (e.g., CMP, etc.) may also be performed during and/or after the formation of alternating dielectric and etch stop layers. Any thickness of the etch stop and dielectric material may be deposited. In general, the thickness of these layers may be such that vias contacting the top electrode of each vertically stacked MTJ bit may be formed through the alternating dielectric and etch stop layers (as described previously with reference to magnetoresistive device 400 of FIGS. 5A-5I). In some embodiments, the thickness of the deposited dielectric layers may be optimized to allow the via etches described below to stop (and/or make contact) at depths corresponding to the top electrode of each vertically stacked MTJ bit. Similarly, the thickness of the etch stop layers also may be designed to allow the described via etches to stop at depths corresponding to the top electrode of each vertically stacked MTJ bit.

Figure 16I:
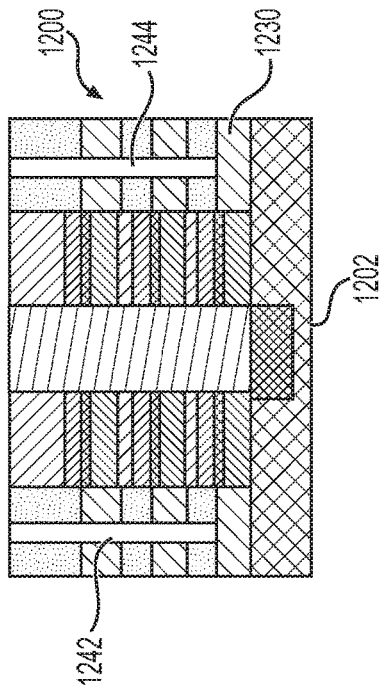
Figure 16J:
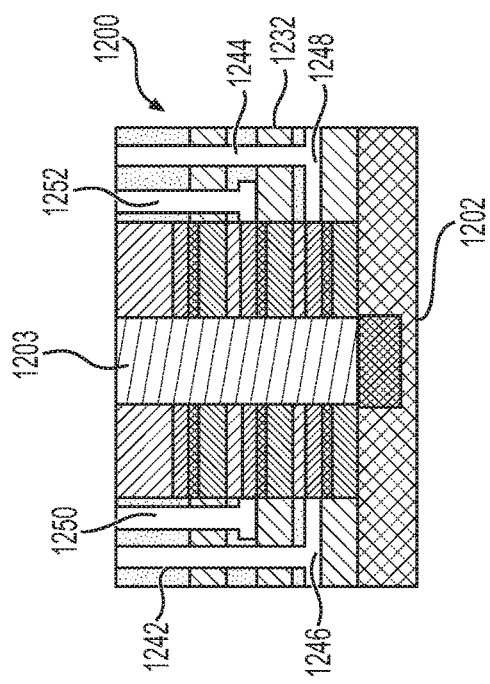
Figure 16K:
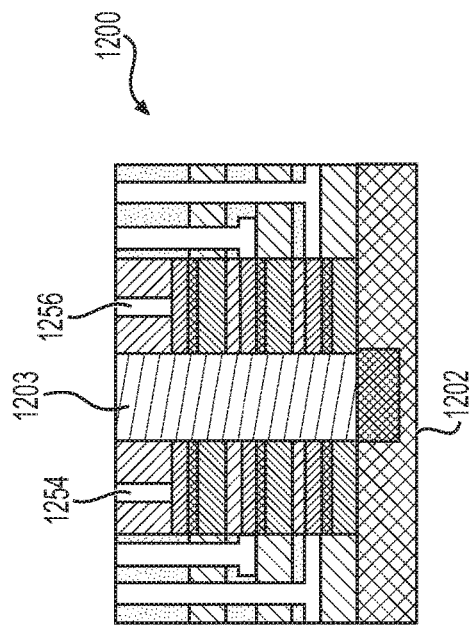
Figure 16M:
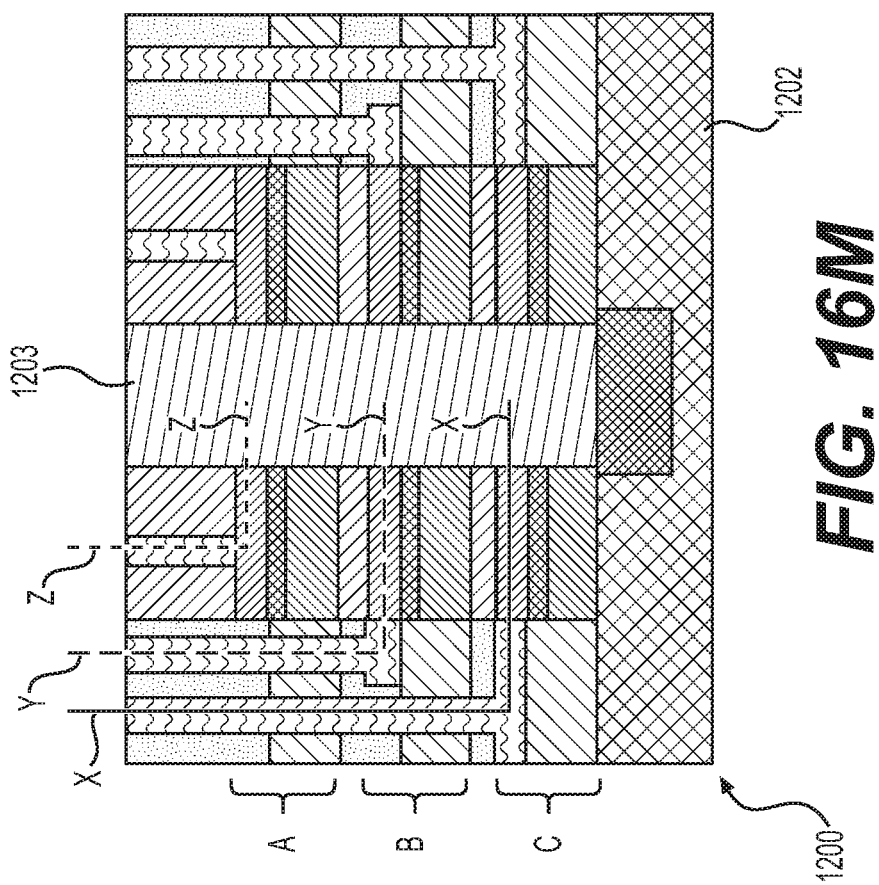
Figure 16L:
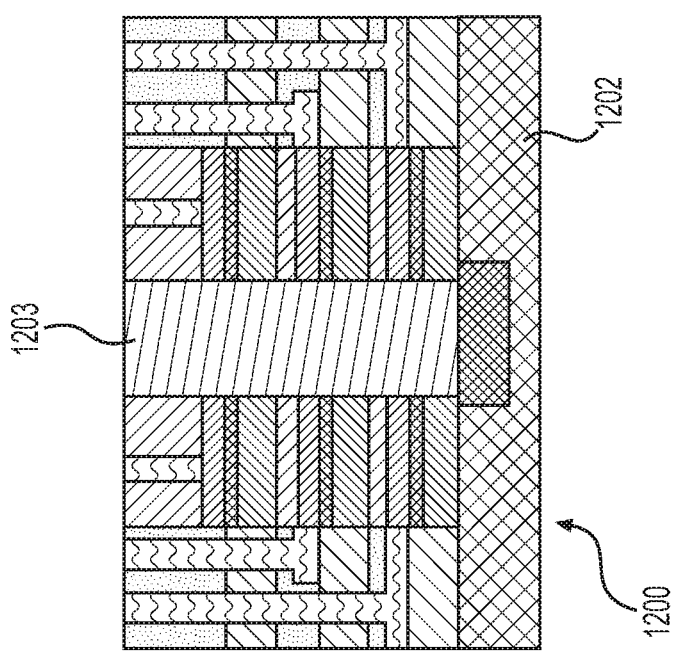

With reference to FIGS. 16I-16K, vias are then etched through the alternating dielectric and etch stop layers. In one embodiment, as illustrated in FIG. 16I (described in more detail with reference to 5F), first vias 1242, 1244 are etched through the alternating dielectric and etch stop layers to stop at etch-stop layer 1230. The depth of the first vias 1242, 1244 may correspond to the top electrode of the bottom MTJ bits (MTJ bits 1204 of FIG. 16F) of stacks 1222, 1224. Although not a requirement, as described previously, in some embodiments, an anisotropic etch may be used to form the first vias 1242, 1244. With reference to FIG. 16J, an isotropic via etch may then be performed to form undercut vias 1246, 1248 and make contact with the top electrode of the bottom MTJ bits. The thickness of the dielectric layer between the MTJ stacks may be optimized to allow the isotropic via etch to stop at (or make contact with) the top electrode. Similar vias 1250, 1252 and undercut vias may be formed to make contact with the top electrodes of all vertically stacked MTJ bits. In some embodiments, as illustrated in FIG. 16K, vias 1254, 1256 may be etched through the dielectric deposited atop the top-most MTJ bits (e.g., MTJ bits 1208 of FIG. 16F) to make contact with their top electrodes. As described previously, the vias and undercut vias may be formed in one etching step or in multiple etching steps. With reference to FIG. 16L, an electrical conductor (e.g., copper, etc.) may then be deposited in the vias and undercut vias to make form conductive vias that make electrical contact with the top electrodes of all the MTJ bits.

In some embodiments, the heavy-metal via 1203 may be connected to a transistor at the top and/or the bottom (i.e., within the IC substrate 1202). Each MTJ bit may be individually accessed using the conductive via that contacts the top electrode of each MTJ bit and the heavy-metal via 1203. For example, with reference to FIG. 16M, MTJ bit A may be accessed by passing a signal (current, etc.) through path Z-Z, MTJ bit B may be accessed by passing a signal through path Y-Y, and MTJ bit C may be accessed by passing a signal through path X-X. As described previously, a current through path X-X may change the magnetization direction of the free layer of MTJ bit C (or sense the magnetization direction of the free layer), a current through paths Y-Y may change the magnetization direction of the free layer of MTJ bit B (or sense the magnetization direction of the free layer), and a current through path Z-Z may change the magnetization direction of the free layer of MTJ bit A (or sense the magnetization direction of the free layer).

Figure 17A:
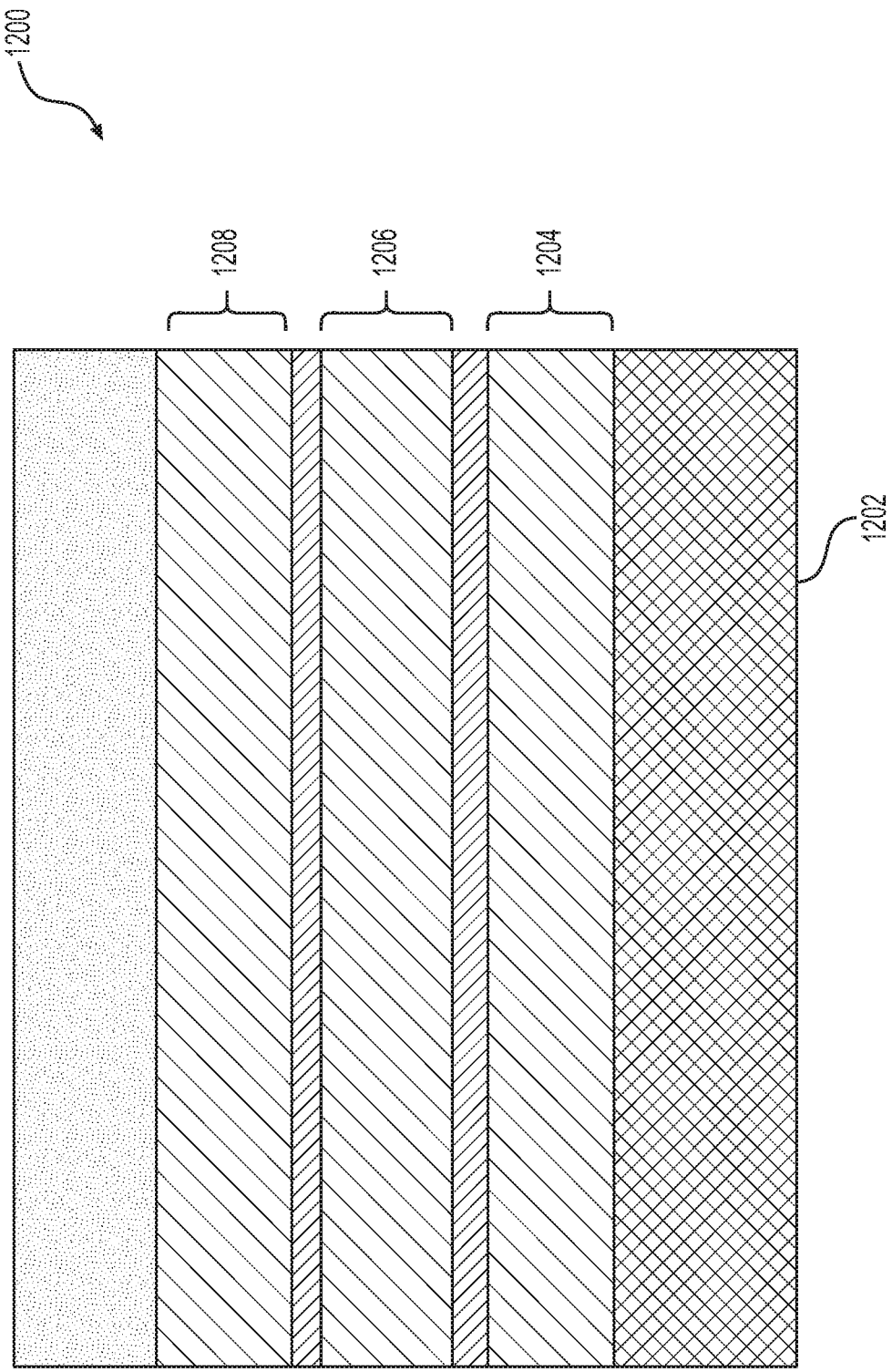
Figure 17C:
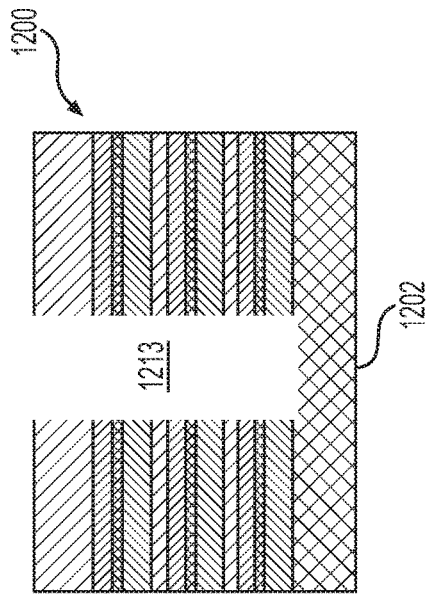
Figure 17E:
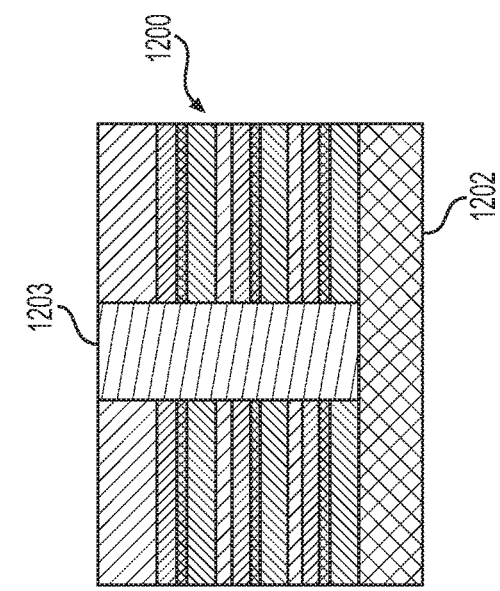
Figure 17B:
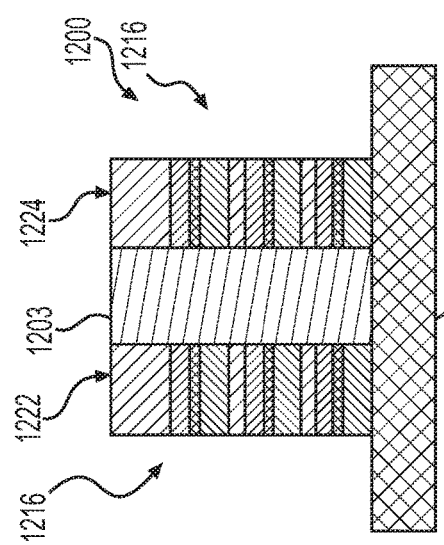
Figure 17D:
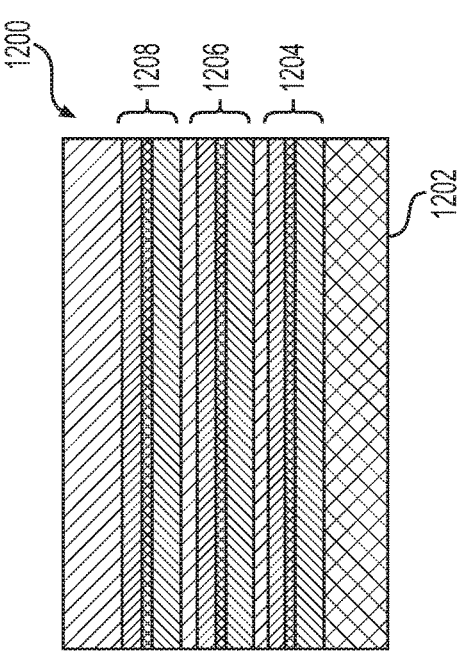

In the fabrication process of magnetoresistive device 1200 described above with reference to FIGS. 16A-16L, the heavy-metal vias 1203 are first formed (see FIGS. 16A-16D), and the layers that form the vertically stacked MTJ bits (see FIG. 16E) are then sequentially deposited around the heavy-metal vias 1203. In some embodiments, as described below with reference to FIGS. 17A-17E, the multiple layers that form the vertically stacked MTJ bits 1204, 1206, 1208 (separated by dielectric material layers) may first be formed (e.g., deposited as blanket layers) on the IC substrate 1202, an array of cavities 1213 (one shown in FIG. 17C) may then be etched through the stacked MTJ layers, and the heavy metal (e.g., W, Ta, Ti, etc.) that forms the heavy-metal via 1203 may then be deposited in these cavities 1213. As described with reference to FIGS. 16F and 16G, the multiple layers of the vertically stacked MTJ bits may then be etched to form a 3D array of MTJ structures separated from each other by etched-regions 1216 as illustrated in FIG. 17E. One or more dielectric material layers may be deposited in the etched-regions 1216 and conductive vias formed through these dielectric material layers to make electrical contact with the top electrodes of the stacked MTJ bits (as described with reference to FIGS. 16H-16L). Back end of line (BEOL) processing may then be conducted to connect the MTJ bits to other circuitry and complete device 1200.

With reference to FIG. 18A, it should be noted that depositing alternating etch shop and dielectric layers in the etched-regions 1216 separating different vertically stacked MTJ bits (e.g., as described with reference to FIGS. 5D, 9D, 14A, and 16H) is only exemplary. In general any structure (comprising one or more materials) that enables vias to be etched to different depths to make individual contact with the different vertically stacked MTJ bits in the stack may be used. For instance, in some embodiments, as illustrated in FIG. 18B, a relatively larger number (any number) of stacked etch stop and dielectric layers (e.g., with relatively smaller thicknesses) may be deposited in the etched-regions 1216. In some embodiments, as illustrated in FIG. 18C, a layer of a single dielectric material, may be deposited in the etched-regions 1216. And, the vias may be etched to different depths through these dielectric material layers based on prior characterization (e.g., characterizing the time to etch to different depths, monitoring the chemistry of the etched/ablated materials during etching, etc.).

Figure 20A:
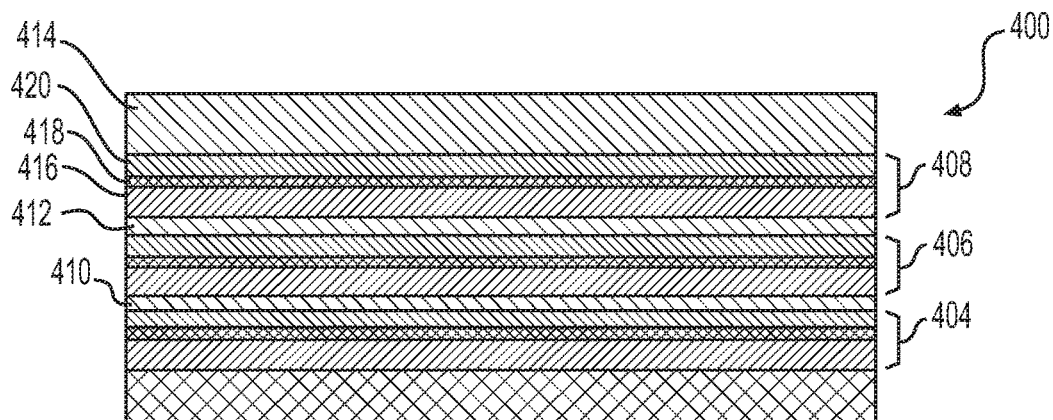
Figure 20B:
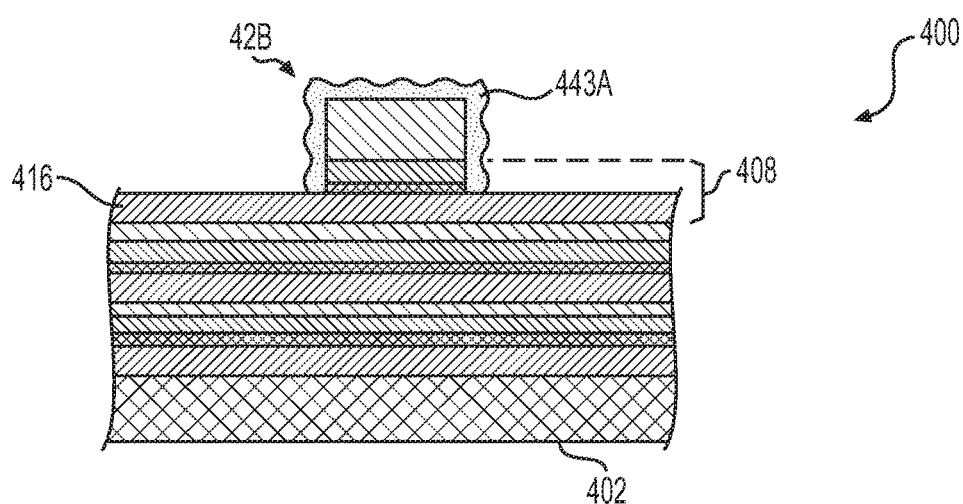
Figure 20C:
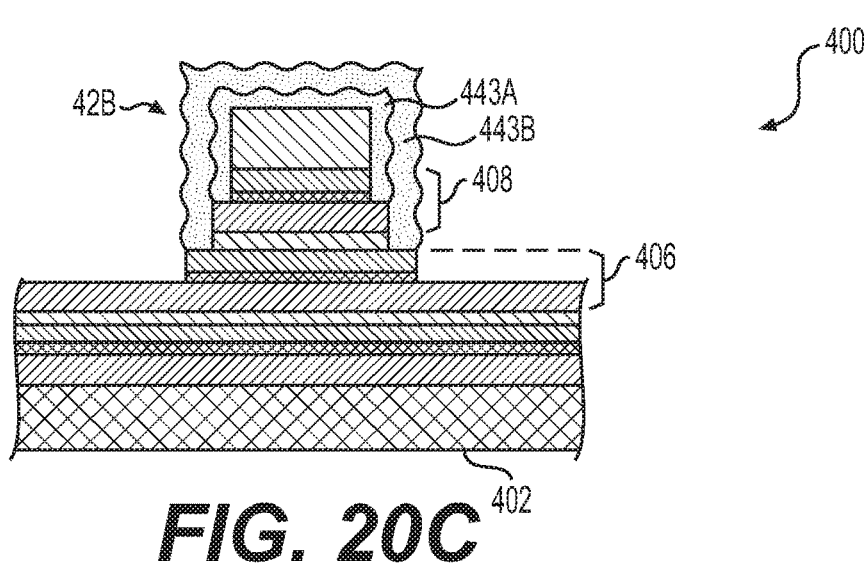
Figure 20D:
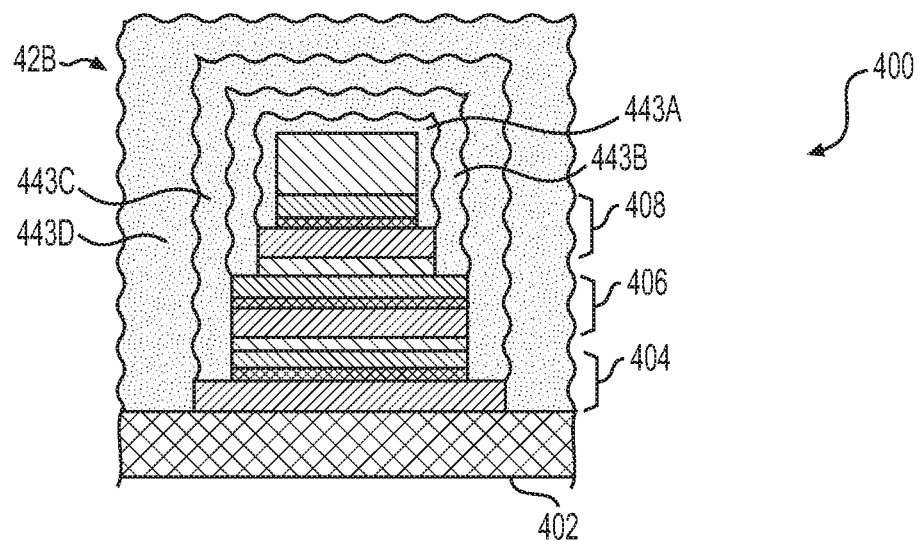
Figure 20E:
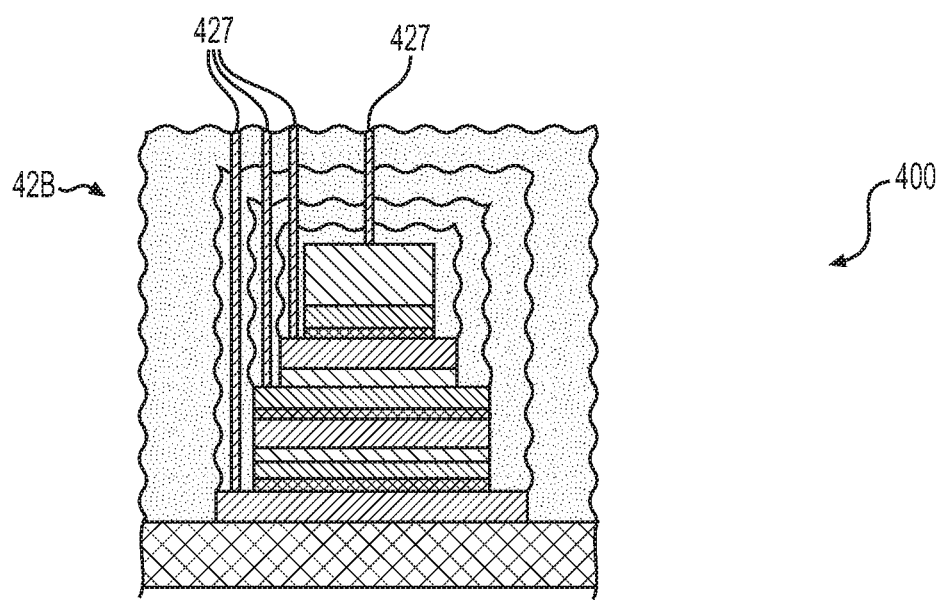

It should be noted that various aspects of the fabrication processes described with reference to the above-described embodiments of magnetoresistive devices are only exemplary. For example, in some embodiments, as described with reference to FIGS. 5B and 9B, after depositing layers of materials that form layer blocks 404, 406, 408 on substrate 402, the separate stacks of MTJ bits may be formed by etching the deposited layers. In some embodiments, the deposited layers that form the layer blocks may be etched in multiple steps. For example, FIG. 20A illustrates multiple layers that form layer blocks 404, 406, 408 deposited on substrate 402 (e.g., fixed layer 416, intermediate layer 418, and free layer 420 of each layer block with an electrode 412 in between two layer blocks). As illustrated in FIG. 20B, in a first etching step some (but not all) of the layers deposited on the substrate may be etched. For example, as illustrated in FIG. 20B, the free layer 420 and the intermediate layer 418 of layer block 408 may be etched (to expose fixed layer 416) and an encapsulating material 443A deposited over the etched region. The encapsulating material 443A may form a conformal coating over the structure. Additional layers of the MTJ bits may then be etched in a second etching step with encapsulating material 443A serving as a spacer. The etched structure may then be covered with encapsulating material. For example, as illustrated in FIG. 20C, in some embodiments, the free layer (or another layer) of layer block 406 may be exposed by the second etching step, and a second encapsulating material 443B (which may be the same material as encapsulating material 443A) deposited over the etched region. In some embodiments, as illustrated in FIG. 20D, a third etching step may then be used to etch additional layers (e.g., to expose any layer of layer block 404) and a third encapsulating material 443C (which may be the same material as encapsulating material 443A and or 443B) deposited over the etched region. As illustrated in FIG. 20E, vias may then be etched through the encapsulating materials and a conducting material deposited in the etched vias to form electrical contacts to the different stacked MTJ bits (as described with reference to FIGS. 5E-5G and 9E-9F). In some embodiments, regions of the structure (e.g., regions that are to be removed by a subsequent etching step) may be masked before depositing encapsulating material after etching. In some embodiments, a polishing step (e.g., CMP) may be used to planarize the surface of the structure after depositing the encapsulant material (e.g., some or all of encapsulating materials 443A, 443B, 443C). It should be noted that the different etching steps may be used to expose any layer of layer blocks 404, 406, 408. That is, although FIGS. 20B-20E illustrate using multiple etching steps to expose specific layers of layer blocks, this is only exemplary. In general, any layer (fixed layer, free layer, intermediate layer, electrode layer between two layer blocks, etc.) may be exposed using the different etching steps.

Using multiple etching steps to create vertically stacked MTJ bits having a staircase-like structure (e.g., see FIG. 20E) may eliminate the need for an undercut via to make contact with an MTJ bit (e.g., compare FIG. 20E to FIGS. 5E and 9F). That is, vertical vias may be used to make electrical contact with all the MTJ bits of the vertically stacked array. It should be noted that the specific pattern of vias illustrated in FIG. 20E is only exemplary. In some embodiments, vias may be arranged such that each MTJ bit of the vertically stacked array may be accessed individually. In some embodiments, vias may be arranged such that each MTJ bit may be accessed individually and in series with other MTJ bits. For example, in embodiments (as illustrated in FIG. 9B) where the multiple vertically stacked MTJ bits have a common electrode in between (i.e., top electrode of the underlying MTJ bit also serves as the bottom electrode of the overlying MTJ bit as described with respect to the embodiment of FIG. 8), a single vertical via may be used to form an electrical contact to the common electrode in between two contacting MTJ bits and thereby access both the underlying an overlying MTJ bits (as described with reference to FIG. 9G).

Any etching process may be used to etch the different layers in the different etching steps. In some embodiments, an etching process (RIE, IBE, etc.) where the etched material is ablated may be used. In some embodiments, the ablated material may redeposit on the sidewalls of the etched region during the etching process. This redeposited material and create electrical shorts and/or cause other magnetic issues and deteriorate performance of the MTJ bits. Etching the layers of the MTJ stack using multiple etching and encapsulating steps may reduce such performance issues. In some embodiments, a cleaning step (e.g., an isotropic etch, angled etch, etc.) may be incorporated between the different etching and encapsulating steps. U.S. patent application Ser. No. 16/107,543, filed Aug. 21, 2018, and U.S. patent application Ser. No. 16/202,496, filed Nov. 28, 2018, describe exemplary multi-step etching process that be used to etch the MTJ layers. These patent applications are incorporated by reference in their entireties herein.

It should be noted that, although a certain order is described or implied in the above-described methods, in general, the steps of the described methods need not be performed in the illustrated and described order. Further, the described methods may be incorporated into a process of fabricating a magnetoresistive device. Since the additional steps needed to form an MTJ device are known to those of ordinary skill in the art, they are not described herein. Additionally, the described methods may be incorporated into a more comprehensive procedure or process having additional functionality not described herein.

Magnetoresistive devices according to the present disclosure may be included on an integrated circuit along with other circuitry. In such cases, it may be desirable to align the process steps and structures associated with the magnetoresistive devices with the process steps and circuit features associated with the surrounding circuitry. In other words, it may be desirable to integrate the manufacture of the magnetoresistive devices into a standard process flow used to manufacture the integrated circuits to minimize the number of additional processing steps and materials needed during production. For example, while some process steps and materials associated with building magnetoresistive devices may be specific to such devices, other process steps and materials used in manufacturing magnetoresistive devices also may be used in manufacturing the surrounding circuitry. As a specific example, conductive layers that are deposited and patterned to form the top and/or bottom electrodes for magnetoresistive devices can also be used to form connective traces and interlayer connections in standard complementary metal oxide semiconductor (CMOS) process flows. Interlayer dielectric used in the portion of the integrated circuit that includes magnetoresistive devices may be the same standard-process-flow interlayer dielectric used in the remainder of the integrated circuit. Such reuse eliminates the need for additional magnetoresistive-device-specific processing and materials.

Devices and methods of the current disclosure may be applicable to forming an integrated circuit comprising a discrete memory device (e.g., as shown in FIG. 19A) or an embedded memory device having a logic portion therein (e.g., as shown in FIG. 19B), each including MRAM, which, in one embodiment is representative of one or more arrays of MRAM having a plurality of magnetoresistive stacks, according to certain aspects of certain embodiments disclosed herein. In some embodiments, MRAM may be replaced with, for example, magnetic sensors, magnetic transducers, etc. The MRAM (or other magnetoresistive device) portion shown in FIGS. 19A and 19B may include one or more magnetoresistive devices such as, for example, magnetic memory devices (MRAMs), magnetic sensors, magnetic transducers, etc. The MRAM (or other magnetoresistive device) portion may include any suitable magnetoresistive device. The logic portion depicted in FIG. 19B may include logic circuits and other circuits typically manufactured using conventional process flows. For example, the logic portion may include logic circuit elements that may be inter-coupled using a plurality of metal layers (often referred to as M1, M2, M3, etc.). The multiple layers of metal may be vertically spaced-apart from each other and separated by a dielectric material (called interlayer dielectric or ILD). In order to provide electrical coupling between these multiple metal layers (and circuit elements), vias may be formed through the ILD that separates adjacent metal layers and electrically conductive material deposited (or otherwise provided) in the vias to provide an electrical path between two metal layers on either side of the ILD. In some aspects, the ILD may surround and insulate the vias and/or interconnect wiring of the memory device.

In one aspect, a magnetoresistive device is disclosed. The disclosed device may include multiple magnetic tunnel junction (MTJ) stacks separated from each other by one or more dielectric material layers. Each MTJ stack may include multiple MTJ bits arranged one on top of another. The device may also include electrically conductive vias extending through the one more dielectric material layers. The electrically conductive vias may be configured to electrically access each MTJ bit of the multiple MTJ stacks.

Various embodiments of the disclosed device may additionally or alternatively include one or more of the following features: the electrically conductive vias may be configured to individually access each MTJ bit of the multiple MTJ stacks; the electrically conductive vias may be configured to access an MTJ bit of the multiple MTJ stacks in series with another MTJ bit of the multiple MTJ stacks; the electrically conductive vias may be configured to (a) access each MTJ bit of the multiple MTJ stacks individually, and (b) access an MTJ bit of the multiple MTJ stacks in series with another MTJ bit of the multiple MTJ stacks; each MTJ stack may include multiple MTJ bits electrically separated from each other by a dielectric material; each MTJ stack may include multiple MTJ bits in electrical contact with each other; the one more dielectric material layers that separate the multiple magnetic tunnel junction (MTJ) stacks may include a layer of a single dielectric material; the one more dielectric material layers that separate the multiple magnetic tunnel junction (MTJ) stacks may include an alternating stack of a first dielectric material and a second dielectric material, wherein the first and second dielectric materials have different etch rates; at least some of the electrically conductive vias that extend through the one more dielectric material layers may include a section that extends in a vertical direction and a section that extends in a horizontal direction; and each MTJ stack may include multiple pairs of MTJ bits arranged one on top of another, wherein each pair of MTJ bits may include two horizontally spaced apart MTJ bits in contact with a common electrically conductive via positioned in between the two MTJ bits.

In some aspects, a magnetoresistive device is disclosed. The device may include multiple magnetic tunnel junction (MTJ) stacks separated from each other by one or more dielectric material layers. Each MTJ stack may include multiple MTJ bits arranged one on top of another and electrically conductive vias extending through the one more dielectric material layers. The electrically conductive vias may be configured to (a) electrically access each MTJ bit of the multiple MTJ stacks individually, and (b) electrically access an MTJ bit of the multiple MTJ stacks in series with another MTJ bit of the multiple MTJ stacks.

Various embodiments of the disclosed device may additionally or alternatively include one or more of the following features: each MTJ stack may include multiple MTJ bits electrically separated from each other by a dielectric material; each MTJ stack may include multiple MTJ bits in electrical contact with each other; the one more dielectric material layers that separate the multiple magnetic tunnel junction (MTJ) stacks may include a layer of a single dielectric material; and the one more dielectric material layers that separate the multiple magnetic tunnel junction (MTJ) stacks may include an alternating stack of a first dielectric material and a second dielectric material, wherein the first and second dielectric materials have different etch rates; each MTJ stack may include multiple pairs of MTJ bits arranged one on top of another, wherein each pair of MTJ bits may include two horizontally spaced apart MTJ bits in contact with a common electrically conductive via positioned in between the two MTJ bits.

In some aspects, a method of forming a magnetoresistive device is disclosed. The method may include forming multiple magnetic tunnel junction (MTJ) stacks separated from each other by one or more dielectric material layers. Each MTJ stack may include multiple MTJ bits arranged one on top of another. The method may also include forming electrically conductive vias that extend through the one more dielectric material layers. The electrically conductive vias may be configured to (a) electrically access each MTJ bit of the multiple MTJ stacks individually, and (b) electrically access an MTJ bit of the multiple MTJ stacks in series with another MTJ bit of the multiple MTJ stacks.

Various embodiments of the disclosed method may additionally or alternatively include one or more of the following features: each MTJ stack may include multiple MTJ bits electrically separated from each other by a dielectric material; each MTJ stack may include multiple MTJ bits in electrical contact with each other; and the one more dielectric material layers that separate the multiple magnetic tunnel junction (MTJ) stacks may include an alternating stack of a first dielectric material and a second dielectric material, wherein the first and second dielectric materials have different etch rates.

Although various embodiments of the present disclosure have been illustrated and described in detail, it will be readily apparent to those skilled in the art that various modifications may be made without departing from the present disclosure.

What is claimed is:

1. A magnetoresistive device, comprising:
    multiple magnetic tunnel junction (MTJ) stacks separated from each other by one or more dielectric material layers, wherein each MTJ stack includes multiple MTJ bits arranged one on top of another;
    electrically conductive vias extending through the one more dielectric material layers, wherein the electrically conductive vias are configured to (a) access each MTJ bit of the multiple MTJ stacks individually, and (b) access an MTJ bit of the multiple MTJ stacks in series with another MTJ bit of the multiple MTJ stacks;
    a first electrically conductive via, of the electrically conductive vias, comprising a section in a horizontal direction that is connected to a first side of a first MTJ bit at a first depth;
    a second electrically conductive via, of the electrically conductive vias, comprising a section in a horizontal direction that is connected to a second side of the first MTJ bit at a second depth;
    a third electrically conductive via, of the electrically conductive vias, comprising a section in a horizontal direction that is connected to the first side of a second MTJ bit at a third depth; and
    a fourth electrically conductive via, of the electrically conductive vias, comprising a section in a horizontal direction that is connected to the second side of the second MTJ bit at a fourth depth,
    wherein the first side is opposite to the second side, and
    wherein the first depth is higher than the second depth, the second depth is higher than the third depth, and the third depth is higher than the fourth depth.

2. The magnetoresistive device of claim 1, wherein each MTJ stack includes multiple MTJ bits electrically separated from each other by a dielectric material.

3. The magnetoresistive device of claim 1, wherein each MTJ stack includes multiple MTJ bits in electrical contact with each other.

4. The magnetoresistive device of claim 1, wherein the one more dielectric material layers that separate the multiple magnetic tunnel junction (MTJ) stacks include a layer of a single dielectric material.

5. The magnetoresistive device of claim 1, wherein the one more dielectric material layers that separate the multiple magnetic tunnel junction (MTJ) stacks include an alternating stack of a first dielectric material and a second dielectric material, wherein the first and second dielectric materials have different etch rates.

6. The magnetoresistive device of claim 1, wherein at least some of the electrically conductive vias that extend through the one more dielectric material layers include a section that extends in a vertical direction and a section that extends in a horizontal direction.

7. The magnetoresistive device of claim 1, wherein each MTJ stack includes multiple pairs of MTJ bits arranged one on top of another, wherein each pair of MTJ bits includes two horizontally spaced apart MTJ bits in contact with a common electrically conductive via positioned in between the two MTJ bits.

8. A magnetoresistive device, comprising:
    multiple magnetic tunnel junction (MTJ) stacks separated from each other by one or more dielectric material layers, wherein each MTJ stack includes multiple MTJ bits arranged one on top of another;
    electrically conductive vias extending through the one more dielectric material layers, wherein the electrically conductive vias are configured to (a) electrically access each MTJ bit of the multiple MTJ stacks individually, and (b) electrically access an MTJ bit of the multiple MTJ stacks in series with another MTJ bit of the multiple MTJ stacks;
    a first electrically conductive via, of the electrically conductive vias, comprising a section in a horizontal direction that is connected to a first side of a first MTJ bit at a first depth;
    a second electrically conductive via, of the electrically conductive vias, comprising a section in a horizontal direction that is connected to a second side of the first MTJ bit at a second depth;
    a third electrically conductive via, of the electrically conductive vias, comprising a section in a horizontal direction that is connected to the first side of a second MTJ bit at a third depth; and
    a fourth electrically conductive via, of the electrically conductive vias, comprising a section in a horizontal direction that is connected to the second side of the second MTJ bit at a fourth depth,
    wherein the first side is opposite to the second side, and
    wherein the first depth is higher than the second depth, the second depth is higher than the third depth, and the third depth is higher than the fourth depth.

9. The magnetoresistive device of claim 8, wherein each MTJ stack includes multiple MTJ bits electrically separated from each other by a dielectric material.

10. The magnetoresistive device of claim 8, wherein each MTJ stack includes multiple MTJ bits in electrical contact with each other.

11. The magnetoresistive device of claim 8, wherein the one more dielectric material layers that separate the multiple magnetic tunnel junction (MTJ) stacks include a layer of a single dielectric material.

12. The magnetoresistive device of claim 8, wherein the one more dielectric material layers that separate the multiple magnetic tunnel junction (MTJ) stacks include an alternating stack of a first dielectric material and a second dielectric material, wherein the first and second dielectric materials have different etch rates.

13. The magnetoresistive device of claim 8, wherein each MTJ stack includes multiple pairs of MTJ bits arranged one on top of another, wherein each pair of MTJ bits includes two horizontally spaced apart MTJ bits in contact with a common electrically conductive via positioned in between the two MTJ bits.

14. A method of forming a magnetoresistive device, comprising:
    forming multiple magnetic tunnel junction (MTJ) stacks separated from each other by one or more dielectric material layers, wherein each MTJ stack includes multiple MTJ bits arranged one on top of another;
    forming electrically conductive vias that extend through the one more dielectric material layers, wherein the electrically conductive vias are configured to (a) electrically access each MTJ bit of the multiple MTJ stacks individually, and (b) electrically access an MTJ bit of the multiple MTJ stacks in series with another MTJ bit of the multiple MTJ stacks;
    forming a first electrically conductive via, of the electrically conductive vias, to include a section in a horizontal direction that is connected to a first side of a first MTJ bit at a first depth;
    forming a second electrically conductive via, of the electrically conductive vias, to include a section in a horizontal direction that is connected to a second side of the first MTJ bit at a second depth;

forming a third electrically conductive via, of the electrically conductive vias, to include a section in a horizontal direction that is connected to the first side of a second MTJ bit at a third depth; and forming a fourth electrically conductive via, of the electrically conductive vias, to include a section in a horizontal direction that is connected to the second side of the second MTJ bit at a fourth depth, wherein the first side is opposite to the second side, and wherein the first depth is higher than the second depth, the second depth is higher than the third depth, and the third depth is higher than the fourth depth.

15. The method of claim 14, wherein each MTJ stack includes multiple MTJ bits electrically separated from each other by a dielectric material.

16. The method of claim 14, wherein each MTJ stack includes multiple MTJ bits in electrical contact with each other.

17. The method of claim 14, wherein the one more dielectric material layers that separate the multiple magnetic tunnel junction (MTJ) stacks include an alternating stack of a first dielectric material and a second dielectric material, wherein the first and second dielectric materials have different etch rates.

18. The method of claim 14, wherein the one more dielectric material layers that separate the multiple magnetic tunnel junction (MTJ) stacks include a layer of a single dielectric material.

19. The method of claim 14, wherein at least some of the electrically conductive vias that extend through the one more dielectric material layers include a section that extends in a vertical direction and a section that extends in a horizontal direction.

20. The method of claim 14, wherein each MTJ stack includes multiple pairs of MTJ bits arranged one on top of another, wherein each pair of MTJ bits includes two horizontally spaced apart MTJ bits in contact with a common electrically conductive via positioned in between the two MTJ bits.

* * * * *